(12) United States Patent
Yoshimizu et al.

(10) Patent No.: US 10,854,534 B2
(45) Date of Patent: Dec. 1, 2020

(54) SEMICONDUCTOR DEVICE AND METHOD FOR MANUFACTURING SAME

(71) Applicant: Toshiba Memory Corporation, Minato-ku (JP)

(72) Inventors: Yasuhito Yoshimizu, Yokkaichi (JP); Yoshiro Shimojo, Yokkaichi (JP); Shinya Arai, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/678,007

(22) Filed: Nov. 8, 2019

(65) Prior Publication Data
US 2020/0075461 A1 Mar. 5, 2020

Related U.S. Application Data

(63) Continuation of application No. 15/698,328, filed on Sep. 7, 2017, now Pat. No. 10,515,873.

(30) Foreign Application Priority Data

Mar. 10, 2017 (JP) ................................. 2017-046172

(51) Int. Cl.
*H01L 23/48* (2006.01)
*H01L 21/768* (2006.01)
(Continued)

(52) U.S. Cl.
CPC ...... *H01L 23/481* (2013.01); *H01L 21/76805* (2013.01); *H01L 21/76831* (2013.01);
(Continued)

(58) Field of Classification Search
CPC ............ H01L 23/481; H01L 21/76834; H01L 21/76805; H01L 21/11582; H01L 21/11556; H01L 27/222
See application file for complete search history.

(56) References Cited

U.S. PATENT DOCUMENTS 8,476,708 B2 7/2013 Fukuzumi et al.
8,779,499 B2 * 7/2014 Kiyotoshi ......... H01L 27/11524
257/319
(Continued)

FOREIGN PATENT DOCUMENTS

JP 2011-35343 2/2011
JP 2012-146861 8/2012
(Continued)

*Primary Examiner* — Hoa B Trinh
(74) *Attorney, Agent, or Firm* — Oblon, McClelland, Maier & Neustadt, L.L.P.

(57) ABSTRACT

According to one embodiment, a stacked body includes a plurality of electrode layers stacked with an insulator interposed. A conductive via pierces the stacked body, and connects an upper layer interconnect and a lower layer interconnect. A insulating film is provided between the via and the stacked body. A distance along a diametral direction of the via between a side surface of the via and an end surface of one of the electrode layers opposing the side surface of the via is greater than a distance along the diametral direction between the side surface of the via and an end surface of the insulator opposing the side surface of the via.

15 Claims, 43 Drawing Sheets

(51) Int. Cl.
*H01L 27/11556* (2017.01)
*H01L 27/11582* (2017.01)
*H01L 27/11565* (2017.01)
*H01L 23/522* (2006.01)

(52) U.S. Cl.
CPC .... *H01L 21/76834* (2013.01); *H01L 23/5226* (2013.01); *H01L 27/11556* (2013.01); *H01L 27/11565* (2013.01); *H01L 27/11582* (2013.01)

(56) References Cited

U.S. PATENT DOCUMENTS

| | | |
|---|---|---|
| 8,946,809 B2 | 2/2015 | Takamura et al. |
| 2011/0031546 A1 | 2/2011 | Uenaka et al. |
| 2013/0126959 A1 | 5/2013 | Aburada et al. |
| 2014/0284685 A1 | 9/2014 | Shimojo |
| 2014/0286095 A1* | 9/2014 | Hishida .............. G11C 16/0483 365/185.05 |
| 2016/0071741 A1 | 3/2016 | Imamura et al. |
| 2016/0126248 A1* | 5/2016 | Rabkin ................ H01L 29/408 257/321 |
| 2016/0351417 A1 | 12/2016 | Akeboshi et al. |
| 2017/0047334 A1* | 2/2017 | Lu ..................... H01L 27/11519 |

FOREIGN PATENT DOCUMENTS

| | | |
|---|---|---|
| JP | 2012-227326 | 11/2012 |
| JP | 2013-110295 | 6/2013 |
| JP | 2016-225502 | 12/2016 |

\* cited by examiner

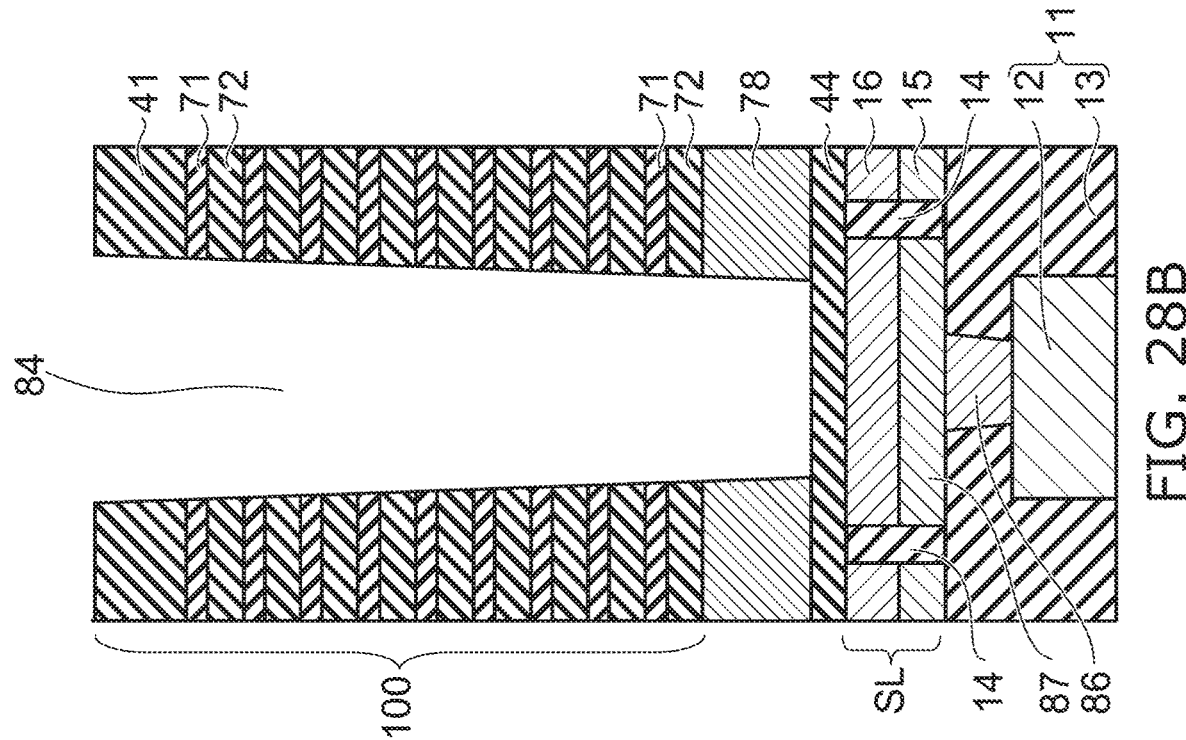
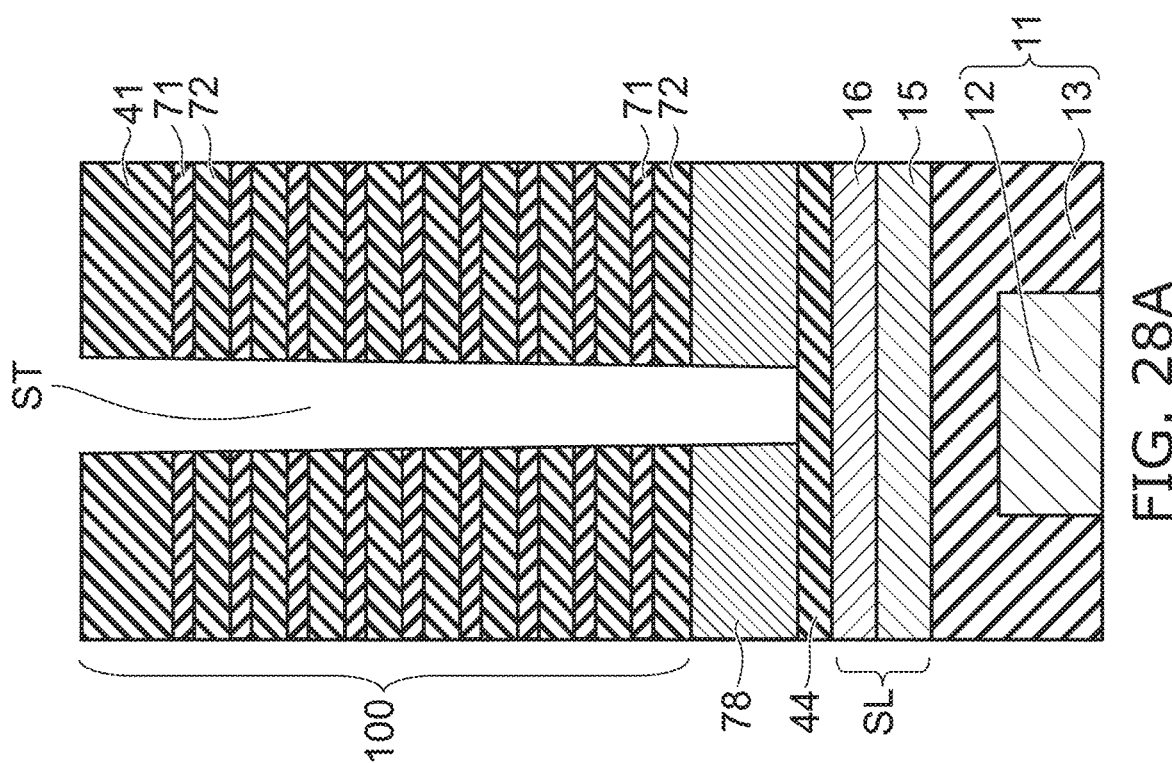

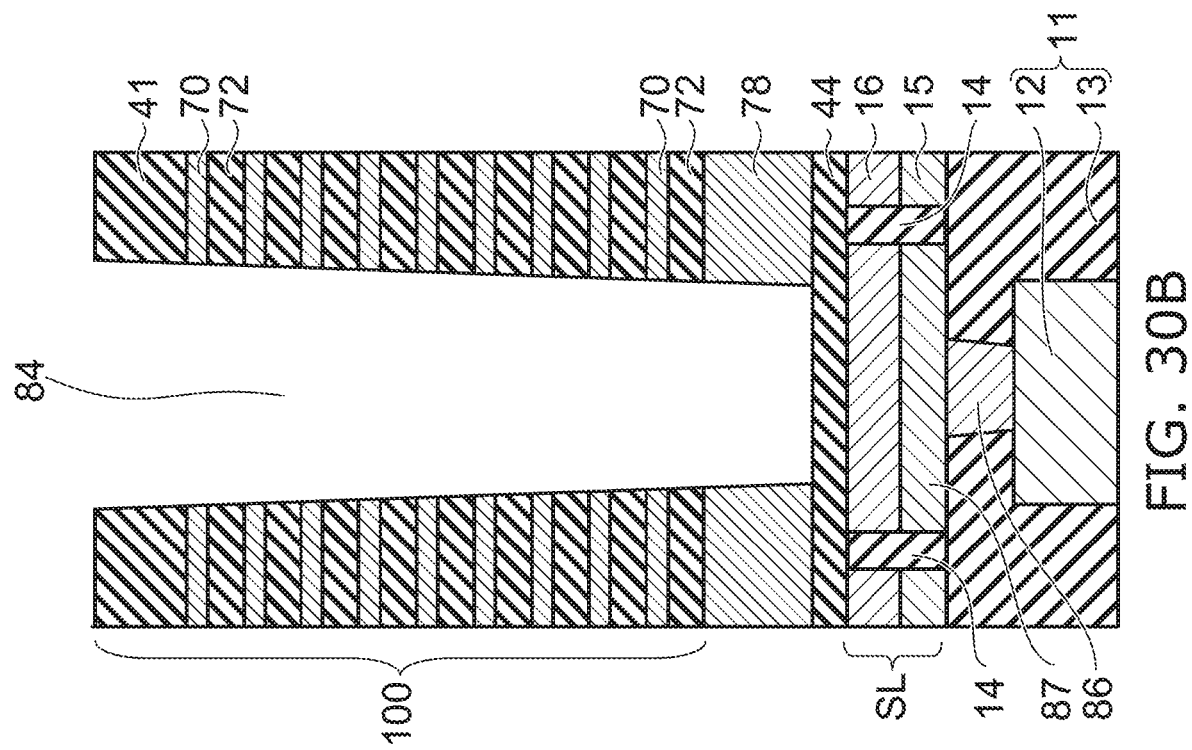
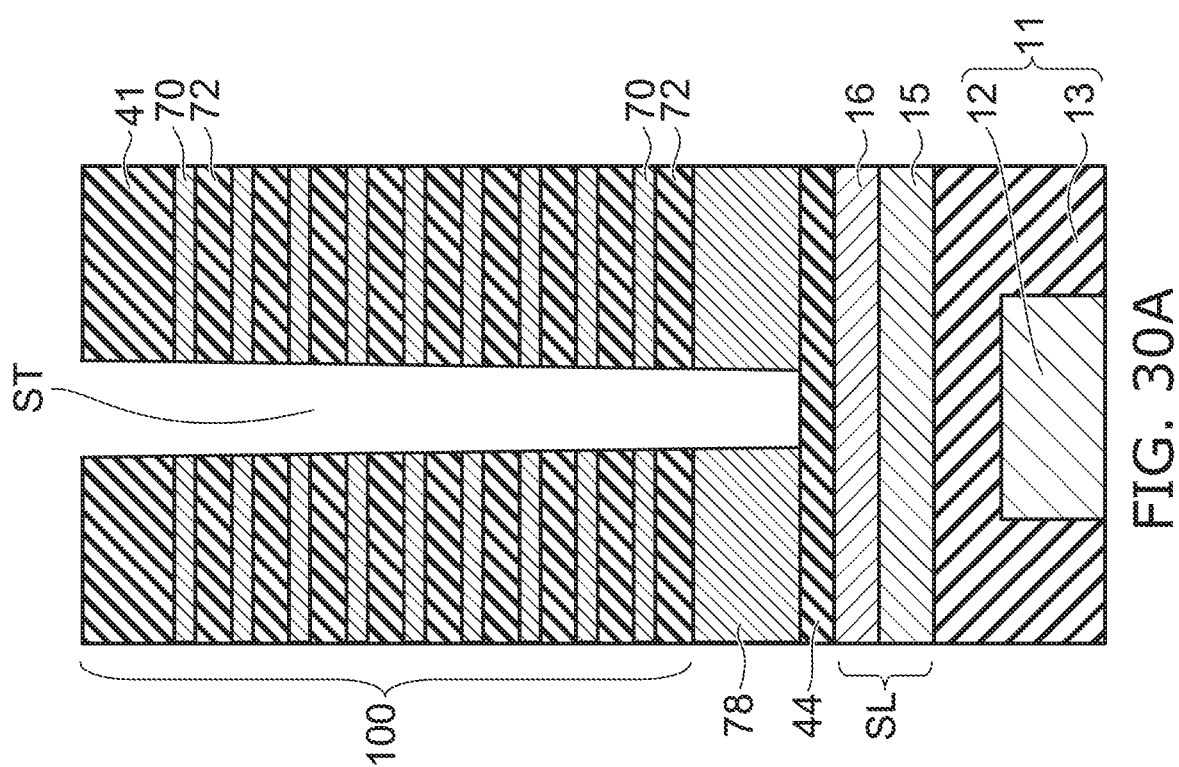
FIG. 30A
FIG. 30B

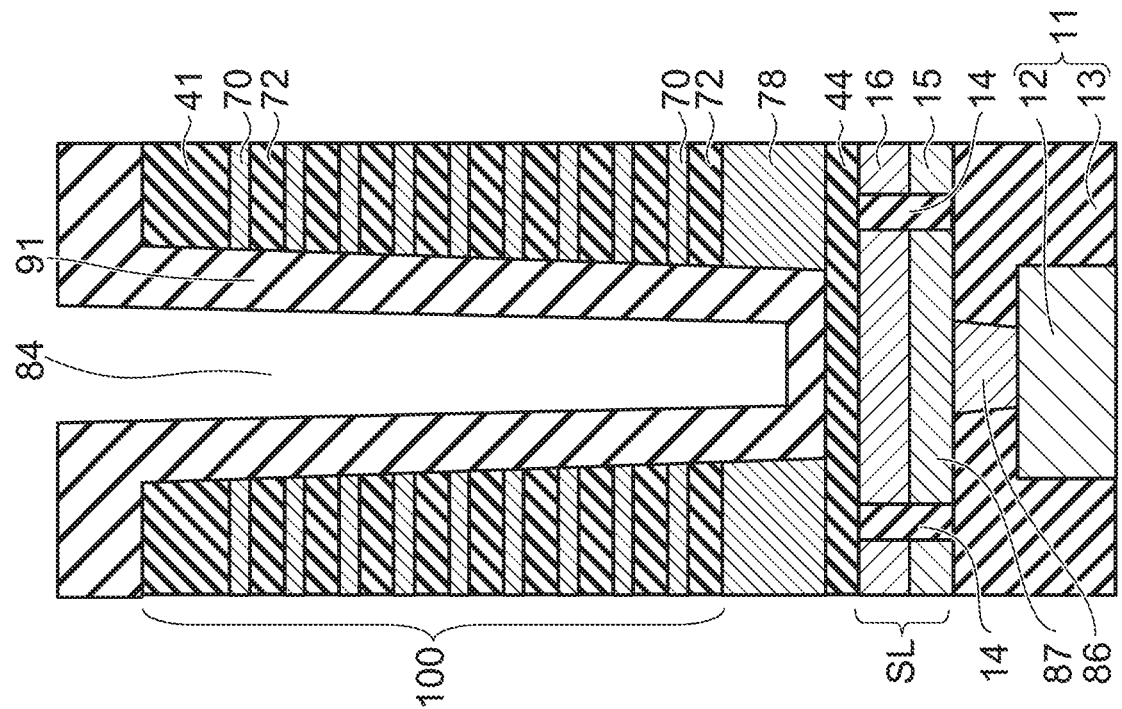
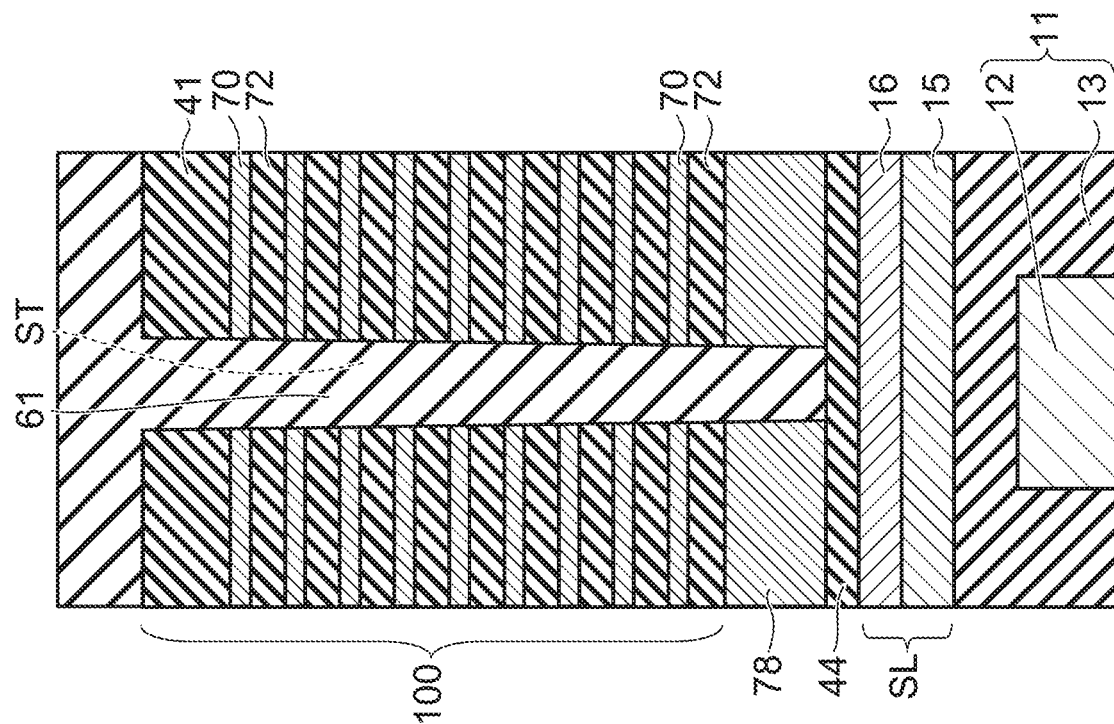

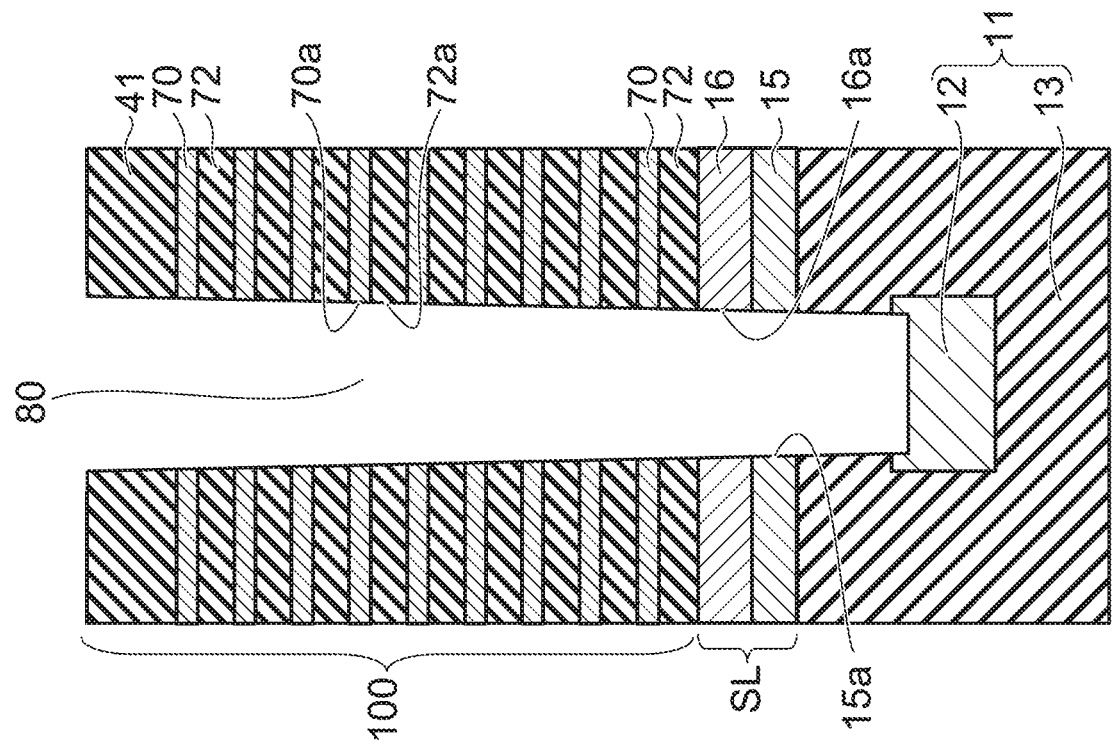
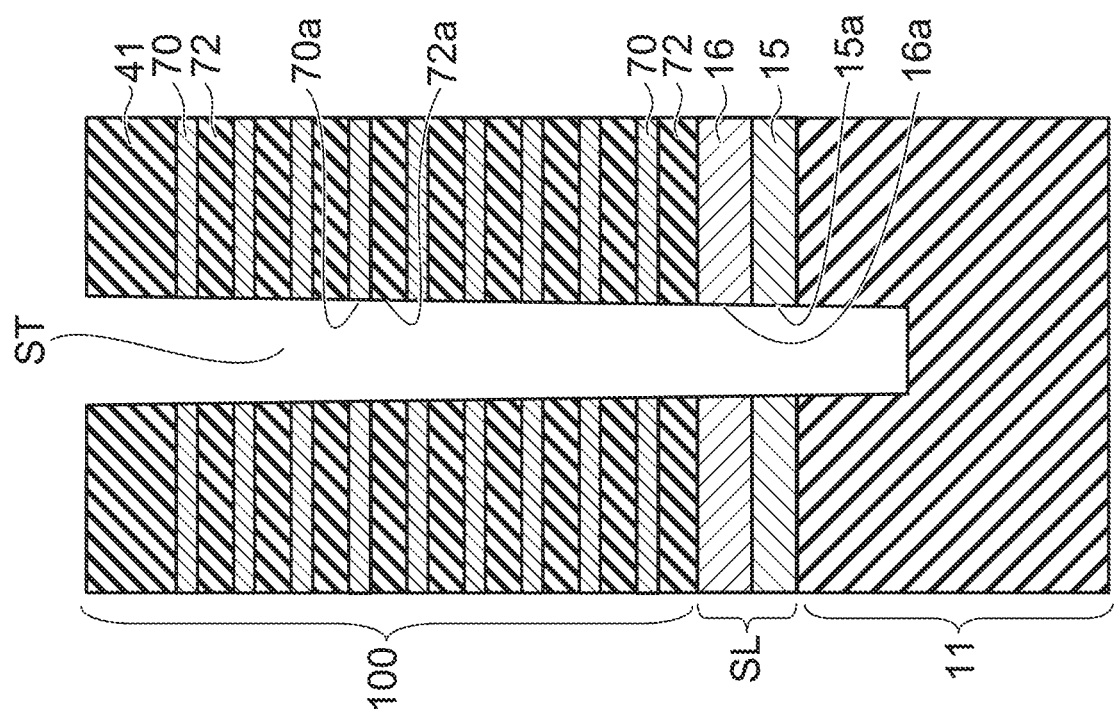

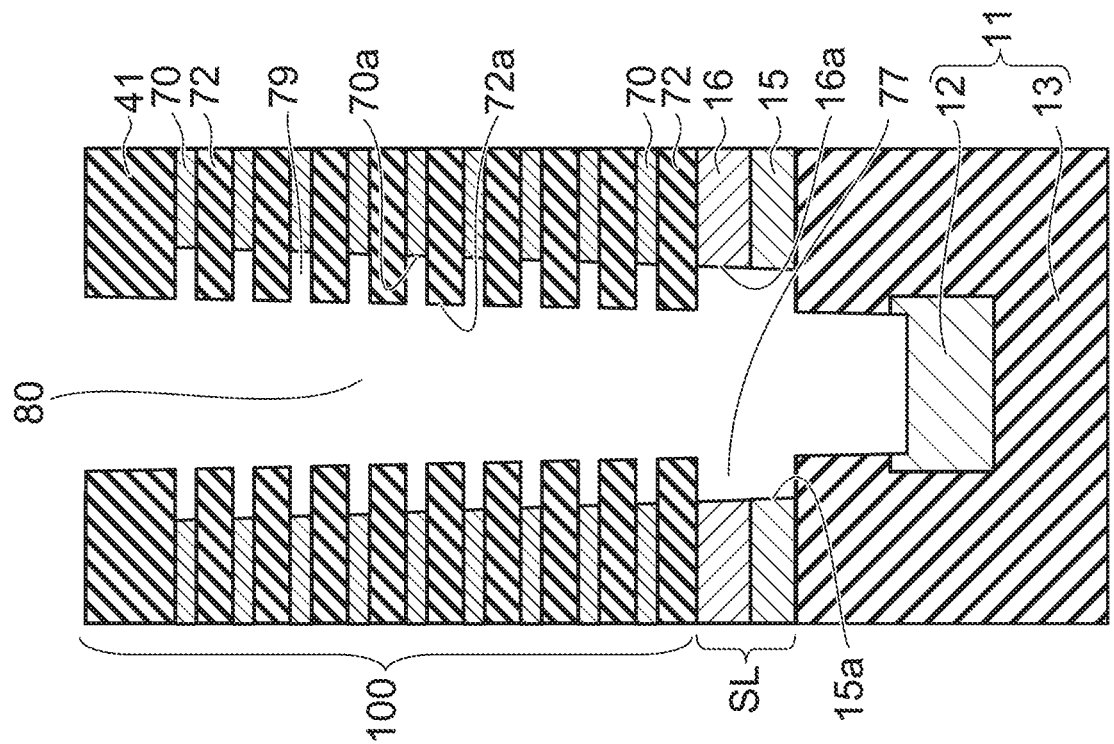
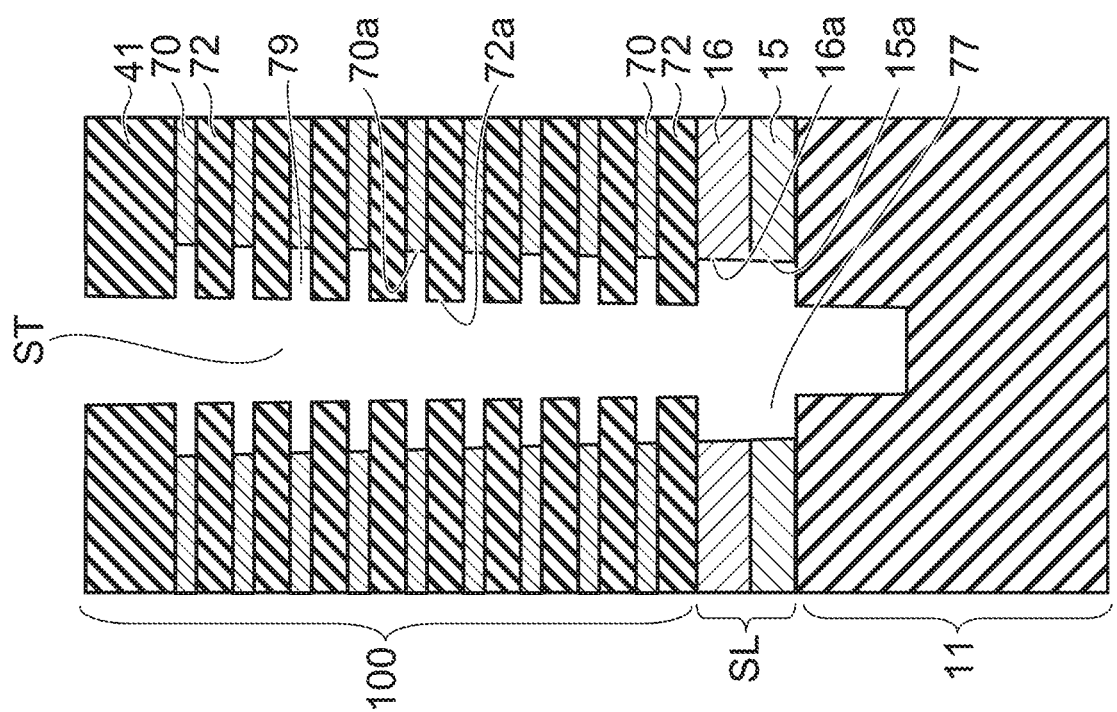

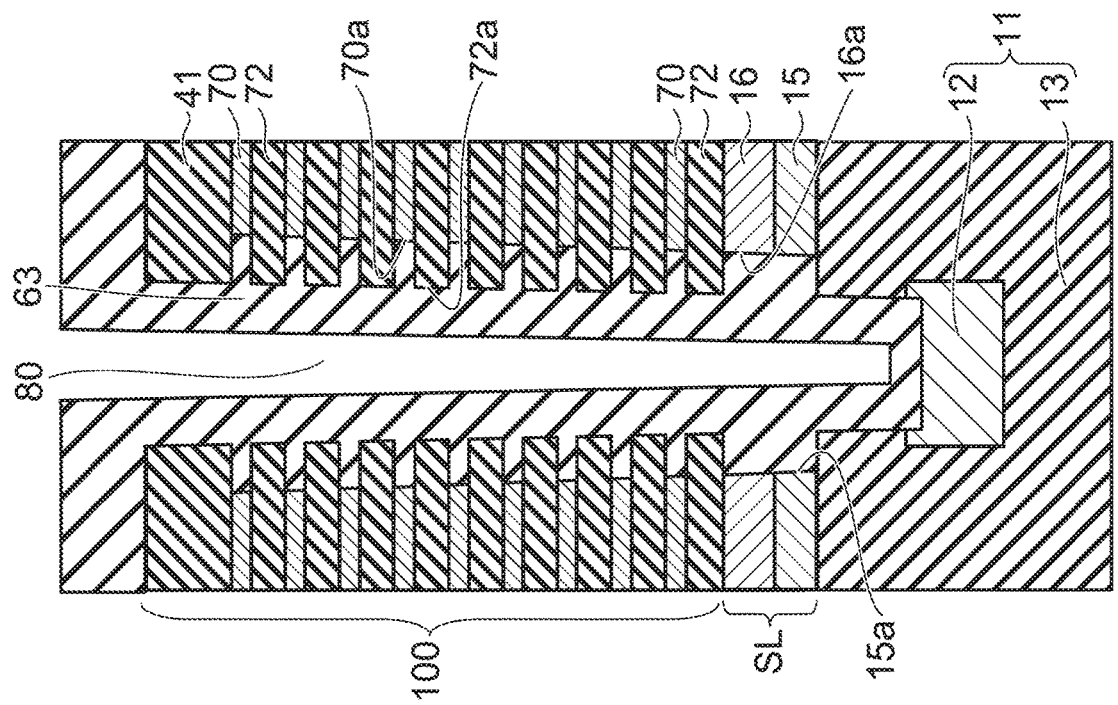
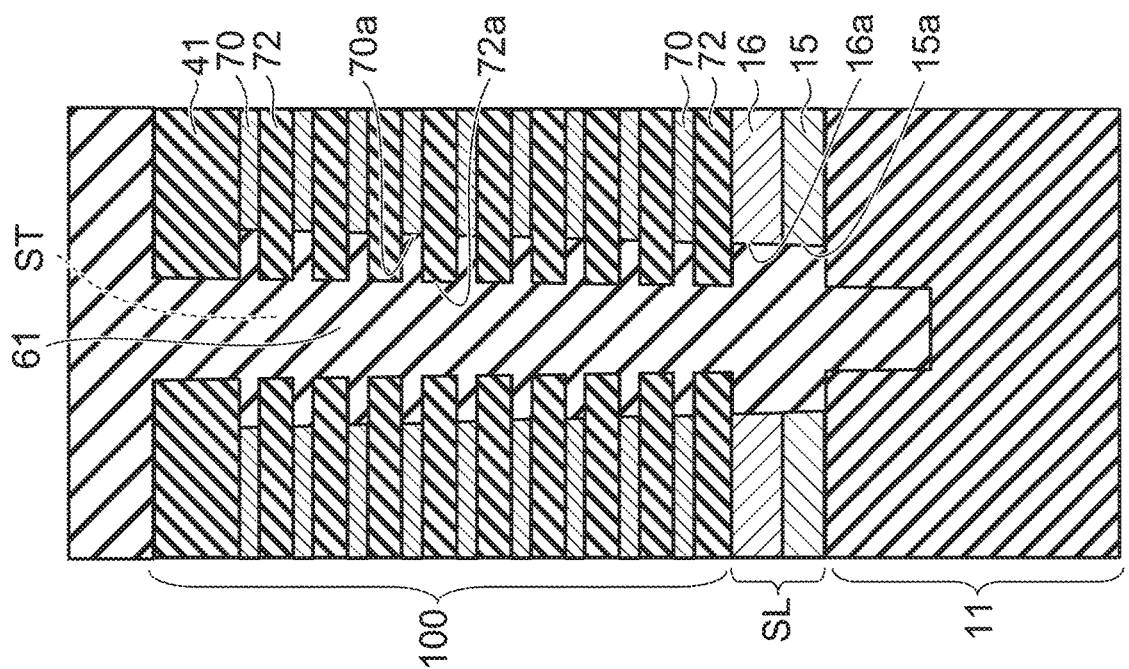

SEMICONDUCTOR DEVICE AND METHOD FOR MANUFACTURING SAME

CROSS-REFERENCE TO RELATED APPLICATION

This application is a continuation of and claims the benefit of priority under 35 U.S.C. § 120 from U.S. application Ser. No. 15/698,328 filed Sep. 7, 2017, and claims the benefit of priority under 35 U.S.C. § 119 from Japanese Patent Application No. 2017-046172 filed Mar. 10, 2017; the entire contents of each of which are incorporated herein by reference.

FIELD

Embodiments described herein relate generally to a semiconductor device and a method for manufacturing a semiconductor device.

BACKGROUND

It is desirable to form a via to connect between interconnects disposed on and under a stacked body including multiple electrode layers, so that the via pierces the stacked body and reaches the lower layer interconnect.

BRIEF DESCRIPTION OF THE DRAWINGS

FIG. 26A to FIG. 38 are schematic cross-sectional views showing a method for manufacturing the semiconductor device of the embodiment;

FIG. 40A to FIG. 42B are schematic cross-sectional views showing a method for manufacturing the semiconductor device of the embodiment.

DETAILED DESCRIPTION

Figure 1:
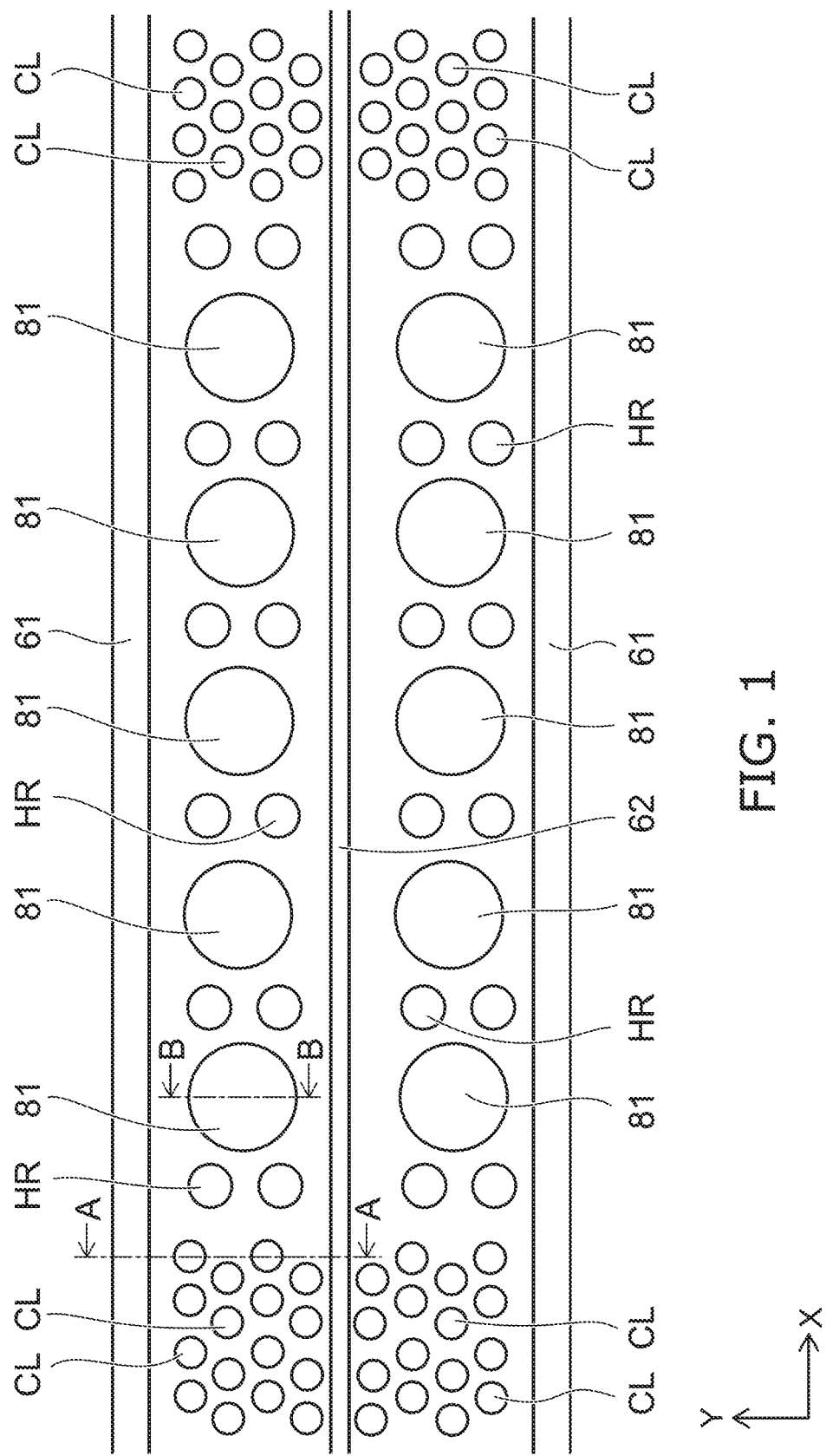
FIG. 1 is a schematic plan view of a semiconductor device of an embodiment.

According to one embodiment, a semiconductor device includes a lower layer interconnect, an upper layer interconnect, a stacked body, a conductive via, and an insulating film. The stacked body is provided between the lower layer interconnect and the upper layer interconnect. The stacked body includes a plurality of electrode layers stacked with an insulator interposed. The via pierces the stacked body, and connects the upper layer interconnect and the lower layer interconnect. The insulating film is provided between the via and the stacked body. A distance along a diametral direction of the via between a side surface of the via and an end surface of one of the electrode layers opposing the side surface of the via is greater than a distance along the diametral direction between the side surface of the via and an end surface of the insulator opposing the side surface of the via.

Embodiment will now be described with reference to the drawings. In the respective drawings, like members are labeled with like reference numerals.

In an embodiment, for example, a semiconductor memory device that includes a memory cell array having a three-dimensional structure is described as a semiconductor device.

FIG. 1 is a schematic plan view of a cell array region of the semiconductor device of the embodiment.

Figure 2:
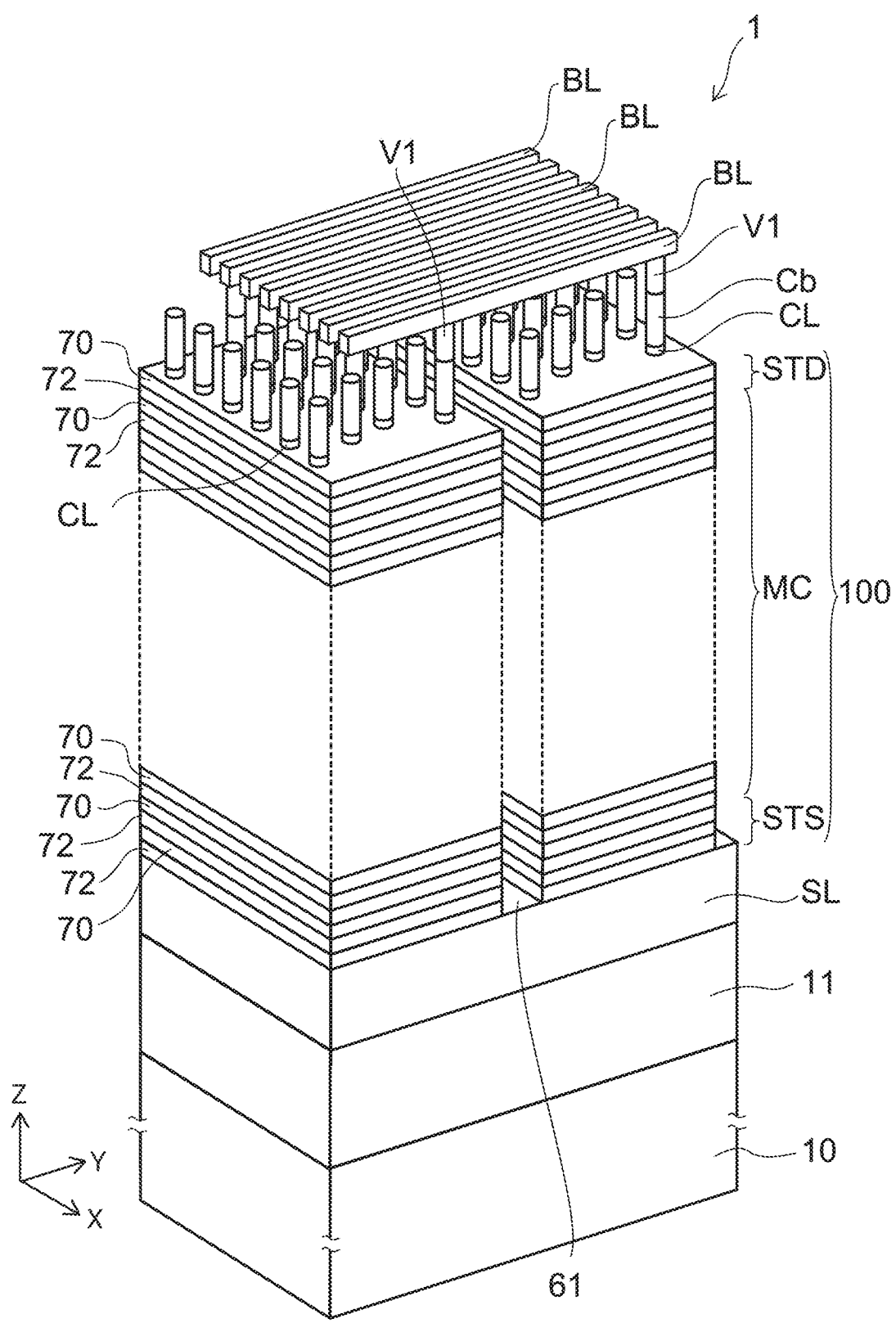
FIG. 2 is a schematic perspective view of the semiconductor device of the embodiment.

FIG. 2 is a schematic perspective view of the memory cell array 1 of the semiconductor device of the embodiment.

Figure 3:
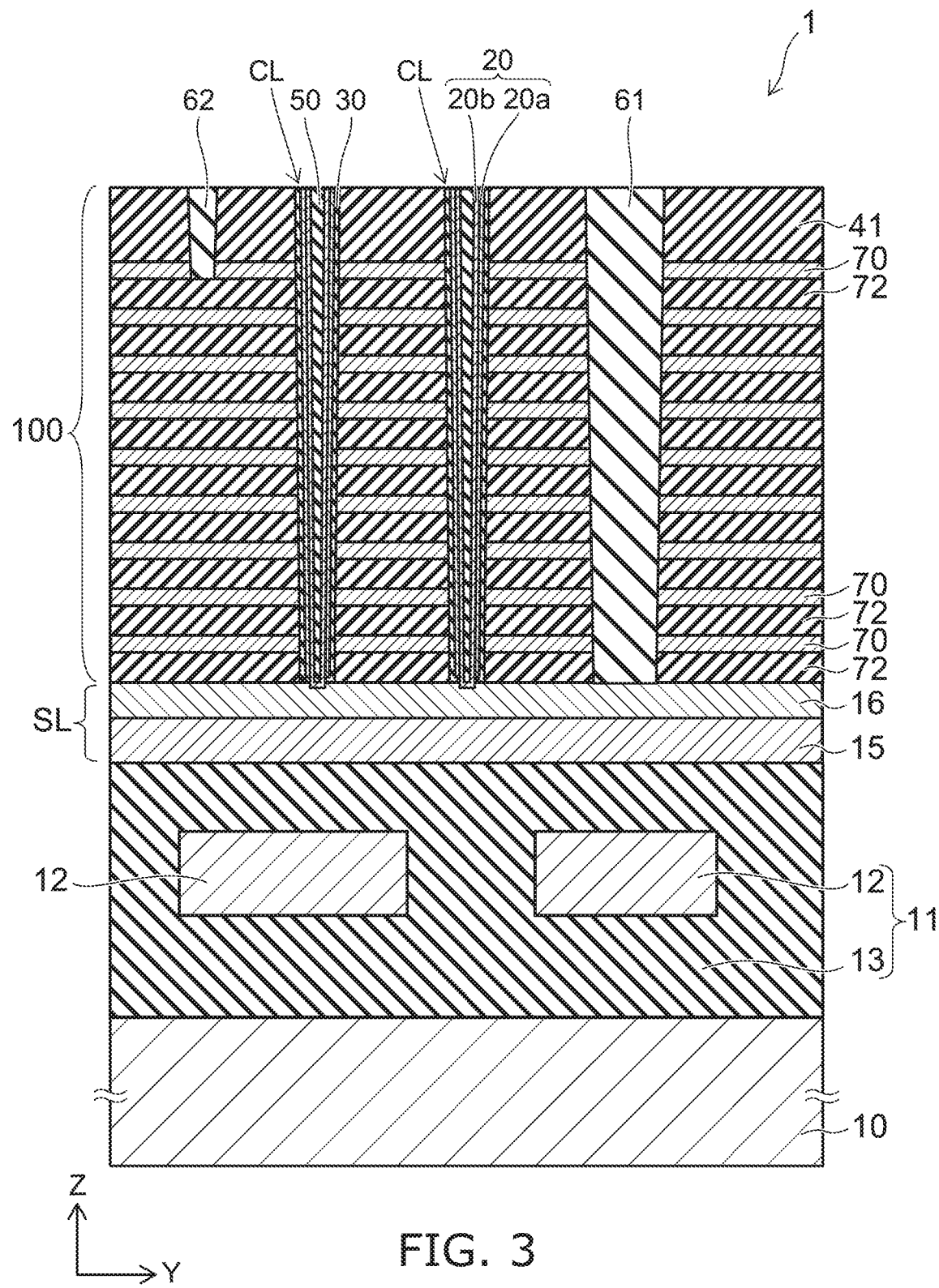
FIG. 3 is an A-A cross-sectional view of FIG. 1.

FIG. 3 is an A-A cross-sectional view of FIG. 1.

As shown in FIG. 1, multiple columnar portions CL and multiple vias 81 are disposed inside the cell array region. The multiple columnar portions CL pierce a stacked body 100 shown in FIG. 2 and FIG. 3. As described below, the multiple vias 81 also pierce the stacked body 100.

In FIG. 2, two mutually-orthogonal directions parallel to a major surface of a substrate 10 are taken as an X-direction and a Y-direction; and a direction orthogonal to both the X-direction and the Y-direction is taken as a Z-direction (a stacking direction). The X-direction, the Y-direction, and the Z-direction of the other drawings correspond respectively to the X-direction, the Y-direction, and the Z-direction of FIG. 2.

The memory cell array 1 includes a source layer SL, the stacked body 100 provided on the source layer SL, the multiple columnar portions CL, multiple separation portions 61, and multiple bit lines BL provided above the stacked body 100.

As shown in FIG. 3, a circuit layer 11 is provided between the substrate 10 and the source layer SL. The circuit layer 11 includes, for example, a lower layer interconnect 12 which is a metal interconnect. An insulating layer 13 is provided between the lower layer interconnect 12 and the substrate 10, between the lower layer interconnect 12 and the source layer SL, and between the lower layer interconnects 12. The source layer SL is connected to the lower layer interconnect 12 by a not-illustrated via.

The substrate 10 is, for example, a silicon substrate. For example, a transistor having a MOSFET (metal-oxide-semiconductor field effect transistor) structure is formed in the surface of the substrate 10. The circuit layer 11 and the transistor formed in the surface of the substrate 10 are included in a control circuit of the memory cell array 1 such as a sense amplifier circuit, a word line driver circuit, etc.

The columnar portions CL are formed in substantially circular columnar configurations extending through the stacked body 100 in the stacking direction of the stacked body 100 (the Z-direction). For example, the multiple columnar portions CL have a staggered arrangement. Or, the multiple columnar portions CL may have a square lattice arrangement along the X-direction and the Y-direction.

The separation portions 61 extend in the X-direction and divide the stacked body 100 into multiple blocks (or finger portions) in the Y-direction. The separation portions 61 are insulating films filled into slits as shown in FIG. 3.

The multiple bit lines BL shown in FIG. 2 extend in the Y-direction and are, for example, metal films. The multiple bit lines BL are separated from each other in the X-direction.

Upper end portions of semiconductor bodies 20 of the columnar portions CL described below are connected to the bit lines BL via contacts Cb and contacts V1 shown in FIG. 2.

As shown in FIG. 3, the source layer SL is a stacked film of a layer 15 including a metal, and a semiconductor layer 16. The layer 15 including the metal is provided between the insulating layer 13 and the semiconductor layer 16. The layer 15 including the metal is, for example, a tungsten layer or a tungsten silicide layer. The semiconductor layer 16 includes an impurity (e.g., phosphorus) and is a conductive polycrystalline silicon layer.

A metal nitride film (a titanium nitride film) may be formed between the semiconductor layer (the polycrystalline silicon layer) 16 and the layer (the tungsten layer) 15 including the metal.

The stacked body 100 is provided on the source layer SL. The stacked body 100 includes multiple electrode layers 70 stacked in a direction (the Z-direction) perpendicular to the major surface of the substrate 10. An insulating layer (an insulator) 72 is provided between the electrode layers 70 adjacent to each other above and below. The insulator may be an air gap between the electrode layers 70. The insulating layer 72 is provided between the source layer SL and the lowermost electrode layer 70. An insulating layer 41 is provided on the uppermost electrode layer 70. The source layer SL is thicker than the thickness of one layer of the electrode layers 70.

The electrode layer 70 is a metal layer. The electrode layer 70 is, for example, a tungsten layer including tungsten as a major component, or a molybdenum layer including molybdenum as a major component. The insulating layer 72 is, for example, a silicon oxide layer including silicon oxide as a major component.

The columnar portions CL extend through the stacked body 100 in the stacking direction of the stacked body 100; and the lower end portions of the semiconductor bodies 20 of the columnar portion CL contact the semiconductor layer 16 of the source layer SL.

Figure 4:
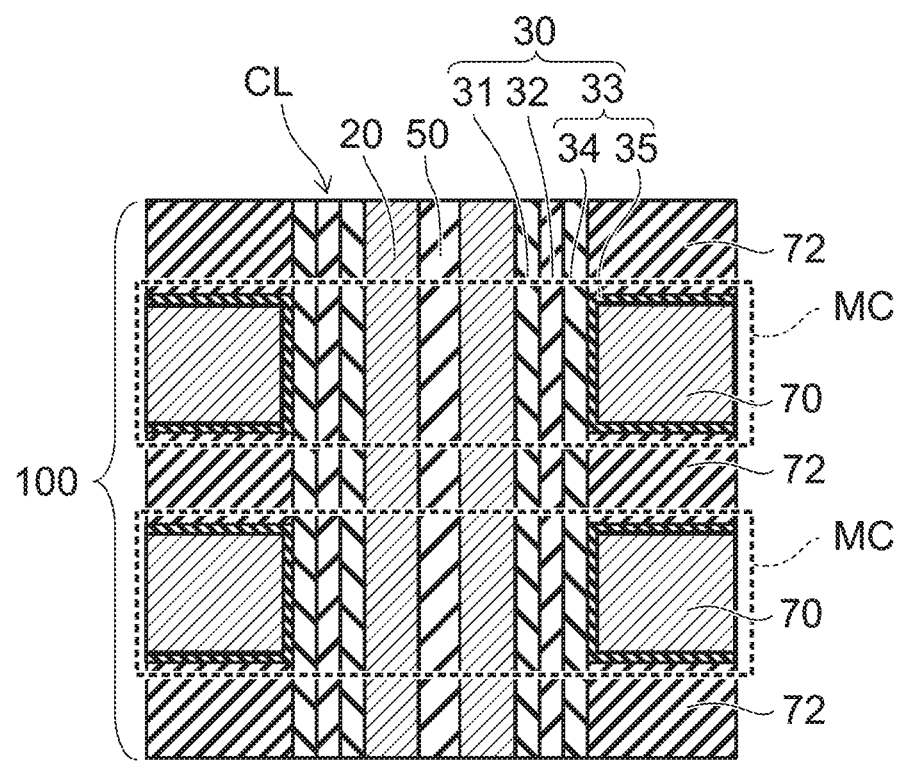
FIG. 4 is an enlarged cross-sectional view of one portion of FIG. 3.

FIG. 4 is an enlarged cross-sectional view of one portion of FIG. 3.

The columnar portion CL includes a memory film 30, the semiconductor body 20, and an insulative core film 50. The memory film 30 is a stacked film of insulating films including a tunneling insulating film 31, a charge storage film (a charge storage portion) 32, and a blocking insulating film 33.

As shown in FIG. 3, the semiconductor body 20 is formed in a pipe-like configuration extending to be continuous through the stacked body 100 in the stacking direction and reaching the source layer SL. The core film 50 is provided on the inner side of the semiconductor body 20 having the pipe-like configuration. The memory film 30 is provided between the stacked body 100 and the semiconductor body 20, and surrounds the semiconductor body 20 from the outer perimeter side.

As shown in FIG. 4, the tunneling insulating film 31 is provided between the semiconductor body 20 and the charge storage film 32 and contacts the semiconductor body 20. The charge storage film 32 is provided between the tunneling insulating film 31 and the blocking insulating film 33. The blocking insulating film 33 is provided between the charge storage film 32 and the electrode layer 70.

The semiconductor body 20, the memory film 30, and the electrode layer 70 are included in a memory cell MC. The memory cell MC has a vertical transistor structure in which the electrode layer 70 surrounds the periphery of the semiconductor body 20 with the memory film 30 interposed.

In the memory cell MC having the vertical transistor structure, the semiconductor body 20 is, for example, a channel body of silicon; and the electrode layer 70 functions as a control gate. The charge storage film 32 functions as a data storage layer that stores charge injected from the semiconductor body 20.

The semiconductor memory device of the embodiment is a nonvolatile semiconductor memory device that can freely and electrically erase/program data and can retain the memory content even when the power supply is OFF.

The memory cell MC is, for example, a charge trap memory cell. The charge storage film 32 has many trap sites that trap charge inside an insulative film and includes, for example, a silicon nitride film. Or, the charge storage film 32 may be a conductive floating gate surrounded with an insulating body.

The tunneling insulating film 31 is used as a potential barrier when the charge is injected from the semiconductor body 20 into the charge storage film 32 or when the charge stored in the charge storage film 32 is discharged into the semiconductor body 20. The tunneling insulating film 31 includes, for example, a silicon oxide film.

The blocking insulating film 33 prevents the charge stored in the charge storage film 32 from being discharged into the electrode layer 70. Also, the blocking insulating film 33 prevents back-tunneling of the charge from the electrode layer 70 into the columnar portion CL.

The blocking insulating film 33 includes a first blocking film 34 and a second blocking film 35. The first blocking film 34 is, for example, a silicon oxide film. The second blocking film 35 is a metal oxide film having a dielectric constant higher than that of a silicon oxide film. For example, an aluminum oxide film, a zirconium oxide film, and a hafnium oxide film are examples of the metal oxide film.

The first blocking film 34 is provided between the charge storage film 32 and the second blocking film 35. The second blocking film 35 is provided between the first blocking film 34 and the electrode layer 70.

The tunneling insulating film 31, the charge storage film 32, and the first blocking film 34 extend to be continuous in the stacking direction of the stacked body 100. The second blocking film 35 is provided also between the electrode layer 70 and the insulating layer 72. In the stacking direction of the stacked body 100, the second blocking film 35 is discontinuous and is divided.

Or, the second blocking film 35 may be formed to be continuous along the stacking direction without forming the second blocking film 35 between the electrode layer 70 and the insulating layer 72. Or, the blocking insulating film 33 may be a single-layer film that is continuous along the stacking direction.

As shown in FIG. 2, a drain-side selection transistor STD is provided in the upper layer portion of the stacked body 100. A source-side selection transistor STS is provided in the lower layer portion of the stacked body 100.

The drain-side selection transistor STD is a vertical transistor having at least one layer of electrode layers 70 on the upper layer side as a drain-side selection gate; and the source-side selection transistor STS is a vertical transistor having at least one layer of the electrode layers 70 on the lower layer side as a source-side selection gate.

The portion of the semiconductor body 20 opposing the drain-side selection gate functions as a channel; and the memory film 30 between the channel and the drain-side selection gate functions as a gate insulating film of the drain-side selection transistor STD.

The portion of the semiconductor body 20 opposing the source-side selection gate functions as a channel; and the memory film 30 between the channel and the source-side selection gate functions as a gate insulating film of the source-side selection transistor STS.

As shown in FIG. 3, the electrode layer 70 that functions as the drain-side selection gate is divided in the Y-direction by a separation portion 62 in addition to the separation portion 61. As shown in FIG. 1, the separation portion 62 extends in the X-direction parallel to the separation portion 61.

Multiple drain-side selection transistors STD connected in series via the semiconductor body 20 may be provided; and multiple source-side selection transistors STS connected in series via the semiconductor body 20 may be provided. The same gate potential is applied to the multiple drain-side selection gates of the multiple drain-side selection transistors STD; and the same gate potential is applied to the multiple source-side selection gates of the multiple source-side selection transistors STS.

The multiple memory cells MC are provided between the drain-side selection transistor STD and the source-side selection transistor STS. The multiple memory cells MC, the drain-side selection transistor STD, and the source-side selection transistor STS are included in one memory string connected in series via the semiconductor body 20 of the columnar portion CL. For example, the memory strings have a staggered arrangement in a planar direction parallel to the XY plane; and the multiple memory cells MC are provided three-dimensionally in the X-direction, the Y-direction, and the Z-direction.

The via 81 will now be described.

Figure 5:
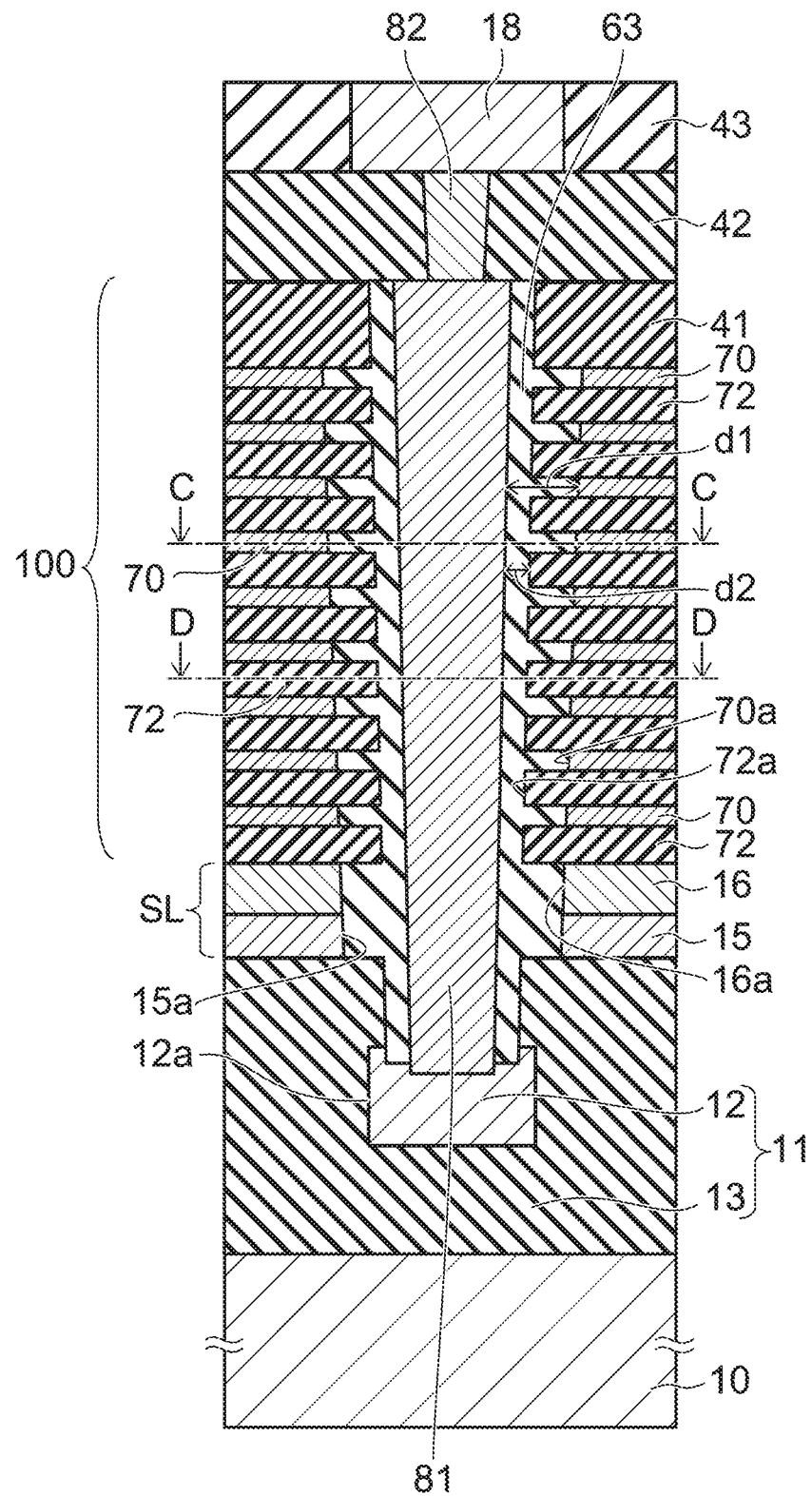
FIG. 5 is a B-B cross-sectional view of FIG. 1.

FIG. 5 is a B-B cross-sectional view of FIG. 1.

Figure 6A:
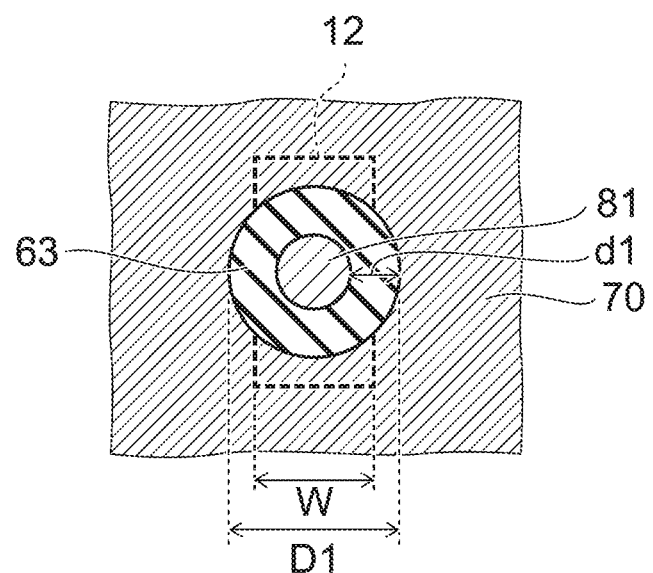
FIG. 6A is a C-C cross-sectional view of FIG. 5.

FIG. 6A is a C-C cross-sectional view of FIG. 5.

Figure 6B:
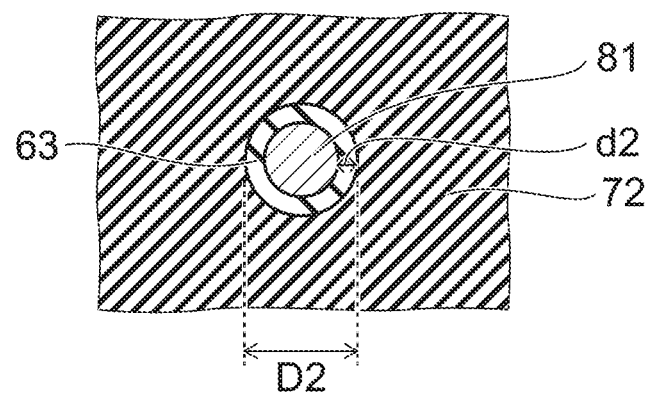
FIG. 6B is a D-D cross-sectional view of FIG. 5.

FIG. 6B is a D-D cross-sectional view of FIG. 5.

In a partial region of the cell array region shown in FIG. 1, the multiple vias 81 are disposed; but the multiple columnar portions CL are not disposed. Multiple columnar portions HR are further disposed around the multiple vias 81. Although the columnar portions HR pierce the stacked body 100 and have structures similar to those of the columnar portions CL, the columnar portions HR are not connected to the bit lines BL. Or, the columnar portions HR are pillars of insulating films.

As shown in FIG. 5 and FIGS. 6A and 6B, the via 81 is formed in a substantially circular columnar configuration, pierces the stacked body 100, the source layer SL, and the insulating layer 13 directly under the source layer SL, and reaches the lower layer interconnect 12. The lower end portion of the via 81 contacts the lower layer interconnect 12. The via 81 is conductive and is, for example, a metal via.

An insulating layer 42 is provided on the stacked body 100; and, for example, an upper layer interconnect 18 that is a metal interconnect is provided on the insulating layer 42. An insulating layer 43 is provided around the upper layer interconnect 18. A via 82 that pierces the insulating layer 42 is provided between the upper layer interconnect 18 and the upper end of the via 81. The upper layer interconnect 18 and the lower layer interconnect 12 are electrically connected by the via 82 and the via 81.

An insulating film 63 is provided at the side surface of the via 81 having the substantially circular columnar configuration to surround the via 81. The insulating film 63 is provided between the side surface of the via 81 and the electrode layers 70, between the side surface of the via 81 and the insulating layers 72, and between the source layer SL and the side surface of the via 81.

As shown in FIG. 6A, the electrode layer 70 surrounds the via 81 with the insulating film 63 interposed. As shown in FIG. 6B, the insulating layer 72 surrounds the via 81 with the insulating film 63 interposed. The source layer SL also surrounds the via 81 with the insulating film 63 interposed.

An end surface 70a of the electrode layer 70 opposing the side surface of the via 81 is recessed in the diametral direction of the via 81 to be more distal to the via 81 than an end surface 72a of the insulating layer 72 opposing the side surface of the via 81. End surfaces 15a and 16a of the source layer SL opposing the side surface of the via 81 also recede in the diametral direction of the via 81 to be more distal to the via 81 than the end surface 72a of the insulating layer 72.

A distance d1 along the diametral direction of the via 81 between the end surface 70a of the electrode layer 70 and the side surface of the via 81 is longer than a distance d2 along the diametral direction between the end surface 72a of the insulating layer 72 and the side surface of the via 81.

The distance along the diametral direction between the side surface of the via 81 and the end surfaces 15a and 16a of the source layer SL also is longer than the distance d2 along the diametral direction between the end surface 72a of the insulating layer 72 and the side surface of the via 81.

The thickness along the diametral direction of the via 81 of the insulating film 63 between the end surface 70a of the electrode layer 70 and the side surface of the via 81 (corresponding to the distance d1 recited above) is thicker than the thickness along the diametral direction of the insulating film 63 between the end surface 72a of the insulating layer 72 and the side surface of the via 81 (corresponding to the distance d2 recited above).

The thickness along the diametral direction of the insulating film 63 between the side surface of the via 81 and the end surfaces 15a and 16a of the source layer SL also is thicker than the thickness along the diametral direction of the insulating film 63 between the end surface 72a of the insulating layer 72 and the side surface of the via 81.

As shown in FIG. 5, the positions of the side surface and the bottom of the via 81 are within the interconnect width of the lower layer interconnect 12 and do not jut outside an end 12a in the width direction of the lower layer interconnect 12. The end surface 70a of the electrode layer 70 is positioned further outside the end 12a of the lower layer interconnect 12 in the diametral direction of the via 81. The end surfaces 15a and 16a of the source layer SL also are positioned further outside the end 12a of the lower layer interconnect 12 in the diametral direction of the via 81.

As shown in FIG. 6A, the distance between the end surface 70a of the electrode layer 70 surrounding the via 81 (a distance D1 along the diametral direction of the via 81) corresponds to the outer diameter of the insulating film 63 between the via 81 and the electrode layer 70. The distance (the outer diameter) D1 is wider than an interconnect width W of the lower layer interconnect 12.

As shown in FIGS. 5 and 6A, the insulating film 63 includes a portion surrounded by the end surface 70a of the electrode layer 70. The interconnect width W of the lower layer interconnect 12 is smaller than an outer diameter of the portion of the insulating film 63 surrounded by the end surface 70a of the electrode layer 70.

As shown in FIG. 5, the stacked body 100 includes a portion in which the insulating film 63 and the insulating layers 72 are repeated alternately in the stacking direction of the stacked body 100.

A method for manufacturing the semiconductor device of the embodiment will now be described.

First, the processes for the cross-sectional structure portion illustrated in FIG. 3 will be described with reference to FIG. 7 to FIG. 15.

Figure 7:
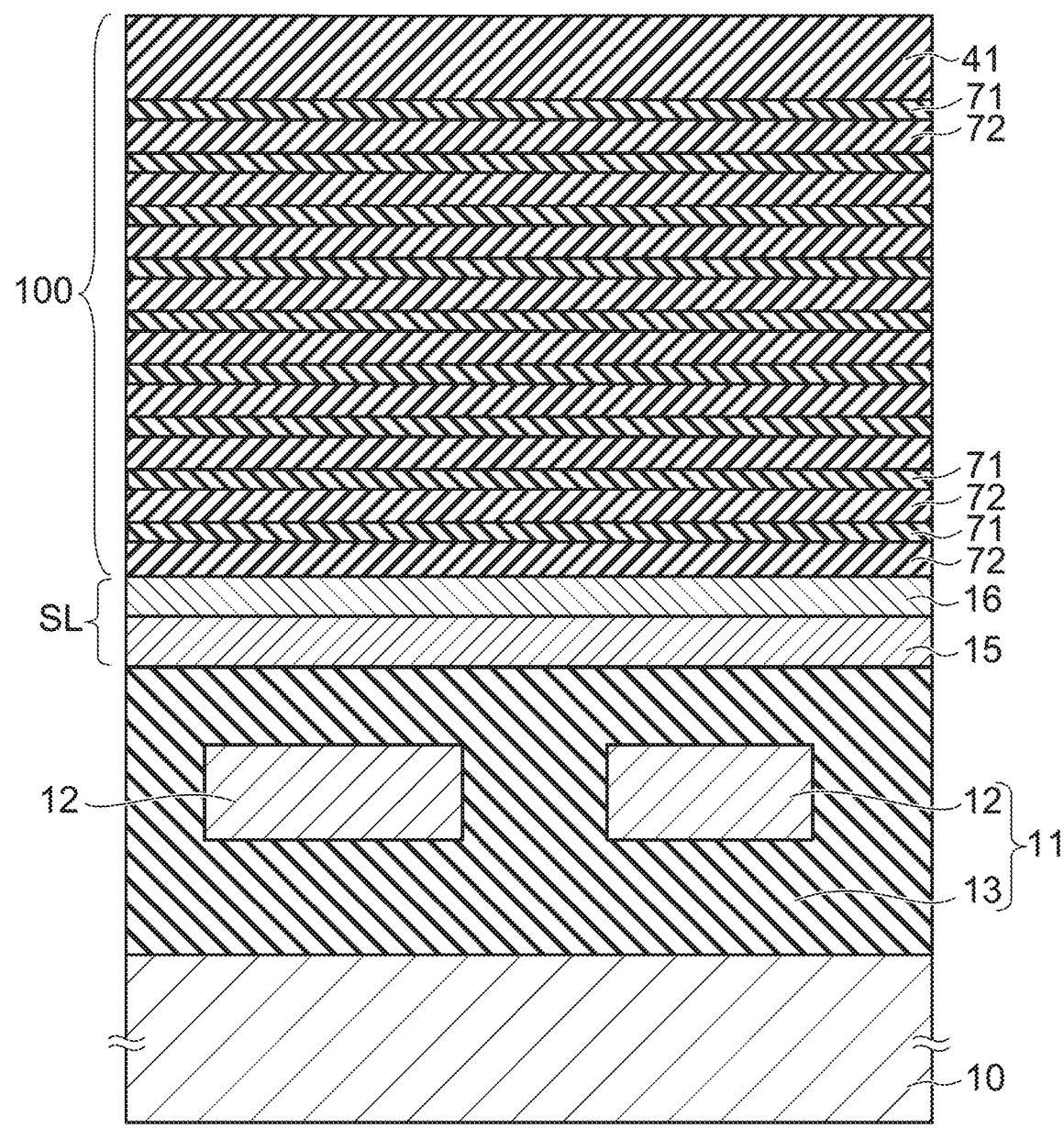
FIG. 7 to FIG. 22 are schematic cross-sectional views showing a method for manufacturing the semiconductor device of the embodiment.

As shown in FIG. 7, the circuit layer 11 including the lower layer interconnect 12 is formed on the substrate 10; and the source layer SL is formed on the circuit layer 11. The layer 15 including the metal is formed on the insulating layer 13 of the circuit layer 11; and the semiconductor layer 16 is formed on the layer 15 including the metal.

The insulating layer 72 as a second layer and a sacrificial layer 71 as a first layer are stacked alternately on the source layer SL. The process of alternately stacking the insulating layer 72 and the sacrificial layer 71 is repeated; and the stacked body 100 including the multiple sacrificial layers 71 and the multiple insulating layers 72 is formed on the source layer SL. The insulating layer 41 is formed on the uppermost sacrificial layer 71. For example, the sacrificial layer 71 is a silicon nitride layer; and the insulating layer 72 is a silicon oxide layer.

Figure 8:
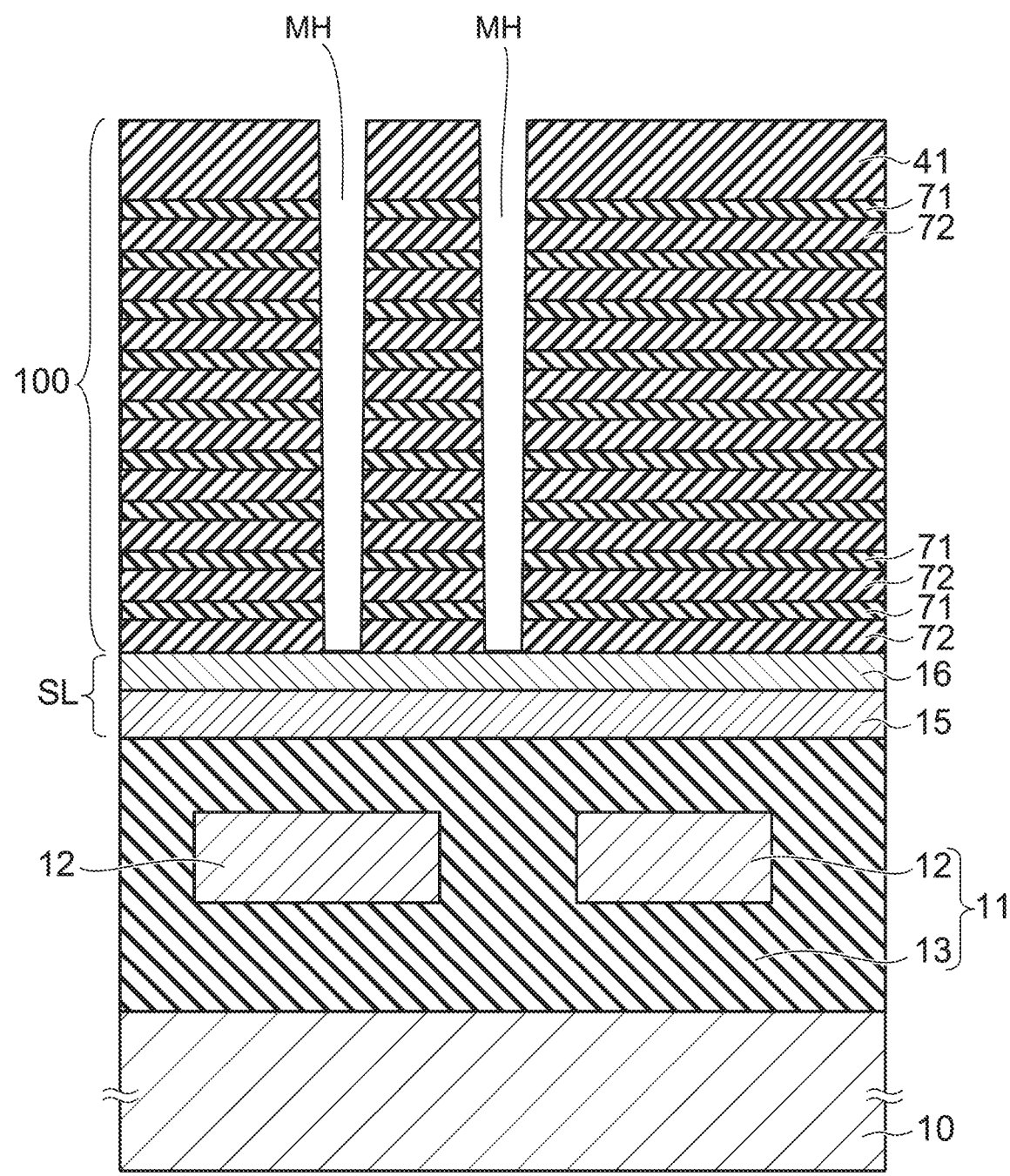

As shown in FIG. 8, multiple memory holes MH are formed in the stacked body 100. The memory holes MH are formed by RIE (reactive ion etching) using a not-illustrated mask layer. The memory holes MH pierce the stacked body 100 and reach the semiconductor layer 16 of the source layer SL.

Figure 9:
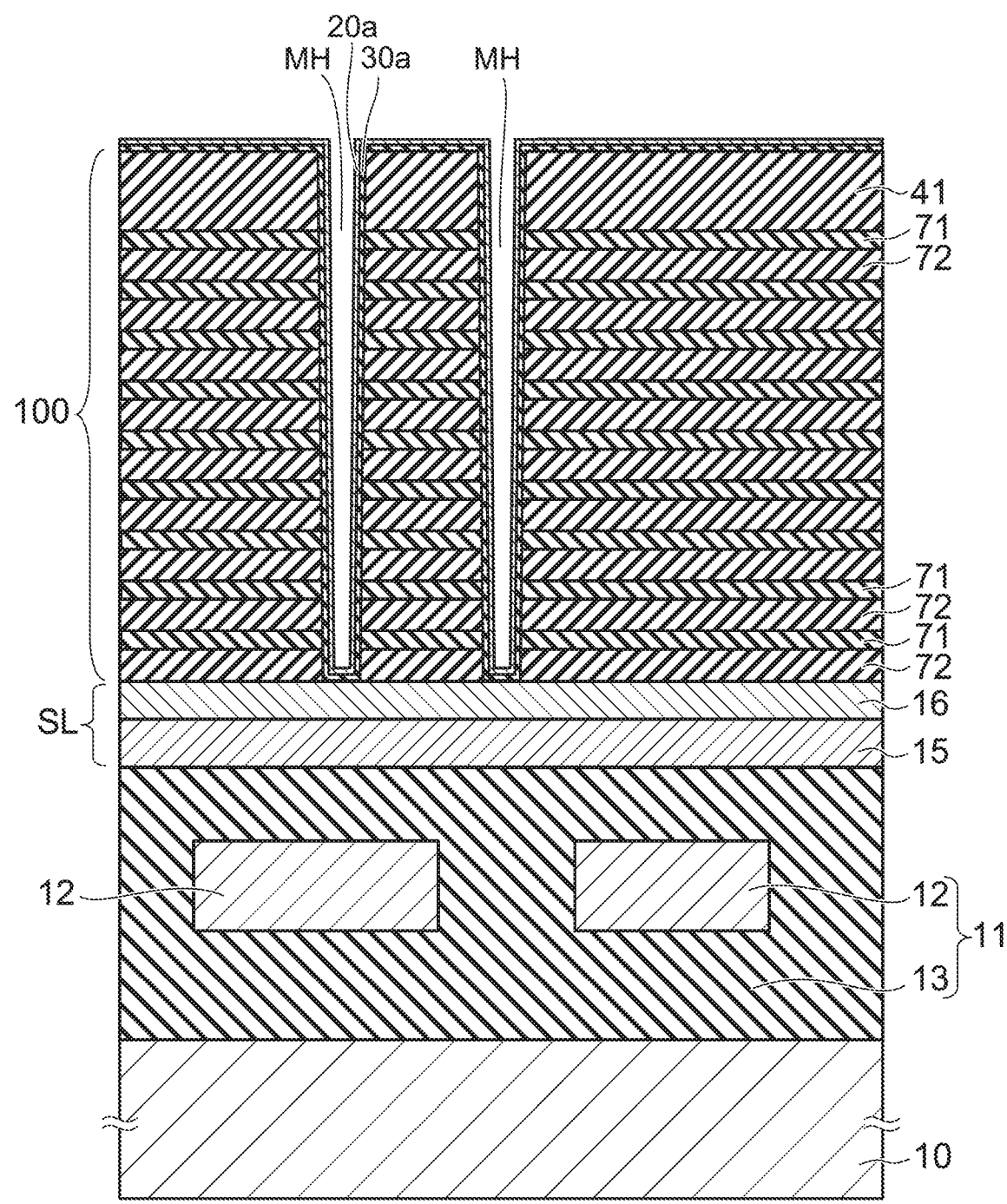

As shown in FIG. 9, a stacked film 30a is formed inside the memory holes MH. The stacked film 30a is formed conformally along the side surfaces and bottoms of the memory holes MH. The stacked film 30a includes, for example, the tunneling insulating film 31, the charge storage film 32, and the first blocking film 34 of the memory film 30 shown in FIG. 4. The first blocking film 34, the charge storage film 32, and the tunneling insulating film 31 are formed in order inside the memory holes MH.

A cover silicon film 20a is formed on the inner side of the stacked film 30a. The cover silicon film 20a is formed conformally along the side surfaces and bottoms of the memory holes MH.

Figure 10:
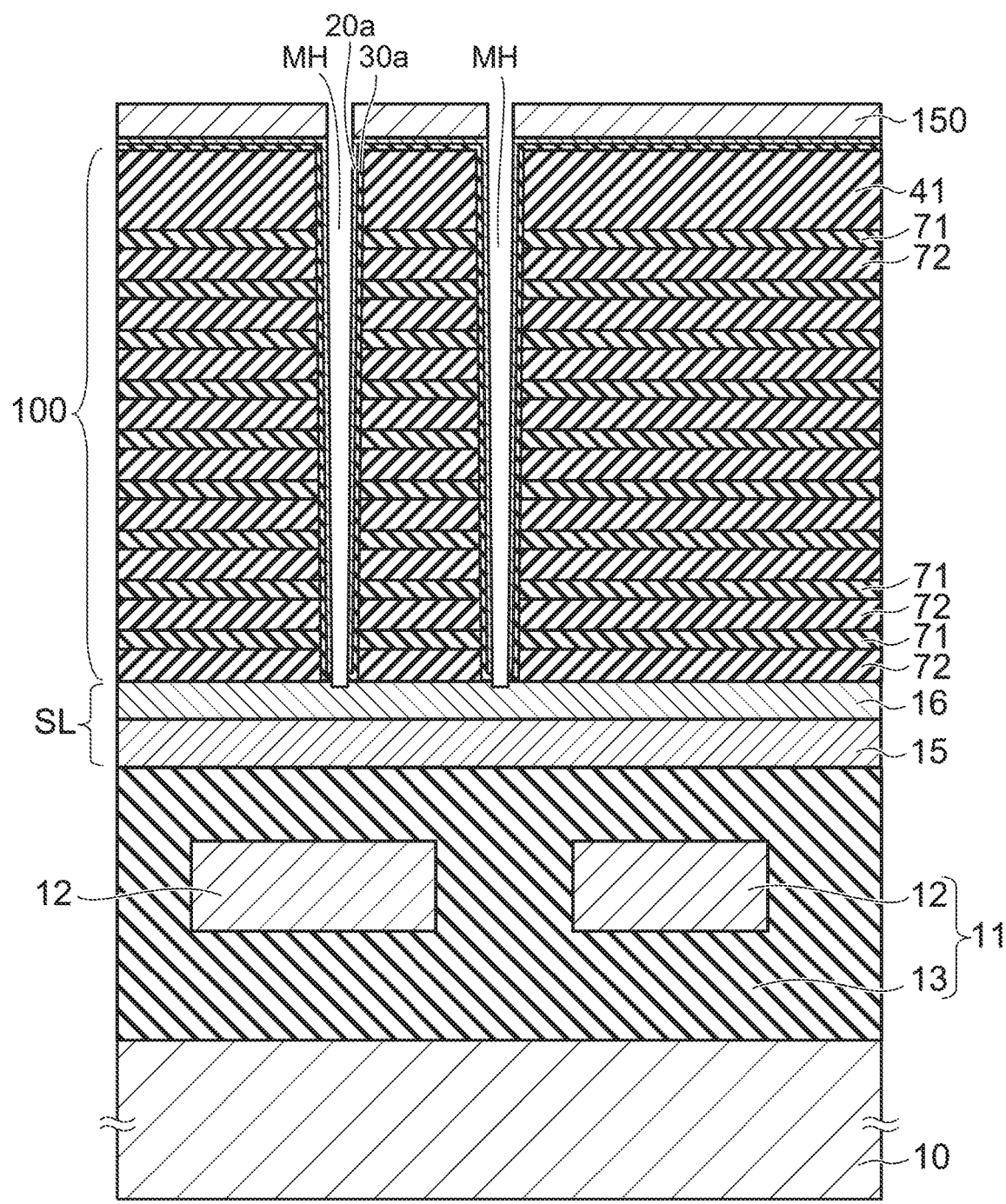

Then, as shown in FIG. 10, a mask layer 150 is formed on the insulating layer 41; and the cover silicon film 20a and the stacked film 30a that are deposited on the bottoms of the memory holes MH are removed by RIE. In the RIE, the stacked film 30a formed on the side surfaces of the memory holes MH is covered with and protected by the cover silicon film 20a and is not damaged by the RIE.

Figure 11:
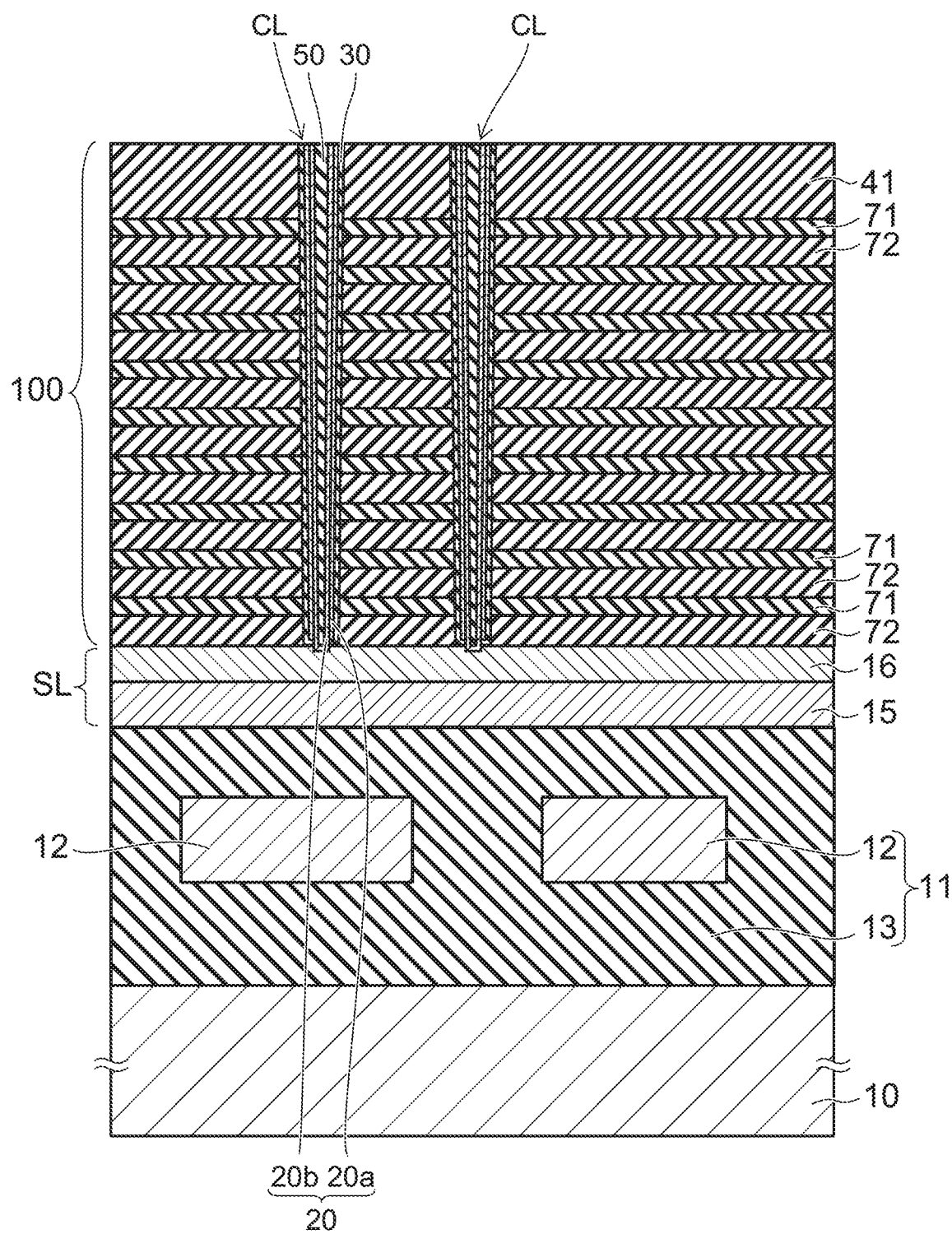

After removing the mask layer 150, a silicon body film 20b is formed inside the memory holes MH as shown in FIG. 11. The silicon body film 20b is formed on the side surface of the cover silicon film 20a and on the semiconductor layer 16 exposed at the bottoms of the memory holes MH. The semiconductor layer 16 contacts the lower end portion of the silicon body film 20b.

For example, the cover silicon film 20a and the silicon body film 20b are crystallized into polycrystalline silicon films by heat treatment after being formed as amorphous silicon films.

The core film 50 is formed on the inner side of the silicon body film 20b. The multiple columnar portions CL that include the stacked film 30a, the semiconductor body 20, and the core film 50 are formed inside the stacked body 100.

For example, the columnar portions HR that have the stacked structure of the same film as the columnar portions CL may be formed simultaneously with the columnar portions CL. Subsequently, the films deposited on the insulating layer 41 in the formation of the columnar portions CL and the columnar portions HR are removed by chemical mechanical polishing (CMP) or etch-back.

Figure 12:
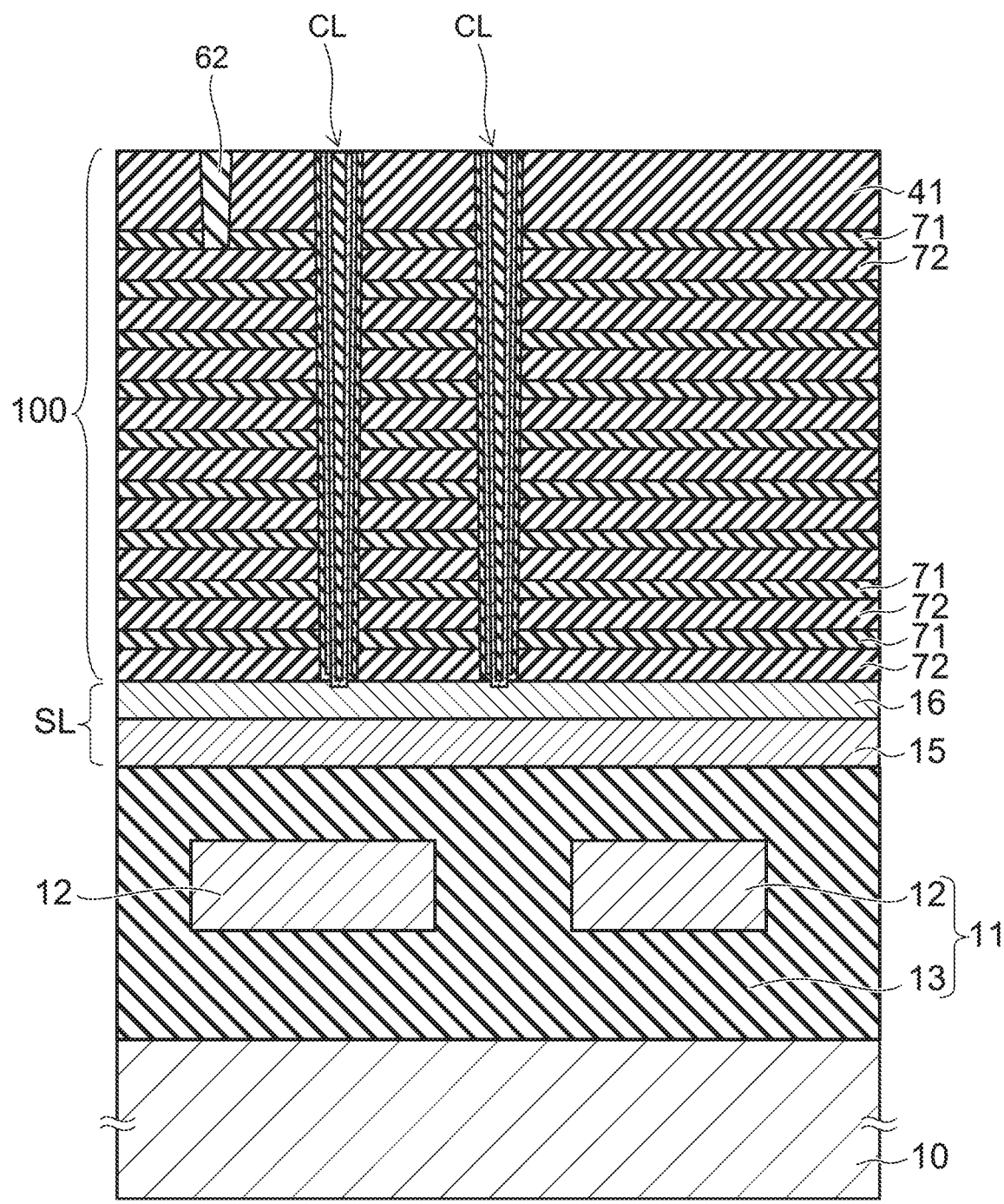

After forming the columnar portions CL, the separation portion 62 is formed as shown in FIG. 12 to divide the sacrificial layer 71 of at least the uppermost layer that will be replaced in a subsequent process with the electrode layer 70 functioning as the drain-side selection gate.

Figure 13:
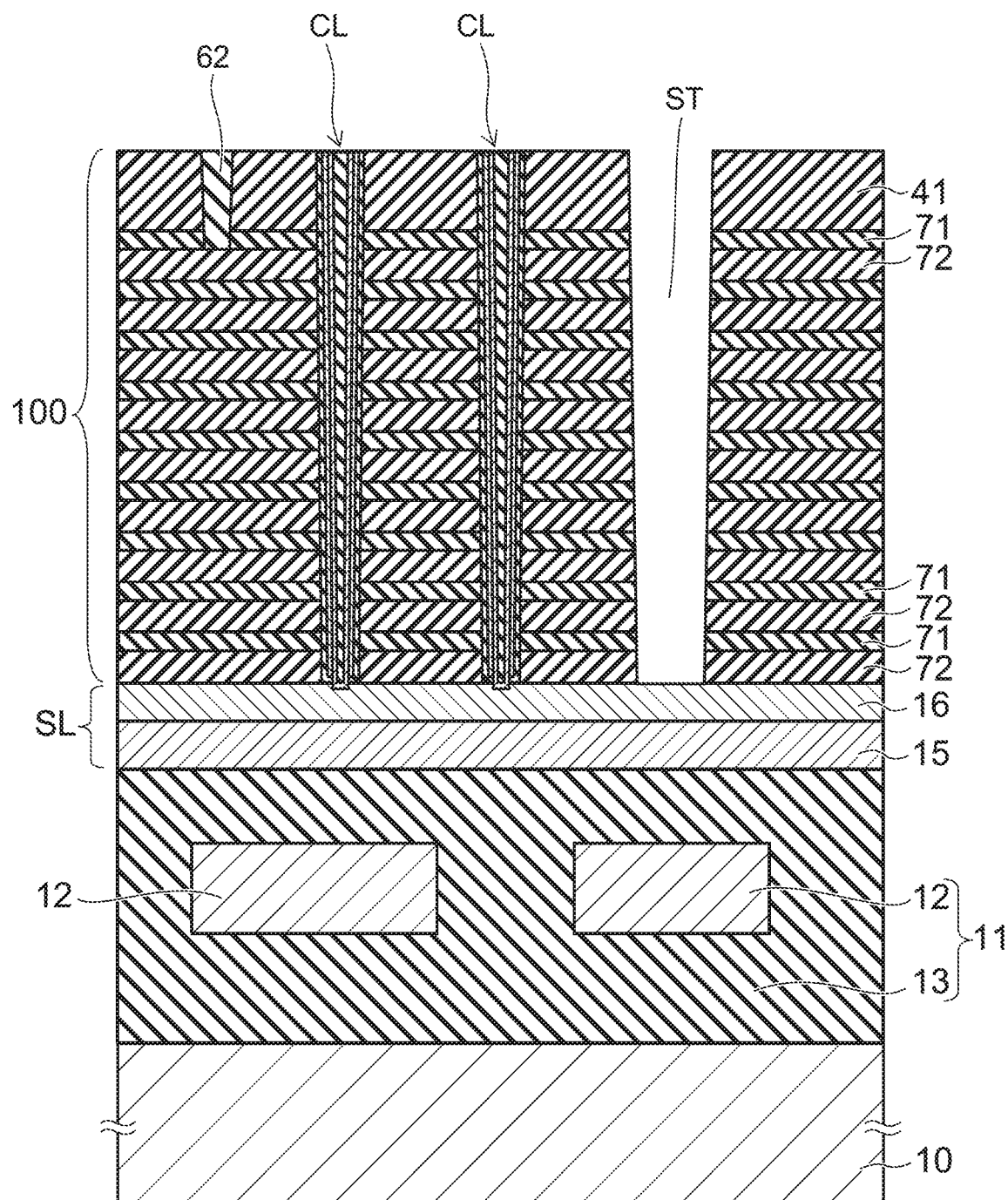

Subsequently, as shown in FIG. 13, multiple slits ST are formed in the stacked body 100 by RIE using a not-illustrated mask layer. The slits ST pierce the stacked body 100 and reach the source layer SL. The slits ST extend in the X-direction and divide the stacked body 100 into multiple blocks in the Y-direction.

Then, the sacrificial layers 71 are removed using an etchant or an etching gas supplied through the slits ST. For example, the sacrificial layers 71 which are silicon nitride layers are removed using an etchant including phosphoric acid.

Figure 14:
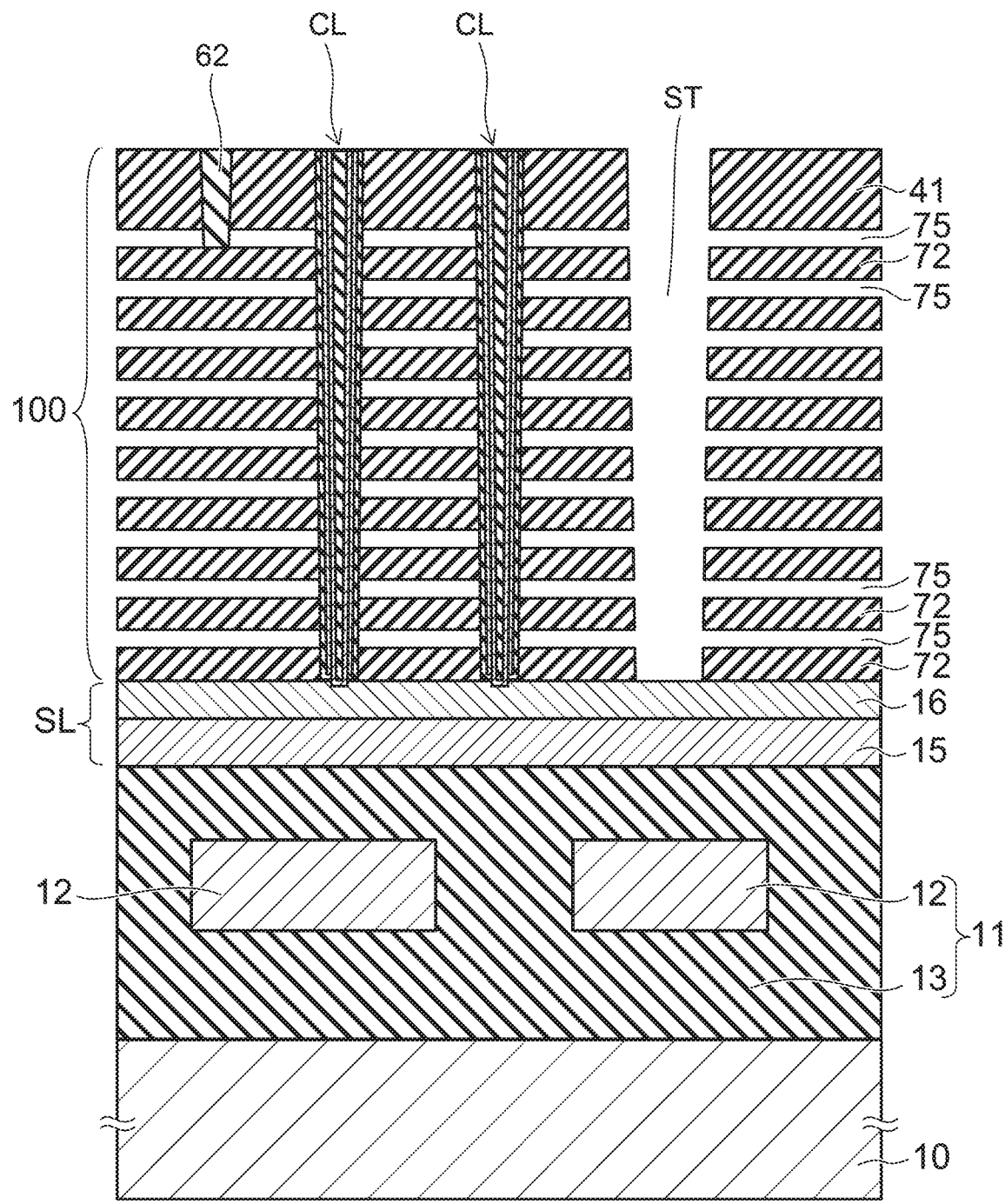

The sacrificial layers 71 are removed; and gaps 75 are formed between the insulating layers 72 adjacent to each other above and below as shown in FIG. 14. The gap 75 is formed also between the insulating layer 41 and the uppermost insulating layer 72.

The multiple insulating layers 72 in the region where the multiple columnar portions CL and HR are disposed contact the side surfaces of the columnar portions CL and HR to surround the side surfaces of the multiple columnar portions CL and HR. The multiple insulating layers 72 are supported by such a physical bond with the multiple columnar portions CL and HR; and the gaps 75 are maintained between the insulating layers 72.

Figure 15:
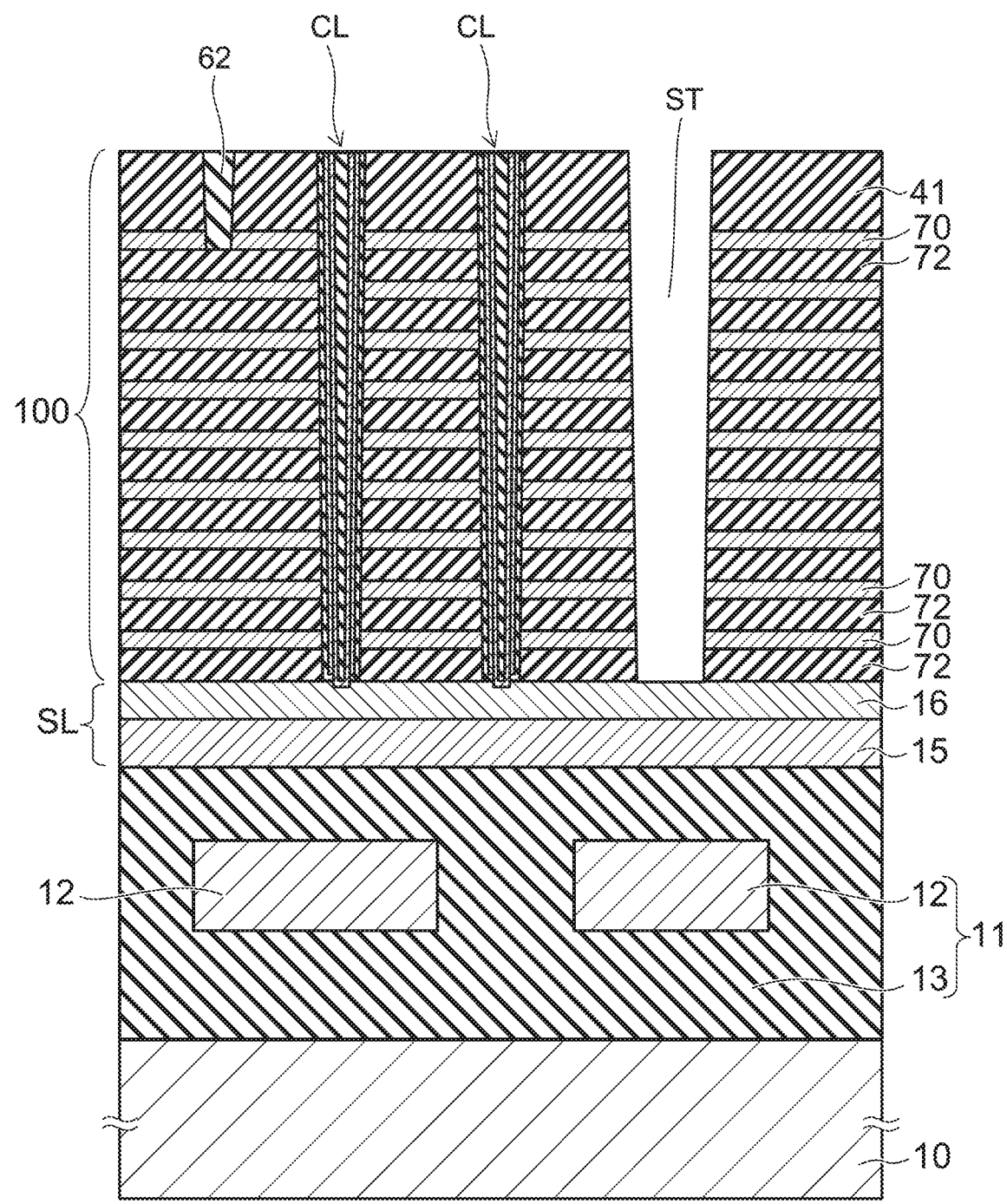

As shown in FIG. 15, the electrode layer 70 is formed in the gap 75 with the second blocking film 35 shown in FIG. 4 interposed. For example, the second blocking film 35 and the electrode layer 70 are formed by CVD. A source gas is supplied to the gap 75 through the slit ST. The electrode layer 70 formed on the side surface of the slit ST is removed.

Subsequently, an insulating film is filled into the slit ST; and the separation portion 61 shown in FIG. 3 is formed.

The processes for the cross-sectional structure portion illustrated in FIG. 5 will now be described with reference to FIG. 16 to FIG. 21.

Figure 16:
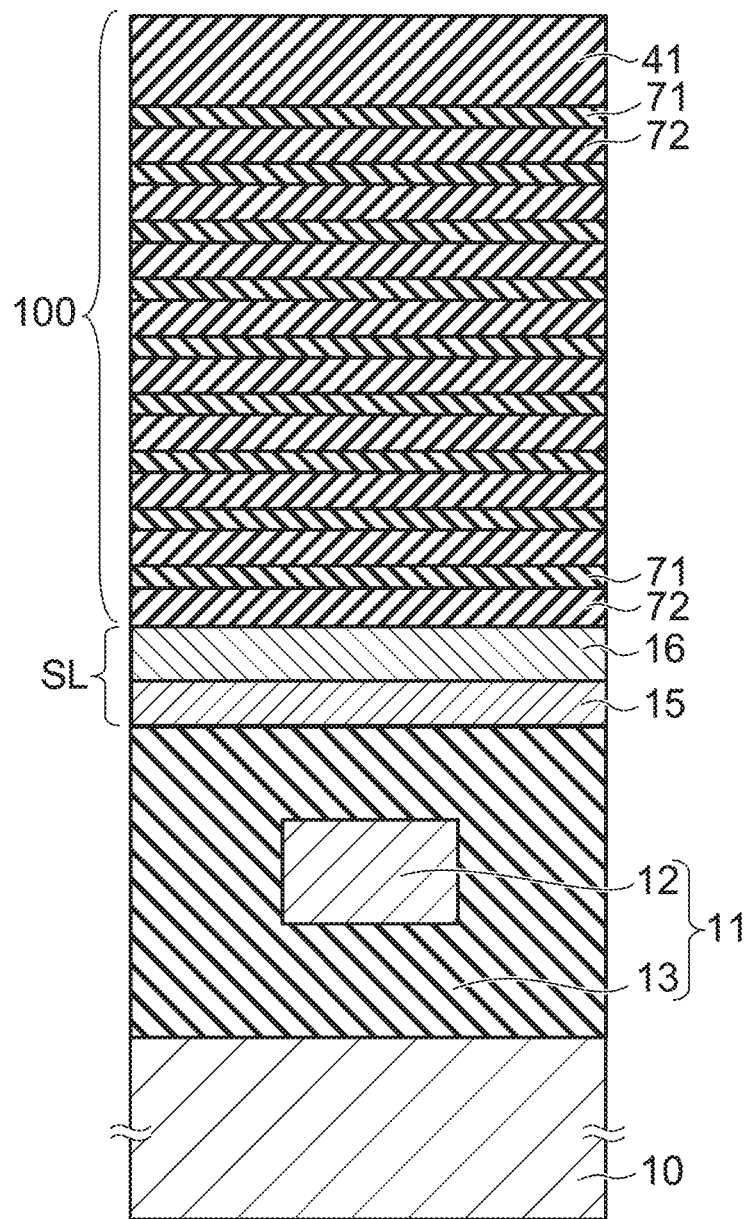

In the region where the via 81 is disposed as well, the circuit layer 11, the source layer SL, and the stacked body 100 are formed in order on the substrate 10 as shown in FIG. 16.

Figure 17:
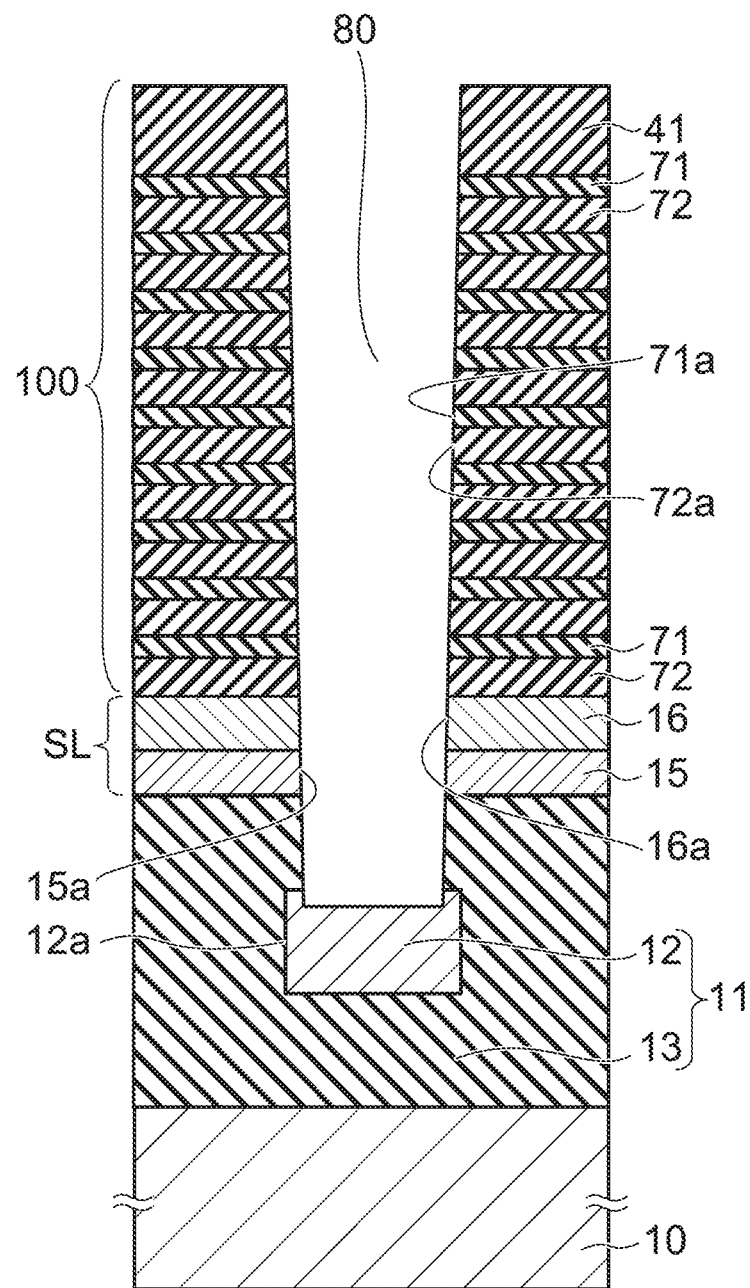

Then, as shown in FIG. 17, a hole 80 is formed prior to forming the columnar portions CL or after forming the columnar portions CL.

The hole 80 pierces the stacked body 100, the source layer SL, and the insulating layer 13 directly under the source layer SL and reaches the lower layer interconnect 12. The hole 80 is formed by RIE using a not-illustrated mask layer. The sacrificial layers 71 of the stacked body 100 are not yet replaced with the electrode layers 70.

The diameter of the hole 80 is narrower than the interconnect width of the lower layer interconnect 12; and the hole 80 does not jut outside the end 12a of the lower layer interconnect 12.

For example, the multiple sacrificial layers 71 and the multiple insulating layers 72 are etched continuously using the same etching gas by using the semiconductor layer 16 which is a silicon layer as a stopper. Then, the semiconductor layer 16 is etched using the layer 15 including the metal as a stopper. Continuing, the layer 15 including the metal is etched using the insulating layer 13 as a stopper. Then, the insulating layer 13 is etched using the lower layer interconnect 12 as a stopper.

An end surface 71a of the sacrificial layer 71, the end surface 72a of the insulating layer 72, the end surface 16a of the semiconductor layer 16, and the end surface 15a of the layer 15 including the metal each are continuous in the circumferential direction of the hole 80 to surround the hole 80 and are exposed in the hole 80.

Figure 18:
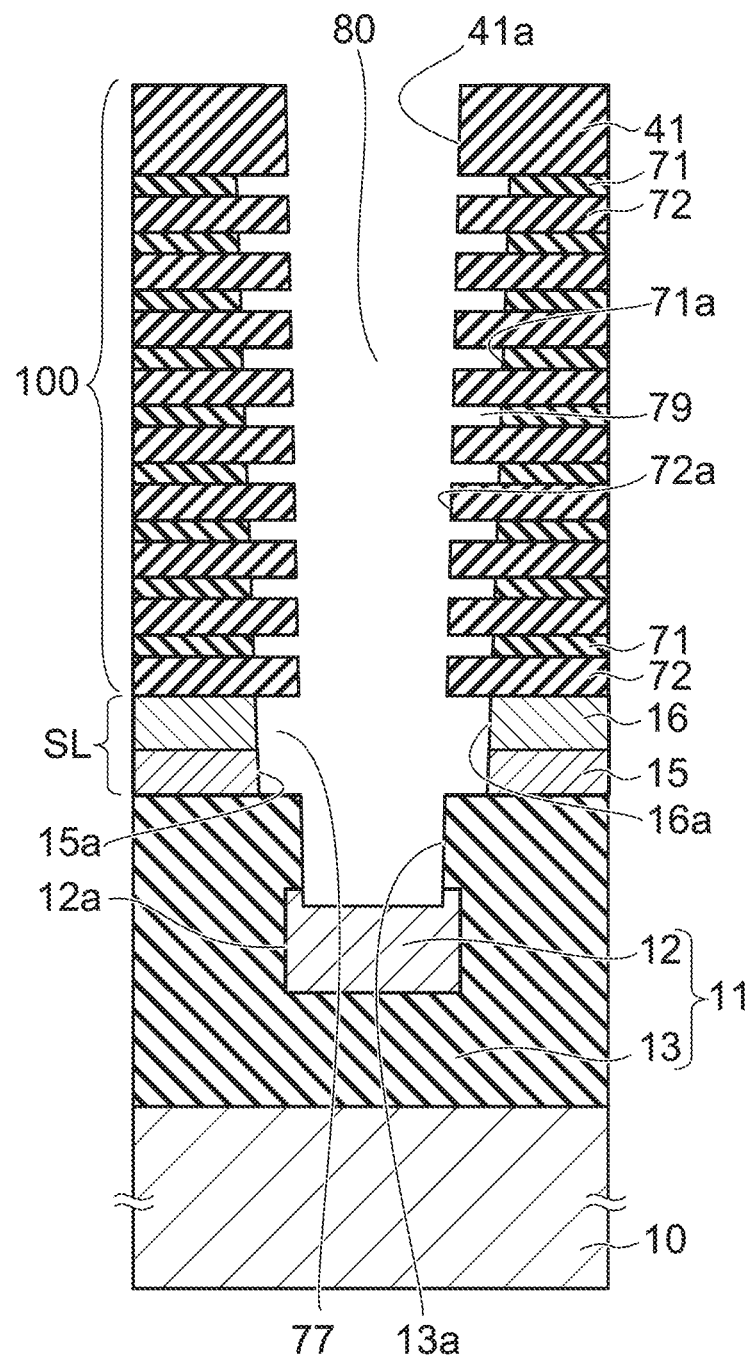

Then, the end surface 71a of the sacrificial layer 71 is caused to be positioned at a second position shown in FIG. 18 that is more distal to the hole 80 in the diametral direction of the hole 80 than a first position shown in FIG. 17 that is exposed in the hole 80.

The end surface 71a of the sacrificial layer 71 is caused to recede to the second position by isotropic etching such as chemical liquid processing, CDE (Chemical Dry Etching), etc. For example, the end surface 71a of the sacrificial layer 71 which is a silicon nitride layer is caused to recede to the second position by etching using an etchant including phosphoric acid.

The end surface 16a of the semiconductor layer 16 and the end surface 15a of the layer 15 including the metal each are also caused to recede to the second position shown in FIG. 18 from the first position shown in FIG. 17 by the isotropic etching.

The end surface 71a of the sacrificial layer 71, the end surface 16a of the semiconductor layer 16, and the end surface 15a of the layer 15 including the metal are caused to recede in the diametral direction of the hole 80 further than an end surface 41a of the insulating layer 41 on the hole 80 side, the end surface 72a of the insulating layer 72 on the hole 80 side, and an end surface 13a of the insulating layer 13 on the hole 80 side.

The recessed portions (both side portions of the cross section illustrated in FIG. 18) of the end surface 71a of the sacrificial layer 71, the end surface 16a of the semiconductor layer 16, and the end surface 15a of the layer 15 including the metal are positioned further outside, in the diametral direction of the hole 80, than the end 12a in the interconnect width direction of the lower layer interconnect 12.

By the recession of the end surface 71a of the sacrificial layer 71, a gap 79 is formed between the insulating layer 41 and the insulating layer 72, and between the insulating layers 72 adjacent to each other above and below. By the recession of the end surface of the source layer SL (the end surface 16a of the semiconductor layer 16 and the end surface 15a of the layer 15 including the metal), a gap 77 is formed between the insulating layer 13 and the lowermost insulating layer 72.

Figure 19:
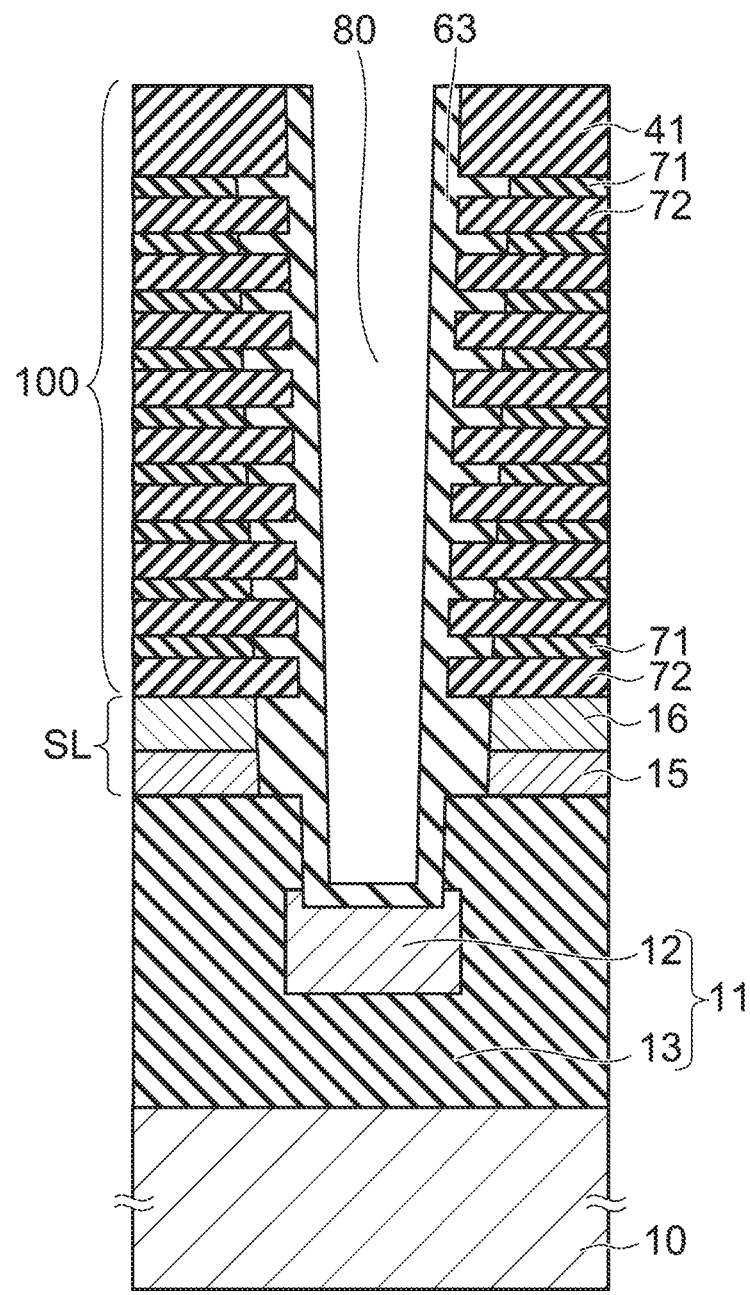

As shown in FIG. 19, the insulating film 63 is formed inside the hole 80. For example, the insulating film 63 is formed conformally along the side surface and bottom of the hole 80 by CVD or ALD (atomic layer deposition). The insulating film 63 is formed also in the gap 79 formed by the recession of the end surface 71a of the sacrificial layer 71 and the gap 77 formed by the recession of the end surface of the source layer SL.

The insulating film 63 is a film of a material different from that of the sacrificial layer 71 and is, for example, a silicon oxide film.

Figure 20:
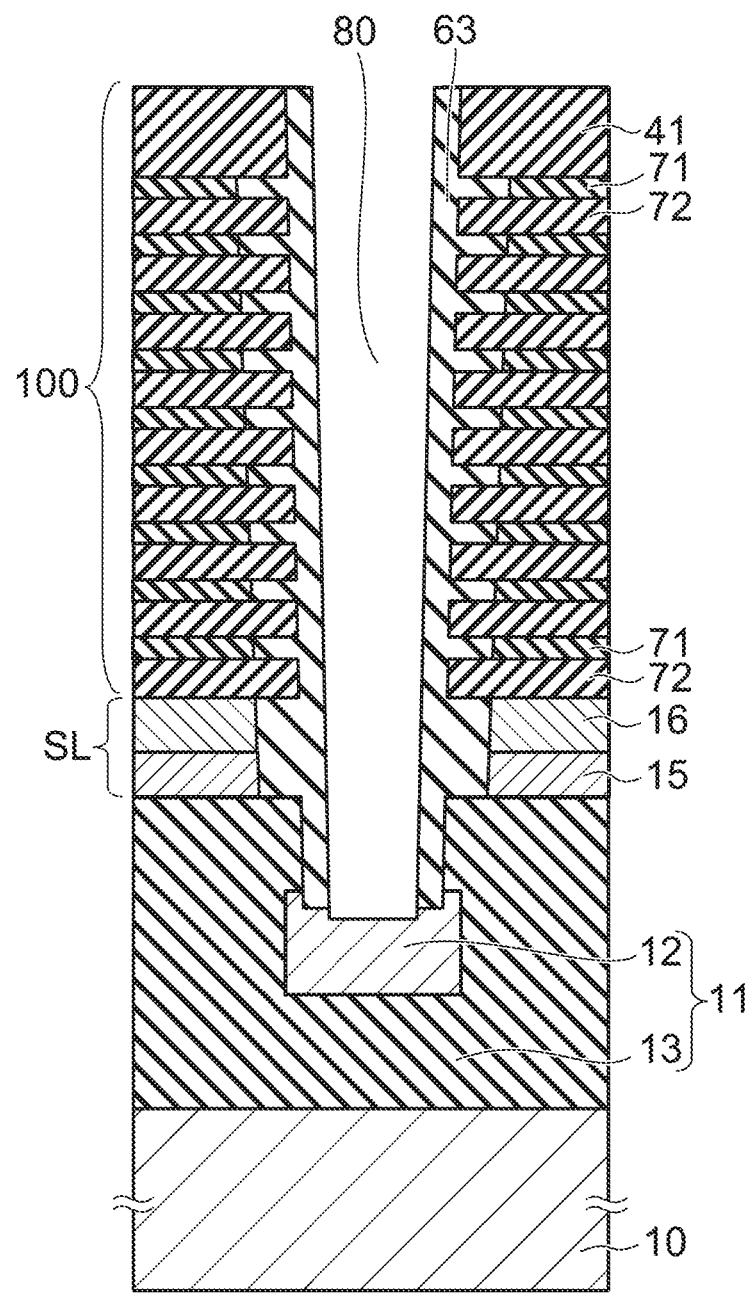

A gap (a portion of the hole 80) remains on the inner side of the insulating film 63 inside the hole 80. Then, for example, the insulating film 63 formed on the bottom of the hole 80 is removed by RIE. As shown in FIG. 20, the lower layer interconnect 12 is exposed at the bottom of the hole 80.

Figure 21:
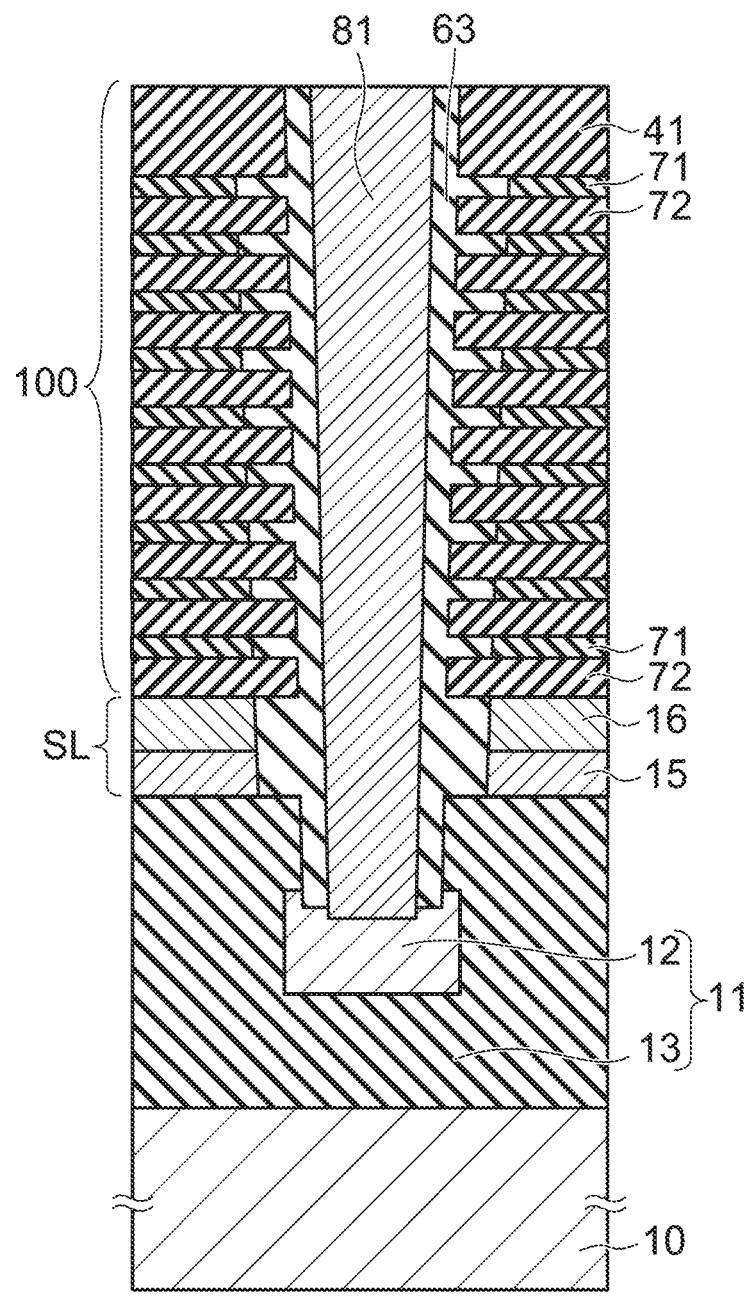

Subsequently, as shown in FIG. 21, the via 81 is formed inside the hole 80. For example, a metal material is filled into the hole 80. The lower end portion of the via 81 contacts the lower layer interconnect 12.

Subsequently, as shown in FIG. 13 to FIG. 15 described above, the formation of the slits ST and the replacement of the sacrificial layers 71 with the electrode layers 70 through the slits ST are performed.

As shown in FIG. 5, the insulating layer 42 is formed on the insulating layer 41; and the via 82 that contacts the upper end of the via 81 is formed inside the insulating layer 42. Subsequently, the insulating layer 43 is formed on the insulating layer 42; and the upper layer interconnect 18 that contacts the upper end of the via 82 is formed inside the insulating layer 43.

According to the embodiment, it is possible to reduce the chip surface area by disposing the lower layer interconnect 12 and the via 81 connected to the lower layer interconnect 12 inside the cell array region instead of the periphery of the cell array region. Also, it is possible to reduce the interconnect length between the memory cell array 1 and the control circuit; and it is possible to increase the operation speed.

It is desirable to set the distance between the via 81 and the conductive layers (the electrode layers 70 and the source layer SL) to be a distance sufficient to ensure the breakdown voltage between the via 81 and the conductive layers (the distance d1 shown in FIG. 5 and FIG. 6A). As a comparative example, it may be considered to form a hole having a diameter that is the diameter of the via 81 plus the width of (2×d1). The lower layer interconnect 12 functions as an etching stopper when forming the hole; and the interconnect width of the lower layer interconnect 12 is set to be larger than the diameter of the hole so that the etching does not progress to a region jutting from the lower layer interconnect 12. When the distance d1 for ensuring the breakdown voltage between the via 81 and the conductive layers is increased, the diameter of the hole in the comparative example recited above also is increased; and the lower layer interconnect width also is increased. This may cause an increase of the arrangement space of the lower layer interconnects and an increase of the chip surface area.

According to the embodiment, the width of the lower layer interconnect 12 also can be reduced because the hole 80 is formed to have a diameter (D2 of FIG. 6B) smaller than the diameter (D1 of FIG. 6A) which is the diameter of the via 81 plus the width of (2×d1). This makes it possible to reduce the chip surface area.

Even if the diameter of the hole 80 is reduced, after forming the hole 80 as shown in FIG. 18 described above, the end surfaces 71a of the sacrificial layers 71 replaced with the electrode layers 70 and the end surfaces 15a and 16a of the source layer SL are caused to recede in the diametral direction of the hole 80; therefore, the breakdown voltage between the via 81 and the conductive layers (the electrode layers 70 and the source layer SL) can be ensured.

The recessed amount of the conductive layers, i.e., the thickness (the thickness along the diametral direction of the via 81) of the insulating film 63 between the via 81 and the conductive layers is set to a thickness such that a sufficient breakdown voltage can be ensured at least between the via 81 and the conductive layers.

Even in the case where the insulating film 63 is somewhat etched when removing the sacrificial layers 71, the recessed amount of the conductive layers can be set so that the insulating film 63 that remains can have a film thickness sufficient to ensure the breakdown voltage recited above.

Increasing the recessed amount of the conductive layers increases the strength to resist sagging of the peripheral portion of the via 81 of the stacked body 100 when the sacrificial layers 71 are removed and the gaps 75 are formed.

Figure 22:
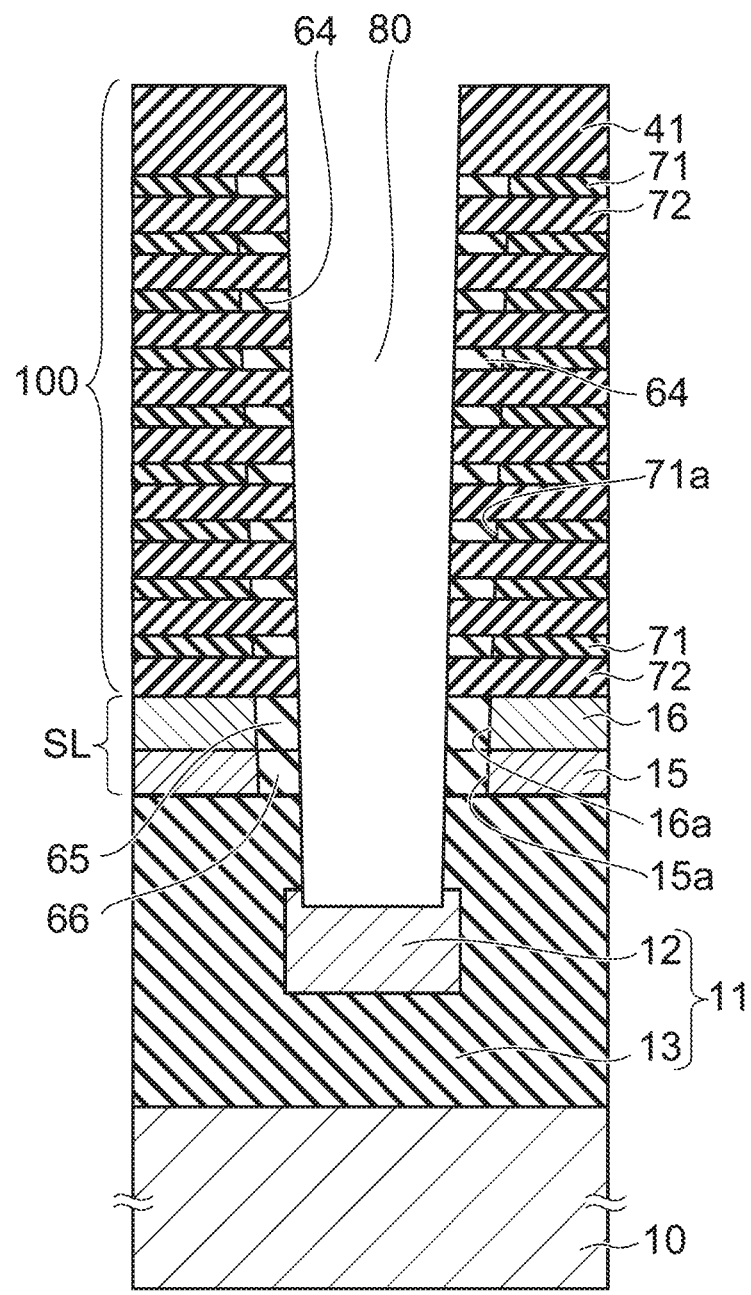

FIG. 22 shows an example in which the end surface 71a of the sacrificial layer 71 is caused to be positioned at the second position more distal to the hole 80 in the diametral direction of the hole 80 than the first position exposed in the hole 80 shown in FIG. 17 by oxidizing the end portion of the sacrificial layer 71 on the hole 80 side instead of etching.

For example, an insulating film (a silicon oxide film) 64 is formed at the end portion of the sacrificial layer 71 on the hole 80 side by oxidizing the end portion of the sacrificial layer 71 which is a silicon nitride layer in an oxidative atmosphere. The insulating film 64 is formed between the hole 80 and the end surface 71a of the sacrificial layer 71; and the end surface 71a of the sacrificial layer 71 is positioned at the second position that is more distal to the hole 80 in the diametral direction of the hole 80 than the first position shown in FIG. 17.

An insulating film (a silicon oxide film) 65 also can be formed at the end portion of the semiconductor layer 16 on the hole 80 side by, for example, oxidizing the end portion of the semiconductor layer 16 which is a silicon layer by using concentrated nitric acid. The insulating film 65 is formed between the hole 80 and the end surface 16a of the semiconductor layer 16; and the end surface 16a of the semiconductor layer 16 is positioned at the second position that is more distal to the hole 80 in the diametral direction of the hole 80 than the first position shown in FIG. 17.

An insulating film (a metal oxide film) 66 also can be formed at the end portion of the layer 15 including the metal on the hole 80 side by oxidizing the end portion. The insulating film 66 is formed between the hole 80 and the end surface 15a of the layer 15 including the metal; and the end surface 15a of the layer 15 including the metal is positioned at the second position that is more distal to the hole 80 in the diametral direction of the hole 80 than the first position shown in FIG. 17.

After the process of FIG. 22, the insulating film 63 is formed along the side surface and bottom of the hole 80 as shown in FIG. 19; and the process of FIG. 20 and the subsequent processes described above are continued.

Figure 23:
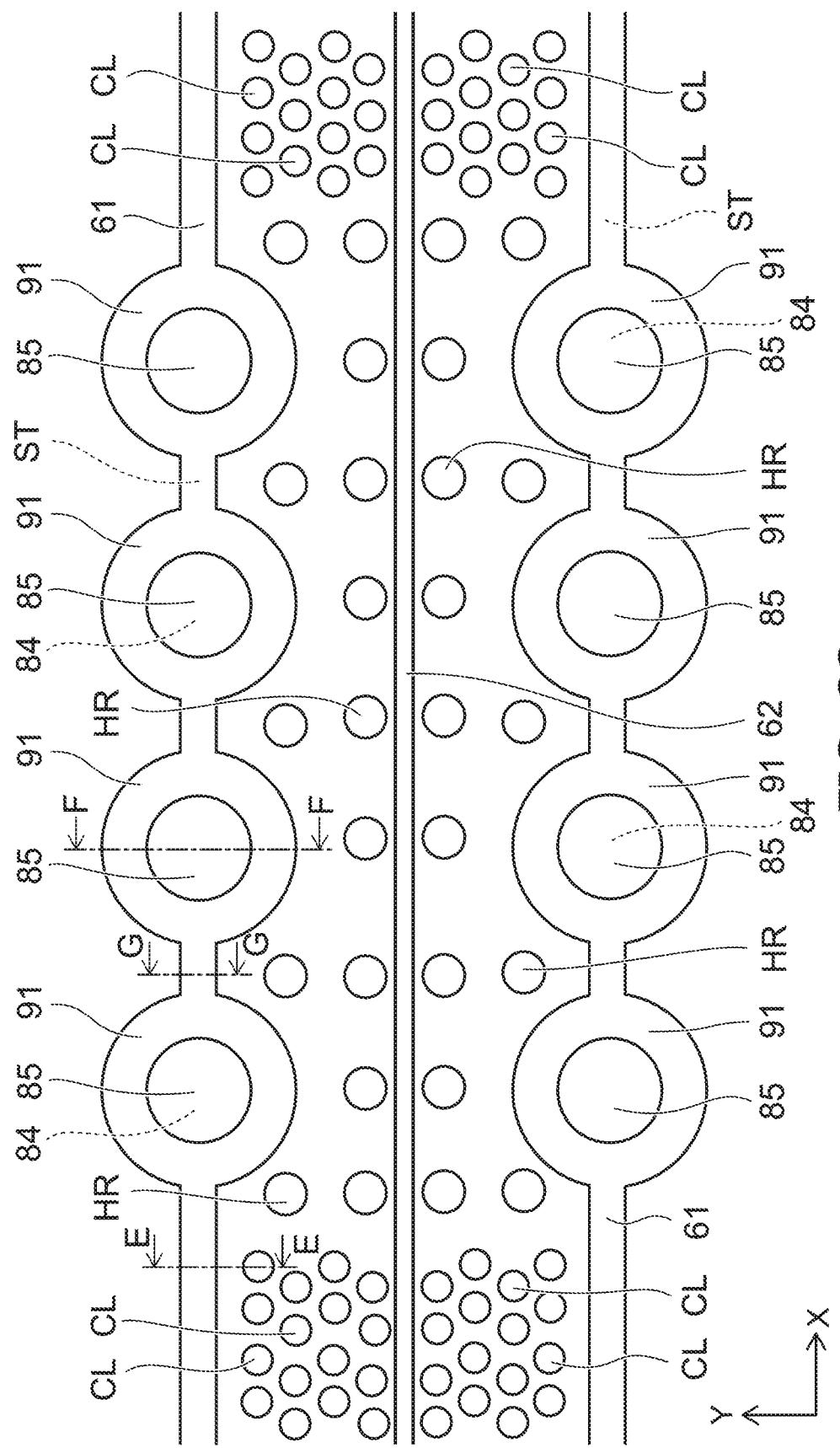
FIG. 23 is a schematic plan view of a semiconductor device of the embodiment.

FIG. 23 is a schematic plan view showing another example of the cell array region.

Figure 24:
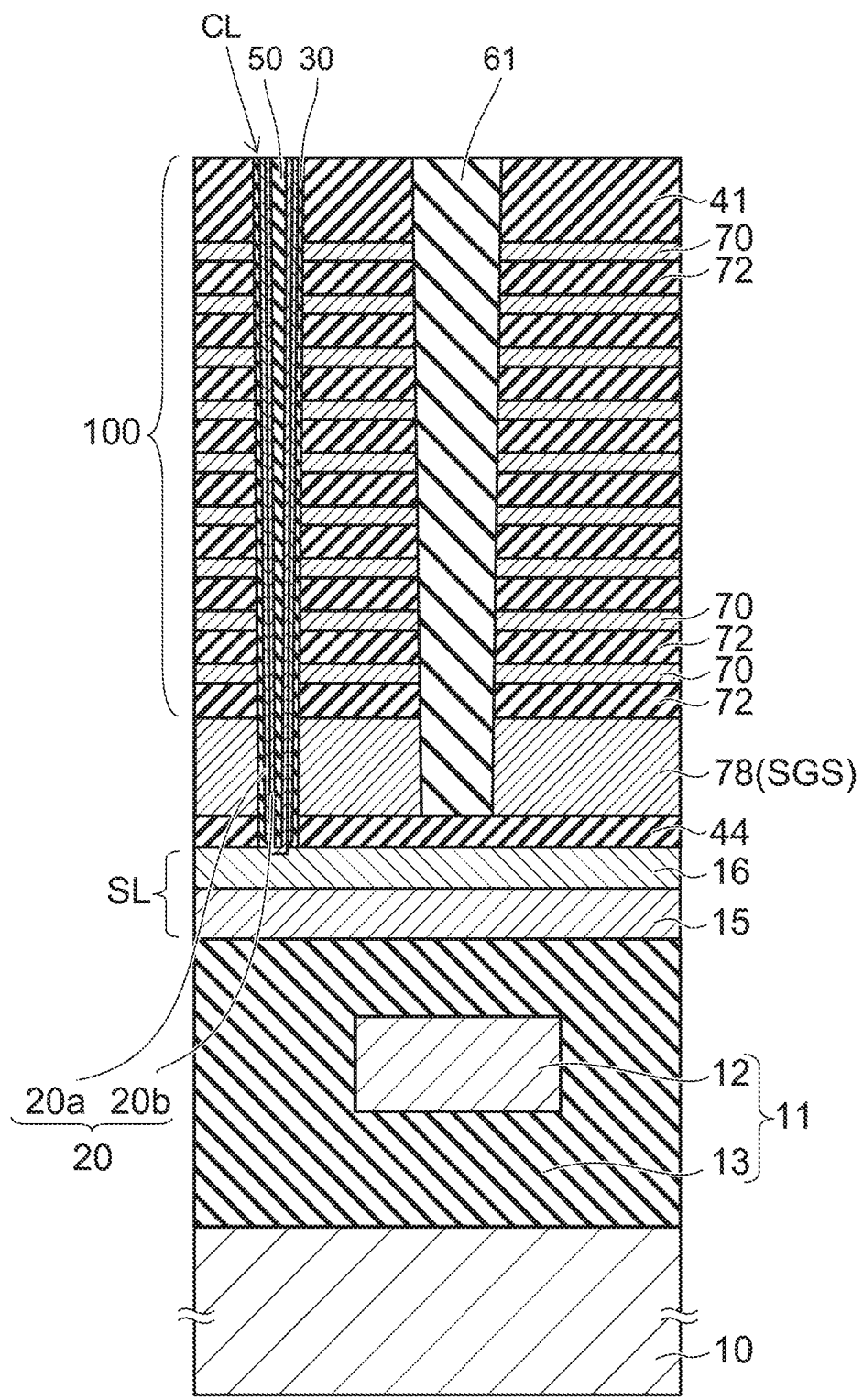
FIG. 24 is an E-E cross-sectional view of FIG. 23.

FIG. 24 is an E-E cross-sectional view of FIG. 23.

Figure 25:
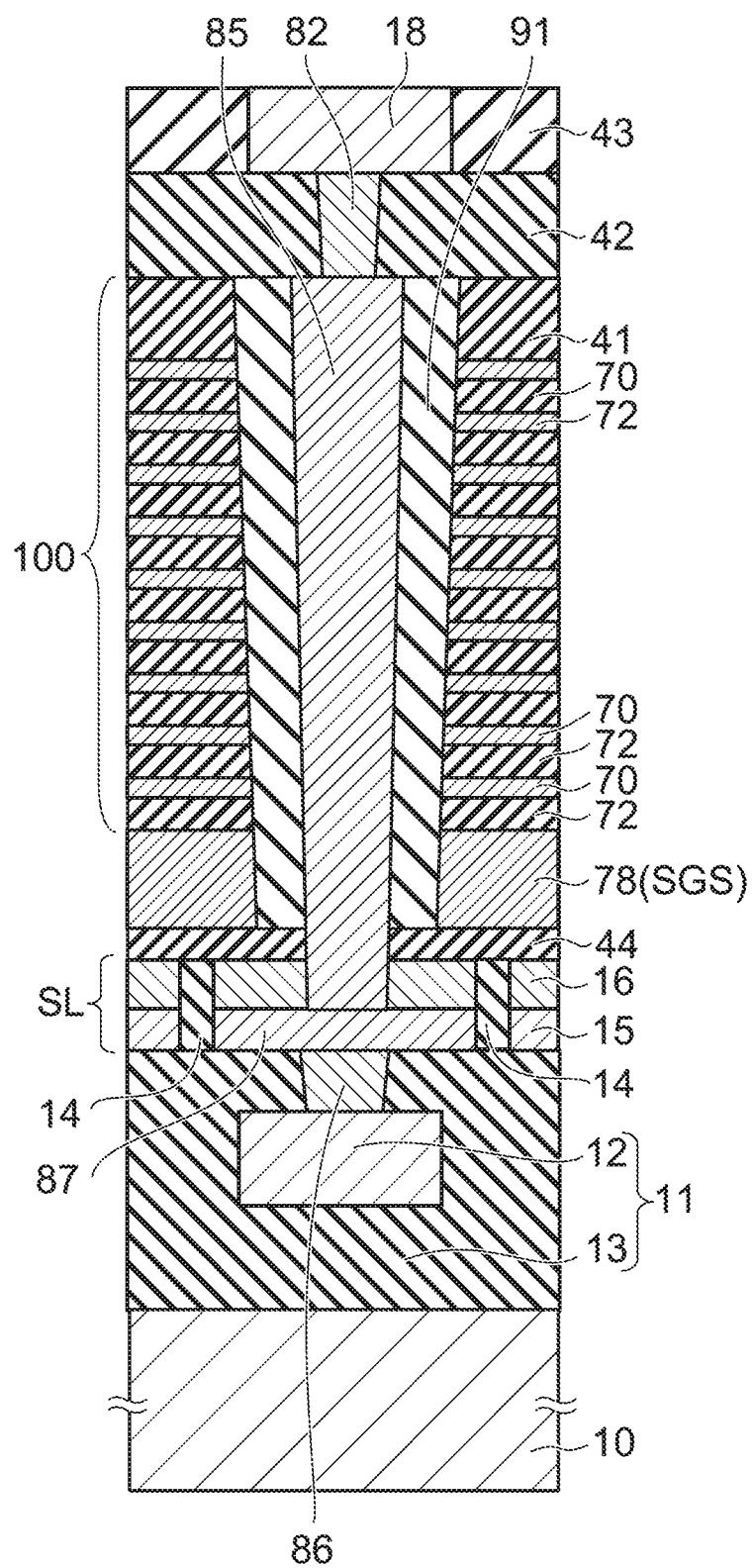
FIG. 25 is an F-F cross-sectional view of FIG. 23.

FIG. 25 is an F-F cross-sectional view of FIG. 23.

The structure shown in FIG. 24 differs from the structure shown in FIG. 3 described above in that a conductive layer 78 is provided between the source layer SL and the stacked body 100. An insulating layer 44 is provided on the semiconductor layer 16 of the source layer SL; and the conductive layer 78 is provided on the insulating layer 44. The insulating layer 72 is provided on the conductive layer 78; and the lowermost electrode layer 70 is provided on the insulating layer 72. Otherwise, the configuration is similar to that of FIG. 3.

The columnar portions CL pierce the stacked body 100, the conductive layer 78, and the insulating layer 44. The semiconductor bodies 20 of the columnar portions CL contact the semiconductor layer 16 of the source layer SL that is lower than the conductive layer 78. The separation portions 61 divide the stacked body 100 and the conductive layer 78 into multiple blocks in the Y-direction.

The thickness of the conductive layer 78 is thicker than the thickness of one layer of the electrode layers 70 and the thickness of one layer of the insulating layers 72. The conductive layer 78 is, for example, a polycrystalline silicon layer doped with an impurity. The conductive layer 78 functions as a source-side selection gate SGS of the source-side selection transistor STS. The electrode layers 70 on the lower layer side may be used as control gates of the memory cells MC instead of the source-side selection gate.

Also, the conductive layer 78 functions as a stopper layer when etching to form the holes and the slits in the stacked body 100.

As shown in FIG. 25, a conductive via 85 pierces the stacked body 100. The portion of the source layer SL below the via 85 is separated from the source layer SL by an insulating film 14 to become a lower layer interconnect 87. Similarly to the source layer SL, the lower layer interconnect 87 has a stacked structure of the semiconductor layer 16 and the layer 15 including the metal.

The via 85 pierces the stacked body 100, the conductive layer 78, the insulating layer 44, and the semiconductor layer 16 of the lower layer interconnect 87 and reaches the layer 15 including the metal of the lower layer interconnect 87. The lower end surface of the via 85 contacts the layer 15 including the metal. The side surface of the lower end portion of the via 85 contacts the semiconductor layer 16.

The lower layer interconnect 12 is positioned under the lower layer interconnect 87. A via 86 that connects the lower layer interconnect 87 and the lower layer interconnect 12 is provided between the lower layer interconnect 87 and the lower layer interconnect 12. The upper layer interconnect 18 and the lower layer interconnect 12 are electrically connected by the via 82, the via 85, the lower layer interconnect 87, and the via 86.

An insulating film 91 is provided between the stacked body 100 and the side surface of the via 85 and between the conductive layer 78 and the side surface of the via 85. The insulating film 91 has a film thickness sufficient to ensure the breakdown voltage between the via 85 and the electrode layers 70, and the breakdown voltage between the conductive layer 78 and the via 85.

As shown in FIG. 23, the insulating film 91 surrounds the via 85 having the circular columnar configuration. The multiple vias 85 are arranged to overlap a line of the separation portion 61 extending in the X-direction inside the cell array region shown in FIG. 23. The diameter of the via 85 is wider than the width of the separation portion 61.

The hole for forming the via 85 and the slit ST for forming the separation portion 61 are formed simultaneously.

A method for forming the via 85 and the separation portion 61 will now be described with reference to FIG. 26A to FIG. 34B.

FIG. 26B, FIG. 27B, FIG. 28B, FIG. 29B, FIG. 30B, FIG. 31B, FIG. 32B, FIG. 33B, and FIG. 34B are process cross-sectional views of an F-F cross-sectional portion of FIG. 23.

FIG. 26A, FIG. 27A, FIG. 28A, FIG. 29A, FIG. 30A, FIG. 31A, FIG. 32A, FIG. 33A, and FIG. 34A are process cross-sectional views of a G-G cross-sectional portion of FIG. 23.

The substrate 10 is not illustrated in these drawings.

Figure 26A:
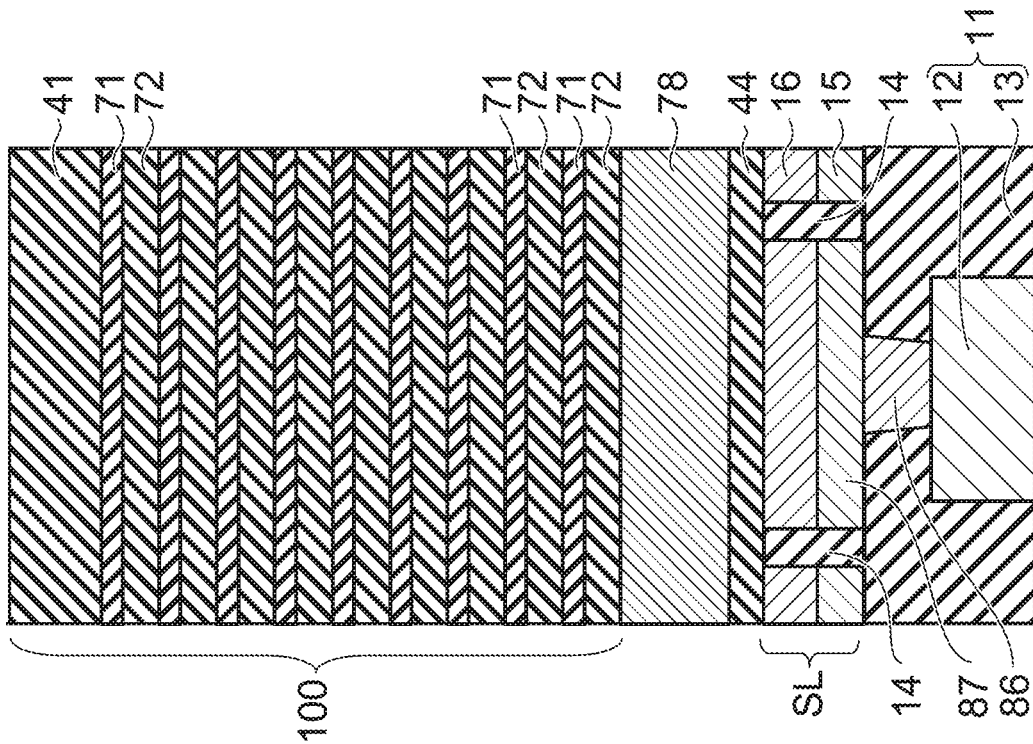
Figure 26B:
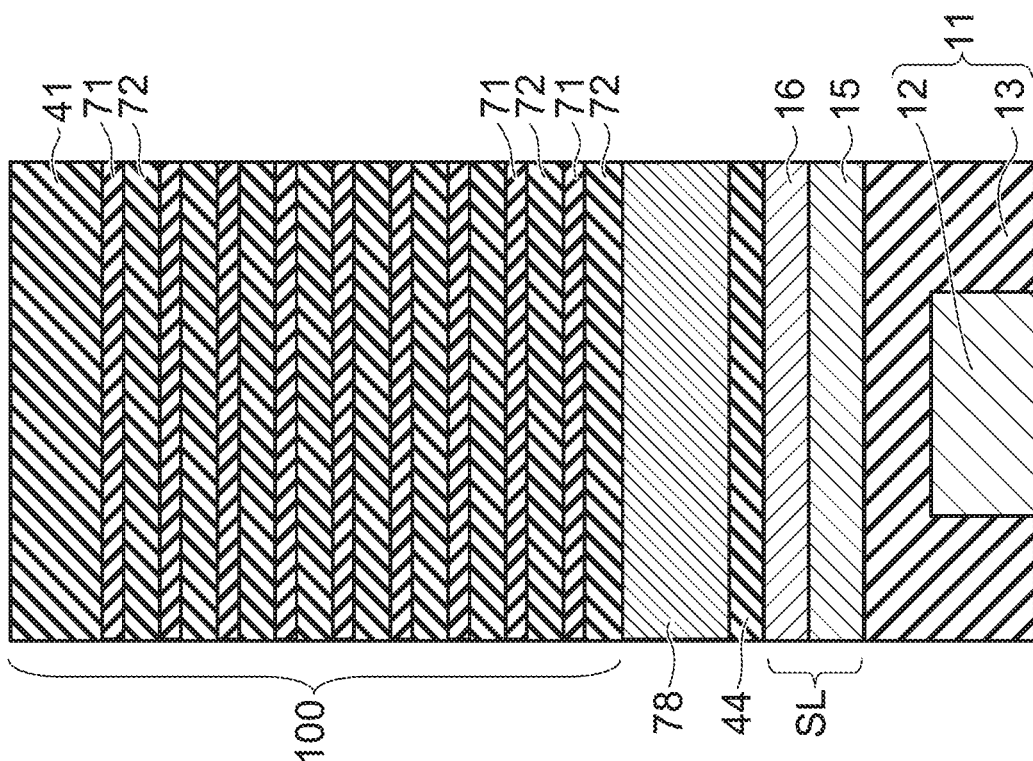

The layers shown in FIGS. 26A and 26B are formed in order. At the portion where the via 85 is to be formed, the via 86 is formed on the lower layer interconnect 12 as shown in FIG. 26B; subsequently, the source layer SL is stacked; the source layer SL on the via 86 is divided by the insulating film 14; and the lower layer interconnect 87 connected to the lower layer interconnect 12 by the via 86 is formed.

Figure 35A:
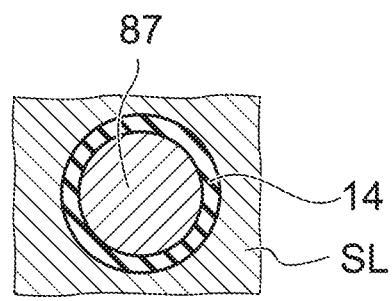

FIG. 35A illustrates a transverse cross section of the lower layer interconnect 87. For example, the insulating film 14 surrounds the lower layer interconnect 87 having the circular columnar configuration.

The conductive layer 78 is formed on the lower layer interconnect 87 and the source layer SL with the insulating layer 44 interposed. The stacked body 100 that includes the multiple sacrificial layers 71 and the multiple insulating layers 72 is formed on the conductive layer 78.

Subsequently, similarly to the embodiment described above, the multiple columnar portions CL and HR are formed in the stacked body 100. The lower end portions of the semiconductor bodies 20 of the columnar portions CL contact the semiconductor layer 16 of the source layer SL.

Figure 27B:
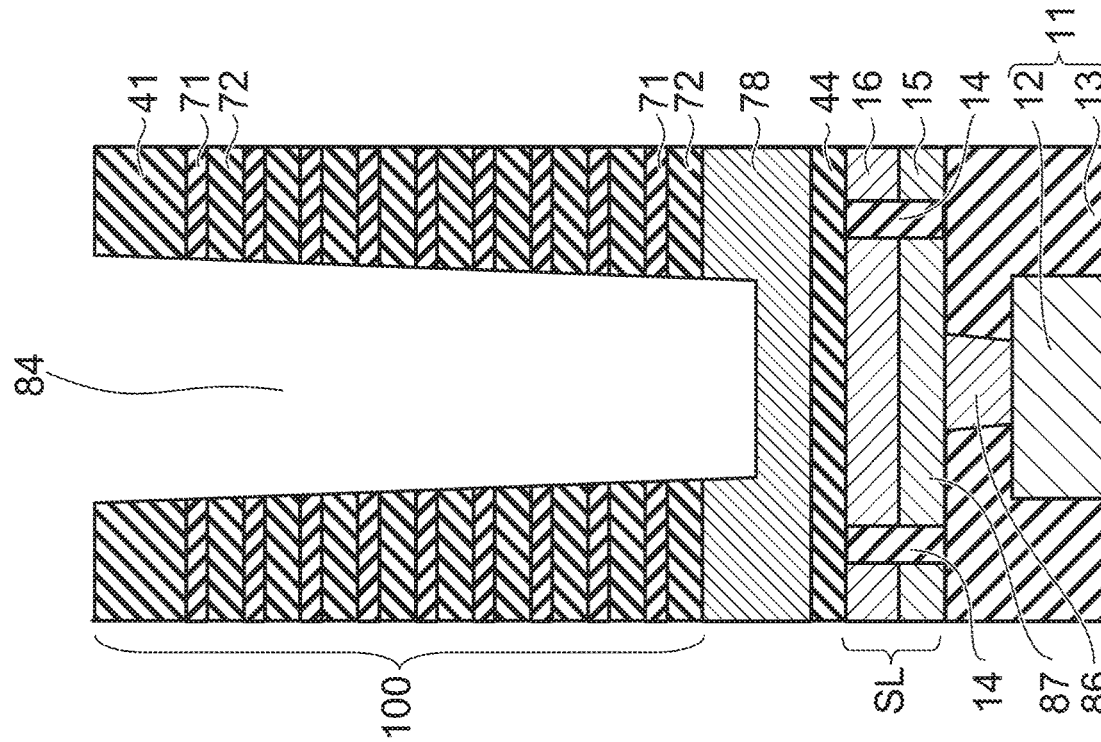
Figure 27A:
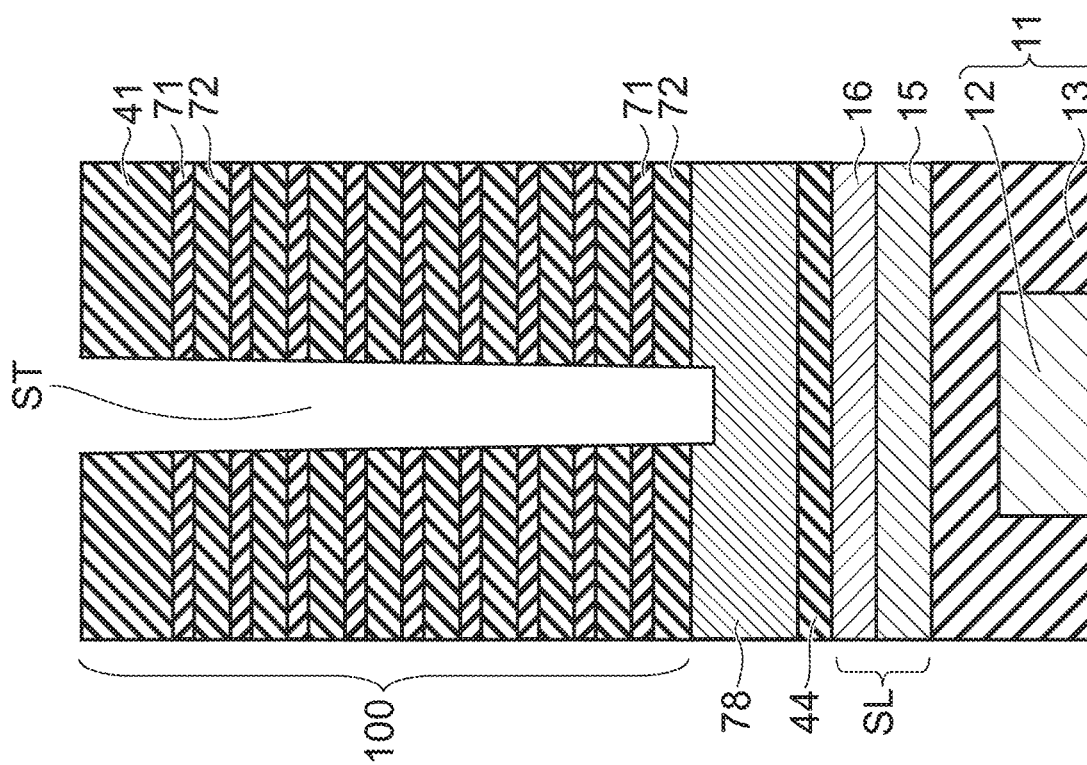

Subsequently, as shown in FIG. 27A, the slit ST is formed in the stacked body 100. A first hole 84 shown in FIG. 27B also is formed simultaneously when forming the slit ST.

The multiple slits ST and the multiple first holes 84 are formed simultaneously by the same RIE process using a not-illustrated mask layer. The slits ST and the first holes 84 pierce the stacked body 100 and reach the conductive layer 78. The multiple sacrificial layers 71 and the multiple insulating layers 72 are etched continuously by RIE using the same gas by using the conductive layer 78 as a stopper.

As shown in FIG. 23, the multiple first holes 84 are arranged to overlap a line of the slit ST extending in the X-direction.

The diameter of the first hole 84 is wider than the width of the slit ST. Therefore, there is a tendency for the etching of the first hole 84 to progress more quickly than that of the slit ST; but the etching rate difference (the fluctuation of the bottom positions) between the slit ST and the first hole 84 is absorbed by the thick conductive layer 78. Further, the etching rate difference (the fluctuation of the bottom positions) between the multiple first holes 84 also is absorbed by the thick conductive layer 78. The bottoms of the multiple first holes 84 and the bottoms of the multiple slits ST can be positioned reliably inside the conductive layer 78 without the first holes 84 undesirably extending to be lower than the conductive layer 78.

Then, the conductive layer 78 remaining under the bottom of the slit ST and the conductive layer 78 remaining under the bottom of the first hole 84 are etched simultaneously by RIE using the insulating layer (e.g., the silicon oxide layer) 44 as a stopper.

As shown in FIGS. 28A and 28B, the insulating layer 44 which is, for example, a silicon oxide layer is exposed at the bottom of the slit ST and the bottom of the first hole 84.

Subsequently, the sacrificial layers 71 are removed by etching through the slit ST and the first hole 84. For example, the sacrificial layers 71 which are silicon nitride layers are removed using an etchant including phosphoric acid.

Figure 29B:
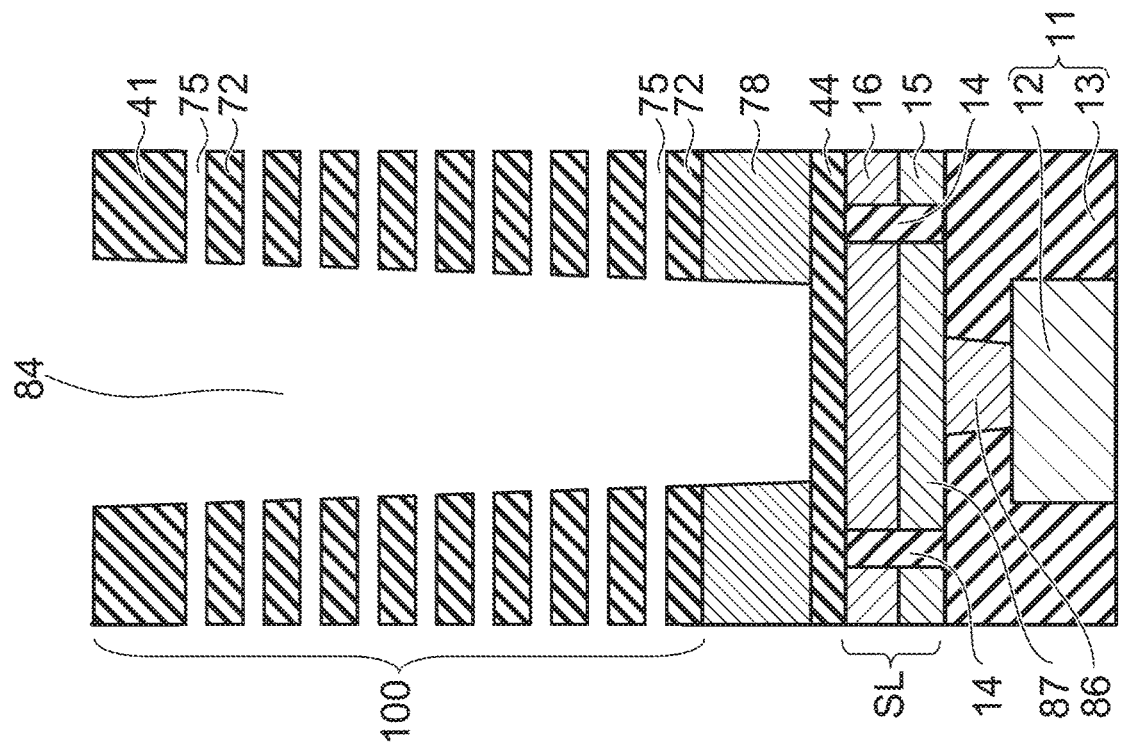
Figure 29A:
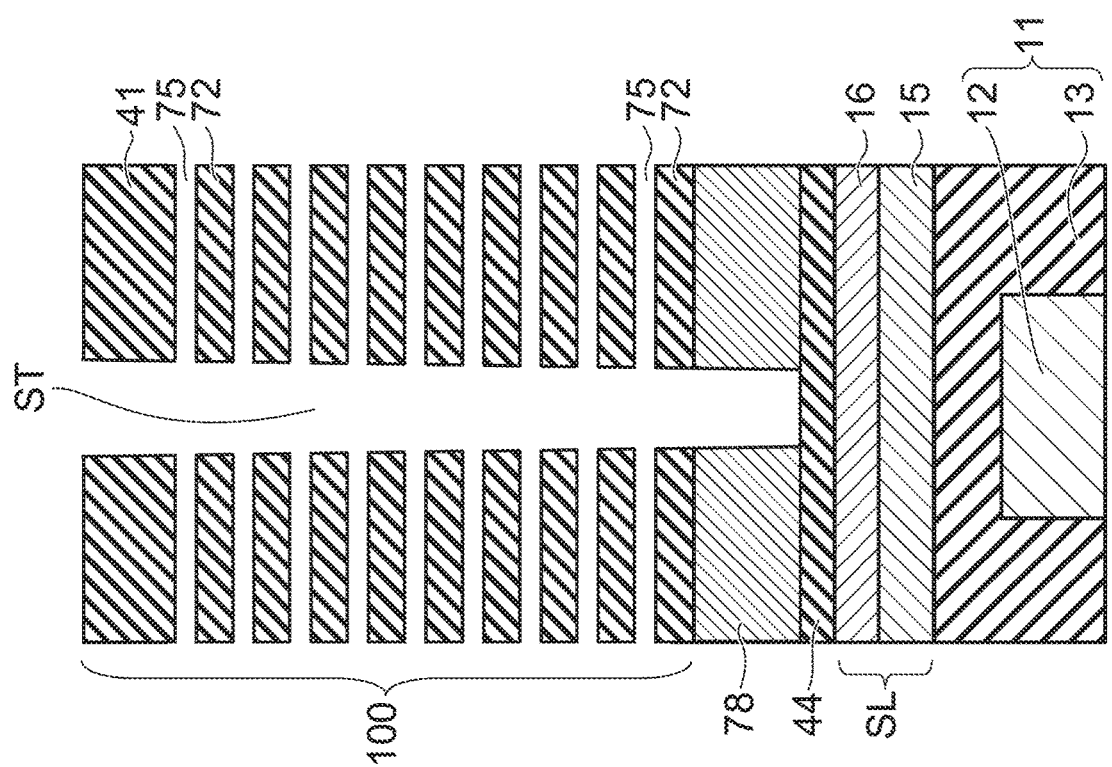

As shown in FIGS. 29A and 29B, the gaps 75 are formed between the insulating layers 72 adjacent to each other above and below, and between the insulating layer 41 and the uppermost insulating layer 72. At this time, the multiple insulating layers 72 are supported by the columnar portions CL and HR that are already formed; and the gaps 75 are maintained.

As shown in FIGS. 30A and 30B, the electrode layers 70 are formed in the gaps 75. The source gas of the electrode layers 70 is supplied to the gaps 75 through the slit ST and the first hole 84.

Subsequently, the insulating film is formed inside the slit ST and the first hole 84 by, for example, CVD. As shown in FIG. 31B, the insulating film 91 is formed at the side surface and bottom of the first hole 84 conformally along the side surface and the bottom. A gap (a portion of the first hole 84) remains on the inner side of the insulating film 91 inside the first hole 84.

Because the width of the slit ST is smaller than the diameter of the first hole 84, an insulating film 61 is filled into the slit ST as shown in FIG. 31A. Although the insulating film 61 and the insulating film 91 are illustrated using different reference numerals, the insulating film 61 and the insulating film 91 are films of the same material (e.g., silicon oxide) formed simultaneously in the same process.

Figure 32B:
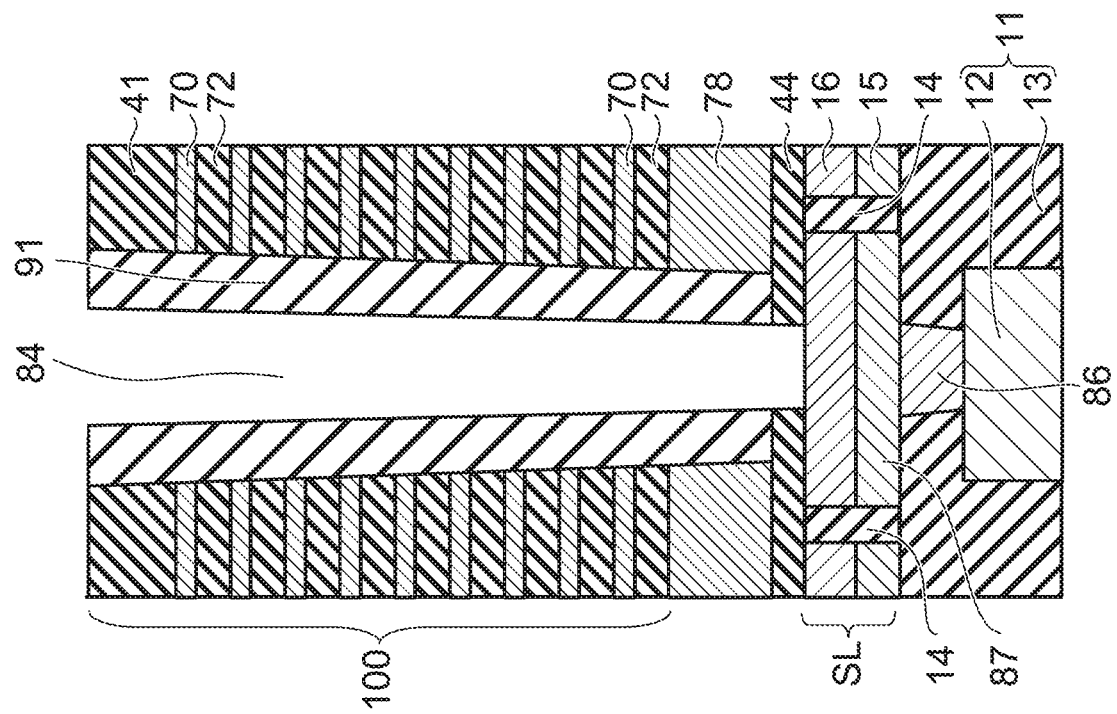

Subsequently, the insulating film 91 at the bottom of the first hole 84 and the insulating layer 44 under the insulating film 91 are etched by RIE using the semiconductor layer 16 of the lower layer interconnect 87 as a stopper. As shown in FIG. 32B, the semiconductor layer 16 is exposed at the bottom of the first hole 84.

Figure 32A:
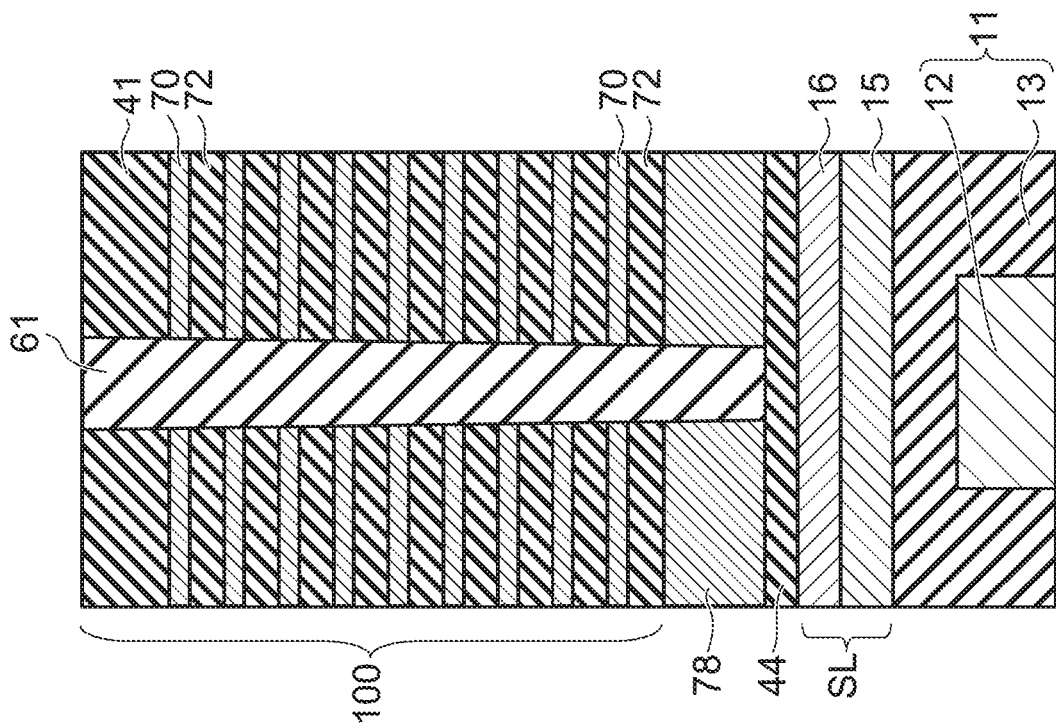

At this time, the insulating films 61 and 91 deposited on the insulating layer 41 become thin or are consumed. As shown in FIG. 32A, the insulating film 61 remains inside the slit ST.

Then, the semiconductor layer 16 exposed at the bottom of the first hole 84 is etched by RIE using the layer 15 including the metal as a stopper.

Figure 33B:
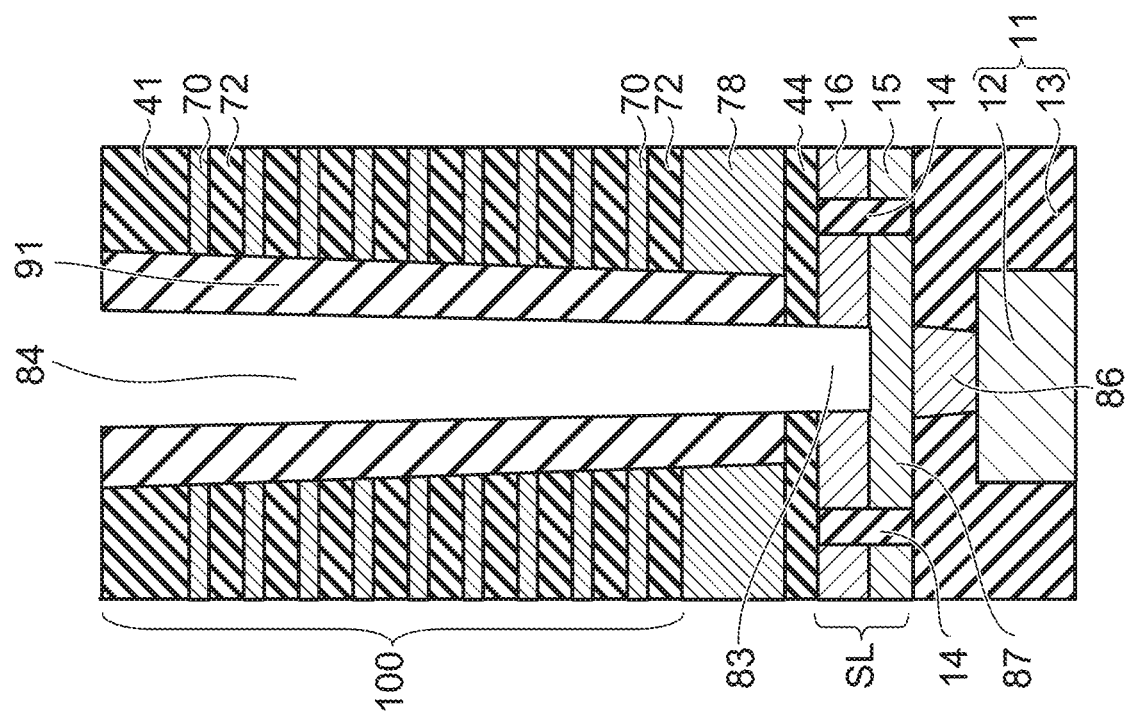
Figure 33A:
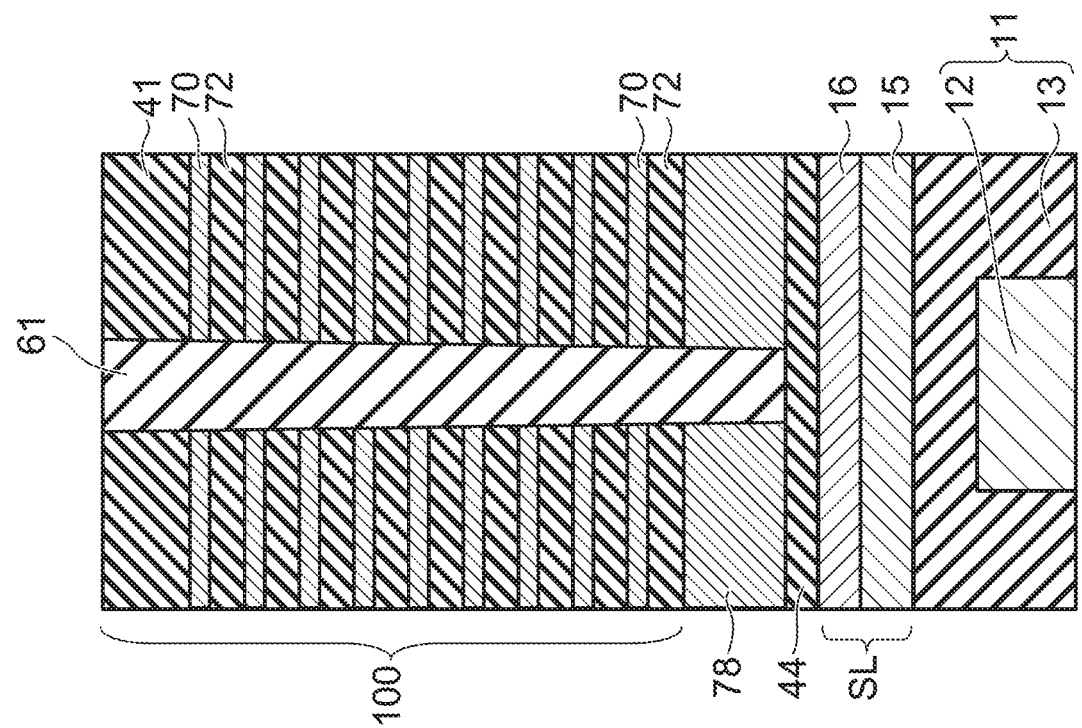

By removing the semiconductor layer 16 and the insulating layer 44 under the first hole 84, a second hole 83 that has a smaller diameter than the first hole 84 is formed under the first hole 84 as shown in FIG. 33B. The second hole 83 communicates with the first hole 84; and the layer 15 including the metal of the lower layer interconnect 87 is exposed at the bottom of the second hole 83.

The diameter of the second hole 83 is smaller than the planar size (the diameter or the width) of the lower layer interconnect 87. The side surface of the second hole 83 does not jut outside the end of the lower layer interconnect 87.

Figure 34B:
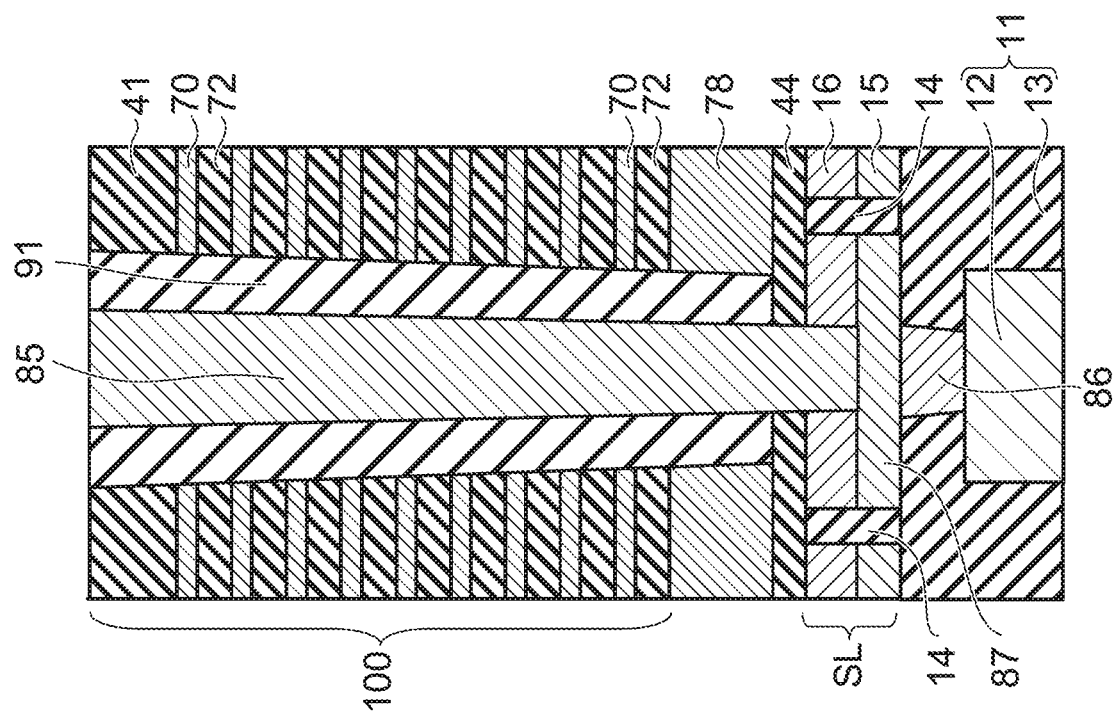
Figure 34A:
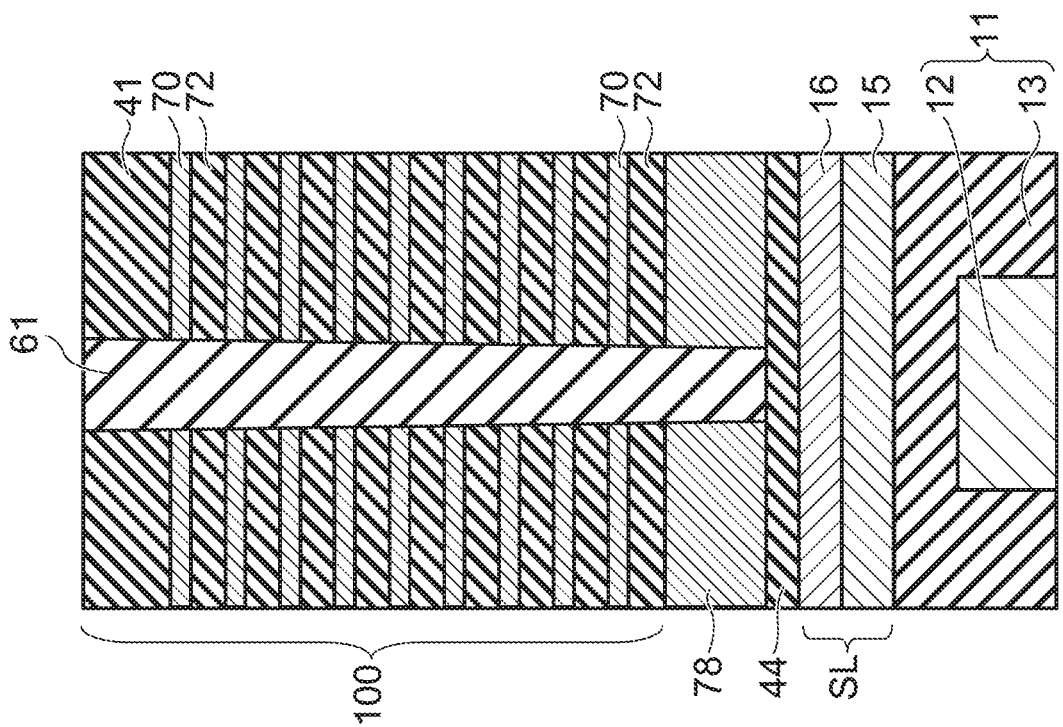

Then, as shown in FIG. 34B, the via 85 is formed inside the first hole 84 and inside the second hole 83. For example, a metal material is filled into the first hole 84 and into the second hole 83.

Subsequently, as shown in FIG. 25, the insulating layer 42 is formed on the insulating layer 41; and the via 82 that contacts the upper end of the via 85 is formed inside the insulating layer 42. Subsequently, the insulating layer 43 is formed on the insulating layer 42; and the upper layer interconnect 18 that contacts the upper end of the via 82 is formed inside the insulating layer 43.

Figure 36:
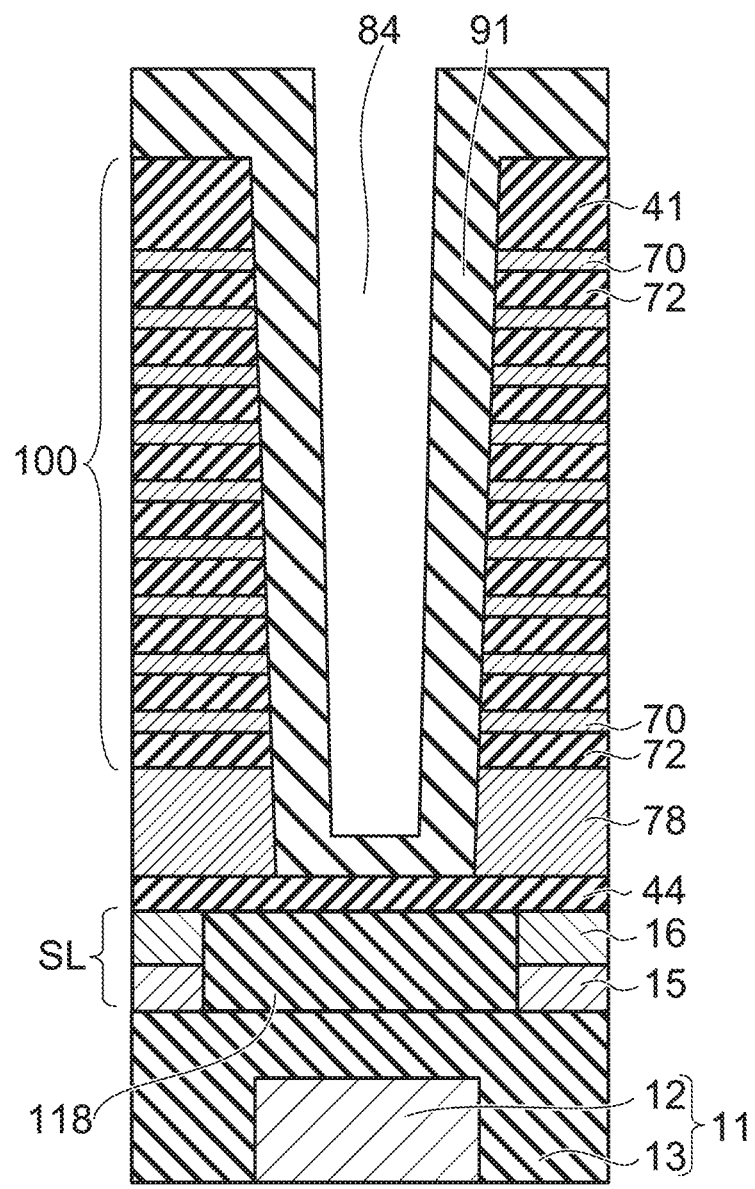
Figure 37:
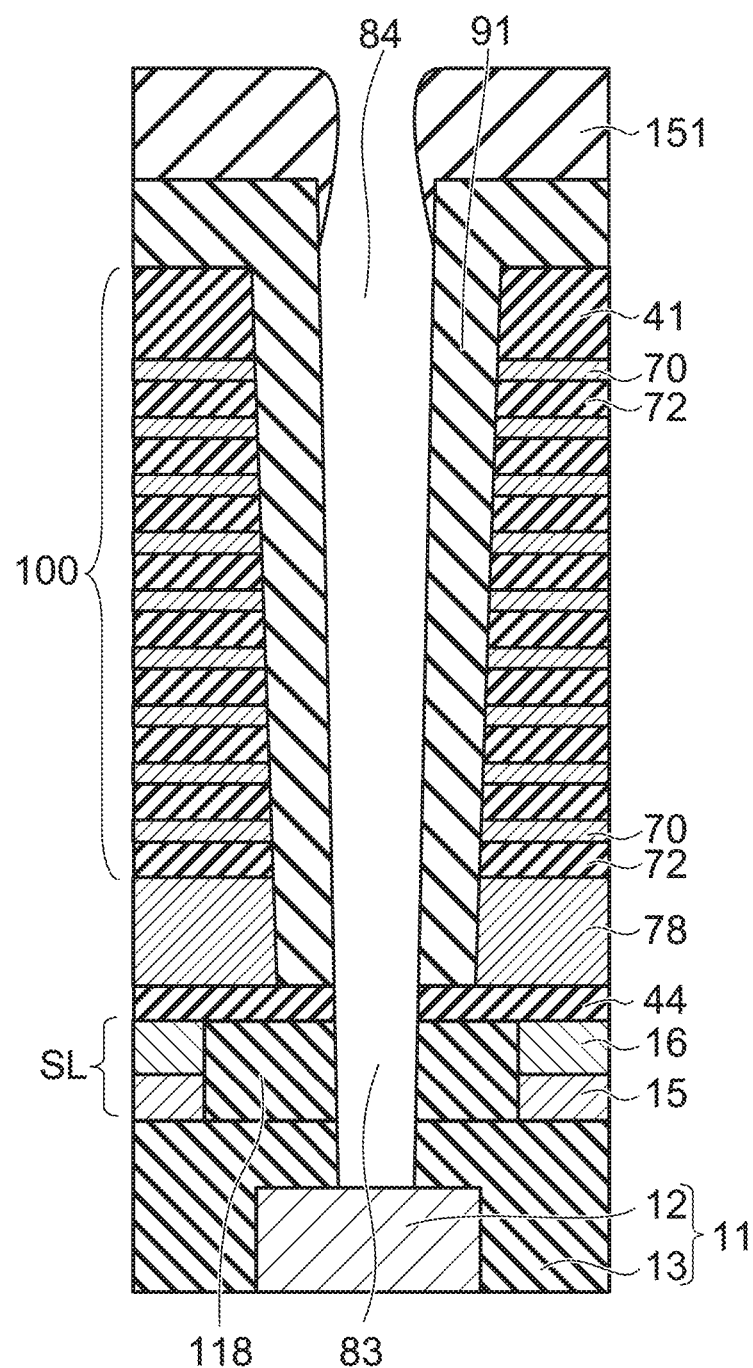
Figure 38:
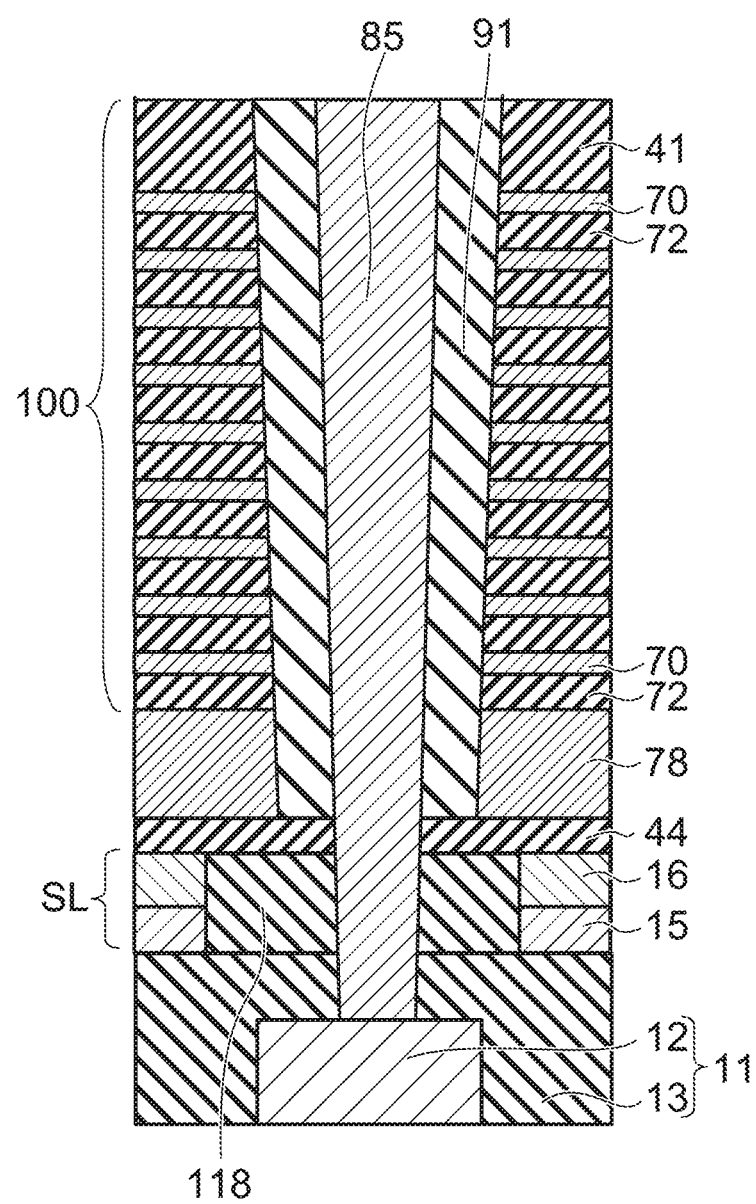

FIG. 36 to FIG. 38 are process cross-sectional views of other examples of the F-F cross-sectional portion of FIG. 23.

As shown in FIG. 36, the source layer SL is not provided between the first hole 84 and the lower layer interconnect 12. An insulating layer 118 is provided between the first hole 84 and the lower layer interconnect 12 in the layer where the source layer SL would be formed.

Figure 35B:
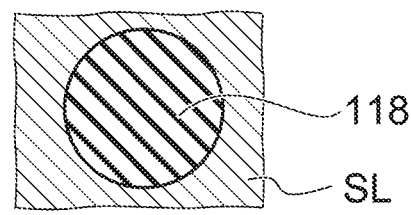

FIG. 35B illustrates a transverse cross section of the insulating layer 118. The source layer SL is removed in, for example, a circular configuration between the first hole 84 and the lower layer interconnect 12.

The processes up to the process shown in FIG. 31B described above proceed similarly; and the insulating film 91 is formed on the side surface and bottom of the first hole 84 as shown in FIG. 36.

Then, the insulating film 91 at the bottom of the first hole 84 and the insulating layers 44, 118, and 13 under the insulating film 91 are etched by RIE using the lower layer interconnect 12 which is a metal interconnect as a stopper. The insulating film 91 and the insulating layers 44, 118, and 13 are, for example, silicon oxide films.

As shown in FIG. 37, the second hole 83 that has a smaller diameter than the first hole 84 is formed under the first hole 84. The second hole 83 communicates with the first hole 84; and the lower layer interconnect 12 is exposed at the bottom of the second hole 83.

The diameter of the second hole 83 is smaller than the planar size (the width) of the lower layer interconnect 12. The side surface of the second hole 83 does not jut outside the end of the lower layer interconnect 12.

When etching to form the second hole 83, a mask layer 151 is formed on the insulating film 91 deposited on the stacked body 100. For example, the mask layer 151 of a carbon material having poor coverage in the film formation method can be formed without plugging the first hole 84. The mask layer 151 is formed on the entire surface of the stacked body 100 that also includes the portion shown in FIG. 31A.

Etching of the stacked body 100 can be prevented by the mask layer 151 even in the case where the total thickness of the insulating layers 44, 118, and 13 and the insulating film 91 at the bottom of the first hole 84 is markedly thicker than the thickness of the insulating film 91 deposited on the stacked body 100.

Then, as shown in FIG. 38, the via 85 is formed inside the first hole 84 and inside the second hole 83. For example, a metal material is filled into the first hole 84 and into the second hole 83. The lower end portion of the via 85 contacts the lower layer interconnect 12.

The first hole 84 described above has a diameter in which the width of 2 times the film thickness (the thickness in the diametral direction of the via 85) of the insulating film 91 is added to the diameter of the via 85. The insulating film 91 has a film thickness sufficient to ensure the breakdown voltage between the via 85 and the conductive layers (the electrode layers 70 and the conductive layer 78).

Even when the film thickness of the insulating film 91 to ensure the breakdown voltage recited above is increased and the diameter of the first hole 84 is increased, the first hole 84 does not reach the lower layer interconnect 87 or the lower layer interconnect 12; therefore, the planar size of the lower layer interconnect 87 or the lower layer interconnect 12 may not be larger than the diameter of the first hole 84. The etching to form the first hole 84 can be stopped reliably by the thick conductive layer (the stopper layer) 78; and the first hole 84 does not extend to the layer of the lower layer interconnect 87 or the lower layer interconnect 12.

Then, after forming the insulating film 91 inside the first hole 84, the second hole 83 that has a smaller diameter than the first hole 84 is formed below the bottom of the first hole 84. By forming the hole for the via 85 that pierces the stacked body 100 in two stages, it is possible to reduce the planar size of the lower layer interconnect 87 or the lower layer interconnect 12 while ensuring the breakdown voltage distance between the via 85 and the conductive layers (the electrode layers 70 and the conductive layer 78). This makes it possible to reduce the chip surface area.

Figure 39:
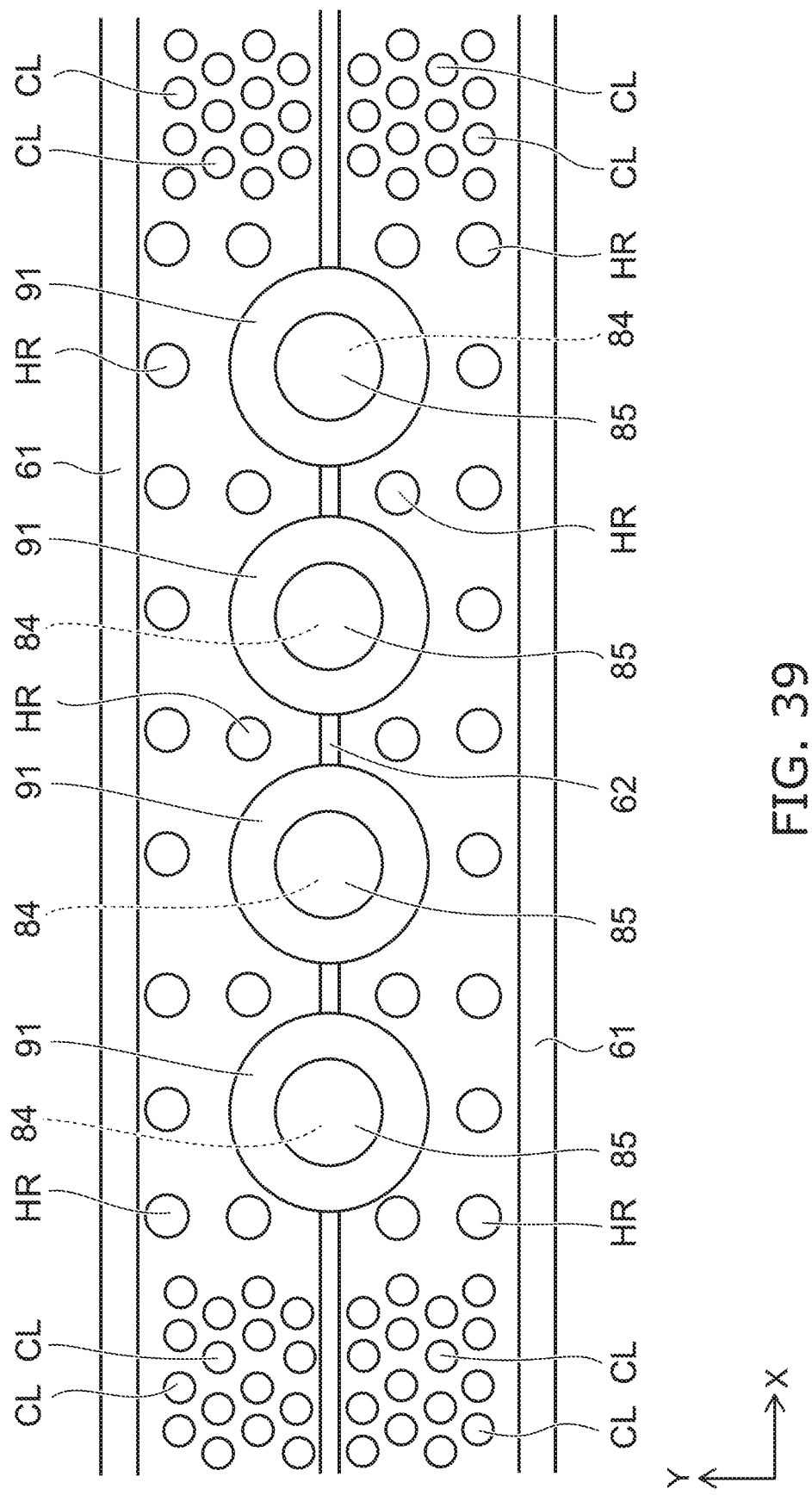
FIG. 39 is a schematic plan view of a semiconductor device of the embodiment.

FIG. 39 is a schematic plan view showing another example of the cell array region.

As shown in FIG. 39, the multiple vias 85 (the first holes 84) may be arranged to overlap a line of the separation portion 62 extending in the X-direction. After forming the separation portions 62, the first holes 84 are formed by etching the stacked body 100 together with the separation portion 62. In such a case as well, the slits ST and the first holes 84 may be formed simultaneously.

In the example shown in FIG. 18 described above, the end surfaces 71a of the sacrificial layers 71 are caused to recede in the diametral direction of the hole 80 prior to replacing the sacrificial layers 71 with the electrode layers 70; but the end surfaces of the electrode layers 70 may be caused to recede in the diametral direction of the hole 80 after replacing the sacrificial layers 71 with the electrode layers 70.

The process of causing the end surfaces of the electrode layers 70 to recede will now be described with reference to FIG. 40A to FIG. 42B.

The slit ST and the hole 80 are formed simultaneously after forming the columnar portions CL and HR in the stacked body 100 including the multiple sacrificial layers 71 and the multiple insulating layers 72. The diameter of the hole 80 is wider than the width of the slit ST.

Similarly to the holes 84 (the vias 85) shown in FIG. 23, the multiple holes 80 (the vias 81) may be arranged to overlap a line of the slit ST (the separation portion 61) extending in the X-direction. Or, similarly to the holes 84 (the vias 85) shown in FIG. 39, the multiple holes 80 (the vias 81) may be arranged to overlap a line of the separation portion 62 extending in the X-direction.

Subsequently, as shown in FIGS. 40A and 40B, the sacrificial layers 71 are replaced with the electrode layers 70 through the slit ST and the hole 80.

Then, as shown in FIG. 41B, the end surface 70a of the electrode layer 70 on the hole 80 side is caused to recede to be separated from the hole 80 in the diametral direction of the hole 80. The end surfaces 15a and 16a of the source layer SL also are caused to recede.

At this time, as shown in FIG. 41A, the end surface 70a of the electrode layer 70 on the slit ST side also is caused to recede to be separated from the slit ST in the width direction of the slit ST. The end surfaces 15a and 16a of the source layer SL on the slit ST side also are caused to recede to be separated from the slit ST in the width direction of the slit ST.

Then, as shown in FIG. 42B, the insulating film 63 is formed on the side surface and bottom of the hole 80 along the side surface and the bottom. The insulating film 63 is formed also in the gap 79 formed by the recession of the end surface 70a of the electrode layers 70 and in the gap 77 formed by the recession of the end surfaces 15a and 16a of the source layer SL.

At this time, as shown in FIG. 42A, the insulating film 61 is formed also inside the slit ST. The insulating film 61 fills the interior of the slit ST because the width of the slit ST is smaller than the diameter of the hole 80. The insulating film 61 is formed also in the gaps 79 and 77 at the side of the slit ST formed by the recession of the electrode layers 70 and the source layer SL.

Subsequently, after removing the insulating film 63 at the bottom of the hole 80 shown in FIG. 42B, the via 81 that contacts the lower layer interconnect 12 is formed inside the hole 80.

After the process of FIGS. 40A and 40B, instead of causing the end surfaces 70a of the electrode layers 70 to recede by etching, the end portions of the electrode layers 70 on the hole 80 side and the end portions of the electrode layers 70 on the slit ST side may be changed to insulating films by oxidation treatment. The end portion of the source layer SL on the hole 80 side and the end portion of the source layer SL on the slit ST side also may be changed to insulating films by oxidation treatment.

Figure 43A:
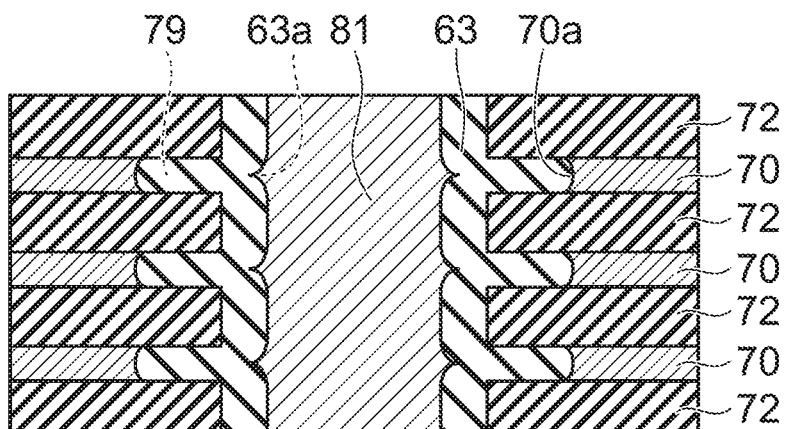
FIGS. 43A and 43B are enlarged cross-sectional views of one portion of FIG. 5.
Figure 43B:
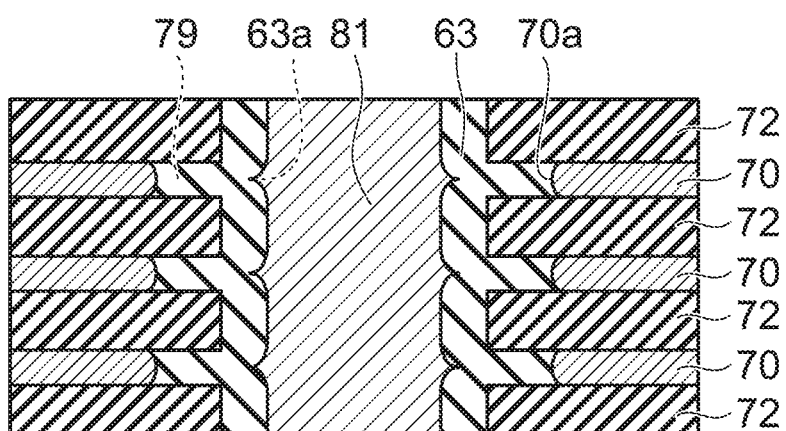

FIGS. 43A and 43B are enlarged cross-sectional views of one portion of FIG. 5.

A recess 63a may be formed in the inner perimeter surface of the insulating film 63 on the via 81 side due to the recessed amount to the second position of the end surface 71a of the sacrificial layer 71 or the end surface 70a of the electrode layer 70 by the etching, the volume of the gap 79 occurring based on the recession, the film thickness of the insulating film 63, etc.

The recess 63a is recessed in a direction toward the end surface 70a at a position opposing the end surface 70a of the electrode layer 70. For the insulating film 63 that surrounds the outer perimeter surface of the via 81, the inner diameter of the portion opposing the electrode layer 70 is larger than the inner diameter of the portion opposing the insulating layer 72.

There are cases where the end surface 70a of the electrode layer 70 (the boundary between the electrode layer and the insulating film 63) does not have a straight configuration along the film thickness direction due to the conditions of the etching causing the end surface 71a of the sacrificial layer 71 (or the end surface 70a of the electrode layer 70) to recede, the conditions of the etching when removing the sacrificial layer 71, or the conditions of the oxidization of the end portion of the sacrificial layer 70 (or the end portion of the electrode layer 70).

FIG. 43A illustrates an example of a configuration in which the central portion in the film thickness direction of the end surface 70a of the electrode layer 70 is pulled more in the direction away from the insulating film 63 than are the film thickness-direction ends.

FIG. 43B illustrates an example of a configuration in which the central portion in the film thickness direction of the end surface 70a of the electrode layer 70 protrudes more toward the insulating film 63 side than do the film thickness-direction ends.

Although a silicon nitride layer is illustrated as the first layer 71 in the embodiments recited above, a metal layer or a silicon layer doped with an impurity may be used as the first layer 71. In such a case, the first layer 71 is used as the electrode layer 70 as-is; therefore, the process of replacing the first layer 71 with the electrode layer is unnecessary.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
    a lower interconnect layer including a first lower interconnect and a second lower interconnect;
    an upper interconnect layer including a first upper interconnect and a second upper interconnect;
    a stacked body provided between the lower interconnect layer and the upper interconnect layer, the stacked body including first and second electrode layers stacked with an insulator interposed in a first direction;
    a source layer provided between the lower interconnect layer and the stacked body;
    a conductive layer provided between the source layer and the stacked body, the conductive layer being thicker than a thickness of one of the first and second electrode layers in the first direction;
    a first conductive via piercing the stacked body, the source layer and the conductive layer, and connecting the first upper interconnect and the first lower interconnect; and
    a second conductive via piercing the stacked body, the source layer and the conductive layer, and connecting the second upper interconnect and the second lower interconnect, the second conductive via being arranged next to the first conductive via in a second direction crossing the first direction, where a part of the stacked body interposed between the first conductive via and the second conductive via in the second direction.

2. The device according to claim 1, further comprising:
    a first insulating film provided between the first conductive via and the stacked body, and the first conductive via and the conductive layer, wherein the first conductive via is surrounded by the first insulating film in the second direction.

3. The device according to claim 2, further comprising:
    a second insulating film provided between the first conductive via and the source layer, wherein the first conductive via are surrounded by the second insulating film in the second direction, and a thickness of the second insulating film is greater than a thickness of the first insulating film in the second direction.

4. The device according to claim 2, wherein the first insulating film comprises a recess portion which is recessed in the second direction towards the stacked body.

5. The device according to claim 2, wherein the first insulating film comprises a first portion and a second portion which are alternatively arranged in the first direction, wherein the first portion is positioned in the stacked body side and the second portion is positioned in the first conductive via side in the second direction.

6. The device according to claim 2, wherein the first insulating film comprises a first portion and a second portion which are alternatively arranged in the first direction, wherein a distance between the first conductive via and the first portion is greater than a distance between the first conductive via and the second portion in the second direction.

7. The device according to claim 1, wherein a distance between the first conductive via and the source layer is greater than a distance between the first conductive via and one of the first and the second electrode layers.

8. The device according to claim 1, wherein one of the first and the second electrode layers has a first hole surrounding the first conductive via, the source layer has a second hole surrounding the first conductive via, and a diameter of the second hole is greater than a diameter of the first hole.

9. The device according to claim 1, further comprising:
    a plurality of columnar portions each including
        a semiconductor body contacting the source layer and extending through the stacked body in the first direction of the stacked body, and
        a charge storage portion provided between the semiconductor body and one of the first and second electrode layers.

10. The device according to claim 9, wherein the source layer includes a semiconductor layer contacting the semiconductor body, and a layer including a metal stacked under the semiconductor layer.

11. The device according to claim 9, wherein the columnar portions are disposed in a cell array region, and the first and the second vias are disposed in a region next to the cell array region.

12. The device according to claim 1, further comprising a separation portion dividing the stacked body into a plurality of blocks,
the first and the second vias being arranged on a line of extension of the separation portion.

13. A semiconductor device, comprising:
a lower interconnect layer including a first lower interconnect and a second lower interconnect;
an upper interconnect layer including a first upper interconnect and a second upper interconnect;
a stacked body provided between the lower interconnect layer and the upper interconnect layer, the stacked body including first and second electrode layers stacked with an insulator interposed in a first direction;
a source layer provided between the lower interconnect layer and the stacked body;
a source-side selection gate provided between the source layer and the stacked body, the source-side selection gate being thicker than a thickness of one of the first and second electrode layers in the first direction;
a first conductive via piercing the stacked body, the source layer and the source-side selection gate, and connecting the first upper interconnect and the first lower interconnect; and
a second conductive via piercing the stacked body, the source layer and the source-side selection gate, and connecting the second upper interconnect and the second lower interconnect, the second conductive via being arranged next to the first conductive via in a second direction crossing the first direction, where a part of the stacked body interposed between the first conductive via and the second conductive via in the second direction.

14. A semiconductor device, comprising:
a lower interconnect layer including a first lower interconnect and a second lower interconnect;
an upper interconnect layer including a first upper interconnect and a second upper interconnect;
a stacked body provided between the lower interconnect layer and the upper interconnect layer, the stacked body including first and second electrode layers stacked with an insulator interposed in a first direction;
a source layer provided between the lower interconnect layer and the stacked body;
a conductive layer provided between the source layer and the stacked body, the conductive layer being thicker than a thickness of one of the first and second electrode layers in the first direction;
first and second conductive vias piercing the stacked body, the source layer and the conductive layer, and connecting the upper interconnect layer and the lower interconnect layer, wherein one of the first and the second electrode layers surrounds each of the first and the second conductive vias; and
wherein the first and the second conductive vias directly connect the upper interconnect layer and the lower interconnect layer.

15. The device according to claim 14, wherein one of the first and the second electrode layers surrounds an outer circumference of each of the first and the second conductive vias in a ring.

* * * * *